(12) United States Patent
Benham et al.

(10) Patent No.: US 7,040,901 B2
(45) Date of Patent: *May 9, 2006

(54) HIGH-SPEED ELECTRICAL CONNECTOR

(75) Inventors: John E. Benham, Torrington, CT (US); Robert D. Godburn, Jr., Waterbury, CT (US)

(73) Assignee: Litton Systems, Inc., Los Angeles, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 10/893,431

(22) Filed: Jul. 19, 2004

(65) Prior Publication Data

US 2005/0101188 A1  May 12, 2005

Related U.S. Application Data

(63) Continuation-in-part of application No. 10/234,859, filed on Sep. 5, 2002, now Pat. No. 6,910,897, which is a continuation-in-part of application No. 10/036,796, filed on Jan. 7, 2002, now Pat. No. 6,843,657.

(60) Provisional application No. 60/487,580, filed on Jul. 17, 2003, provisional application No. 60/260,893, filed on Jan. 12, 2001, provisional application No. 60/328,396, filed on Oct. 12, 2001.

(51) Int. Cl.
*H01R 12/00* (2006.01)
(52) U.S. Cl. ........................................ 439/65; 439/701
(58) Field of Classification Search .................. 439/65, 439/701, 607, 608
See application file for complete search history.

(56) References Cited

U.S. PATENT DOCUMENTS

| | | |
|---|---|---|
| 5,993,259 A | 11/1999 | Stokoe et al. |
| 6,206,729 B1 | 3/2001 | Bradley et al. |
| 6,431,914 B1 | 8/2002 | Billman |
| 6,517,360 B1 | 2/2003 | Cohen |
| 6,540,522 B1 | 4/2003 | Sipe |
| 6,540,558 B1 | 4/2003 | Paagman |
| 6,712,648 B1 | 3/2004 | Padro et al. |
| 6,843,657 B1 | 1/2005 | Driscoll et al. |
| 2005/0048842 A1 * | 3/2005 | Benham et al. ............. 439/608 |

* cited by examiner

*Primary Examiner*—Briggitte Hammond
*Assistant Examiner*—X. Chung-Trans
(74) *Attorney, Agent, or Firm*—Rothwell, Figg, Ernst & Manbeck

(57) ABSTRACT

The present invention provides a high-speed connector.

53 Claims, 45 Drawing Sheets

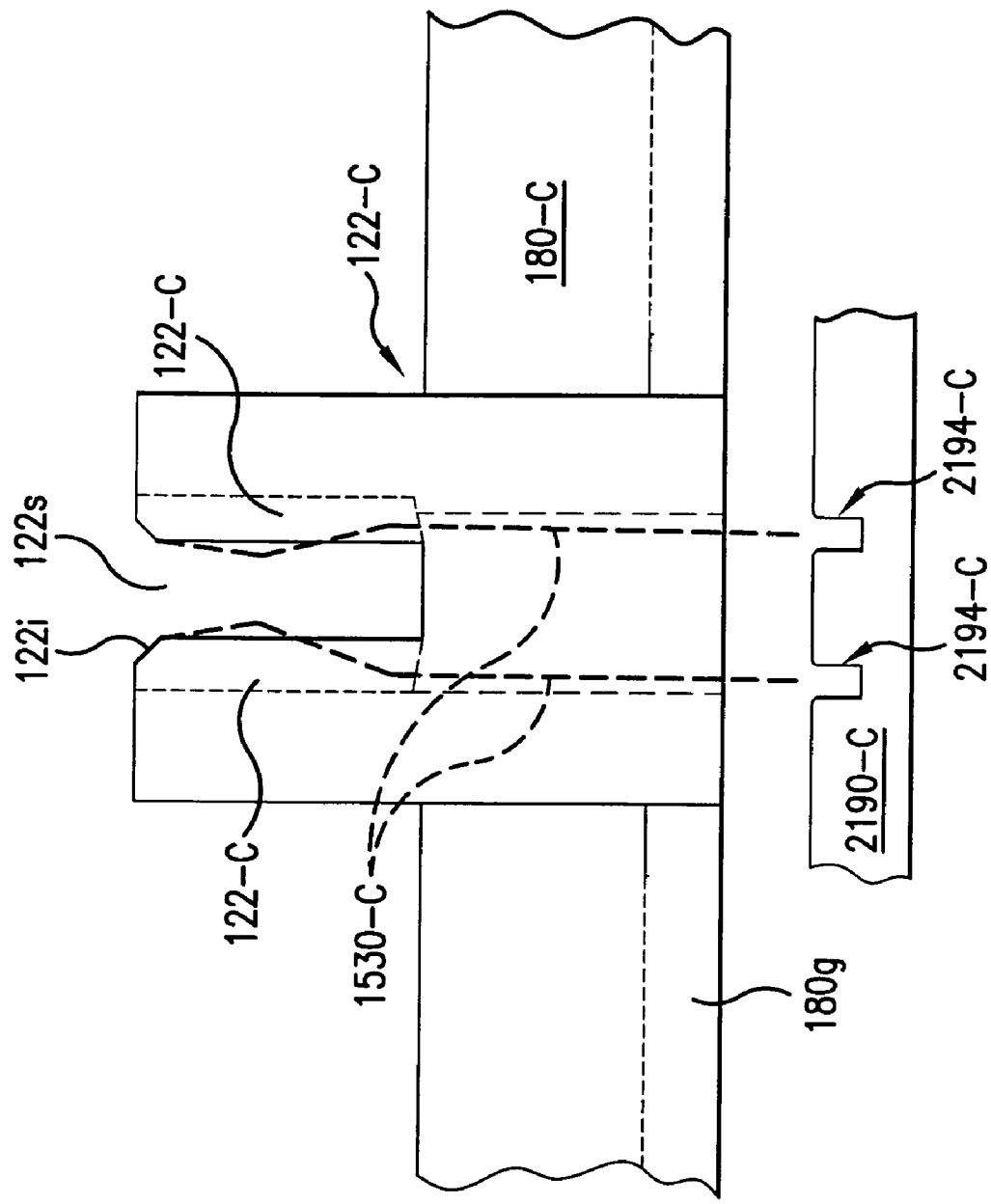

HIGH-SPEED ELECTRICAL CONNECTOR

The present application claims the benefit of U.S. Provisional Patent Application No. 60/487,580, filed on Jul. 17, 2003; the present application is also a continuation-in-part of U.S. patent application Ser. No. 10/234,859, filed Sep. 5, 2002 (status pending), which is a continuation-in-part of U.S. patent application Ser. No. 10/036,796, filed Jan. 7, 2002 (status pending), which claims the benefit of U.S. Provisional Patent Application No. 60/260,893, filed on Jan. 12, 2001 and U.S. Patent Application No. 60/328,396, filed on Oct. 12, 2001. Each of the above identified applications is incorporated herein by this reference.

BACKGROUND OF THE INVENTION

1. Field of the Invention

The present invention relates generally to electrical interconnection systems, and more specifically, to high speed, high-density interconnection systems for differential and single-ended transmission applications.

2. Discussion of the Background

Backplane systems are comprised of a complex printed circuit board that is referred to as the backplane or motherboard, and several smaller printed circuit boards that are referred to as daughtercards or daughterboards that plug into the backplane. Each daughtercard may include a chip that is referred to as a driver/receiver. The driver/receiver sends and receives signals from driver/receivers on other daughtercards. For example, a signal path is formed between the driver/receiver on a first daughtercard and a driver/receiver on a second daughtercard. The signal path includes an electrical connector that connects the first daughtercard to the backplane, the backplane, a second electrical connector that connects the second daughtercard to the backplane, and the second daughtercard having the driver/receiver that receives the carried signal.

Various driver/receivers used today can transmit signals at data rates between 5–10 Gb/sec and greater. A limiting factor (data transfer rate) in the signal path is the electrical connectors that connect each daughtercard to the backplane. Further, the receivers may receive signals having only about 5% of the original signal strength sent by the driver. This reduction in signal strength increases the importance of minimizing cross-talk between signal paths to avoid signal degradation or errors being introduced into digital data streams. With high speed, high-density electrical connectors, it is even more important to eliminate or reduce cross-talk. Thus, a need exists in the art for a high-speed electrical connector capable of, inter alia, handling high-speed signals that reduces cross-talk between signal paths.

SUMMARY OF THE INVENTION

The present invention provides a high-speed electrical interconnection system designed to overcome the drawbacks of conventional interconnection systems. In preferred embodiments, the present invention provides an electrical connector capable of handling high-speed signals effectively.

Although compliant pins have been widely used in various other high speed interconnects, the embodiments described herein have substantial improvements over existing systems. For example, due to the size and routing of the compliant feature, existing systems typically experience performance issues, such as, e.g., impedance discontinuities and cross-talk. On the other hand, preferred embodiments described herein can enhance the tuning of the performance of a compliant pin termination to a printed circuit board. Among other things, as described above, in preferred embodiments, the connector uses broad-side coupled transmission lines with spatial relationships that can, inter alia, promote a high degree of cross-talk isolation.

According to some embodiments, an interconnect system is provided that includes: a first circuit board comprising (a) a first differential interconnect path, (b) a first socket on a surface of the first circuit board and (c) a second socket also on the surface of the first circuit board, wherein the first differential interconnect path comprises a first signal path electrically connected to the first socket and a second signal path electrically connected to the second socket; a second circuit board comprising a second differential interconnect path; and a connector for electrically connecting the first differential interconnect path with the second differential interconnect path, the connector comprising: an interposer having a first face and a second face opposite the first face, the first face facing the surface of the first circuit board, said interposer including an array of apertures extending from the first face of the interposer to the second face of the interposer; a first conductor having an end adjacent to the second face of the interposer; a second conductor substantially parallel with and substantially equal in length to the first conductor, the second conductor also having an end adjacent to the second face of the interposer; a dielectric material disposed between the first conductor and the second conductor; a plurality of cells located within said array of apertures, each of said cells including a housing supporting a first elongated contact member and a second elongated contact member; a first of said first elongated contact members having a conductor contact section, a board contact section and an interim section between the conductor contact section and the board contact section, the conductor contact section being in physical contact with the end of the first conductor, the board contact section being in physical contact with and compliantly engaged with the first socket, and at least a portion of the interim section being engaged with a first of said housings; and a first of said second elongated contact members having a conductor contact section, a board contact section and an interim section between the conductor contact section and the board contact section, the conductor contact section being in physical contact with the first end of the second conductor, the board contact section being in physical contact with and compliantly engaged with the second socket, and at least a portion of the interim section being engaged with said first of said housings.

In some preferred embodiments, said housings are made with dielectric material and said interposer is made with conductive material or is coated with conductive material. In some embodiments, the dielectric material disposed between the first conductor and the second conductor comprises a third circuit board having a first face and a second face. In some embodiments, the first conductor is disposed on the first face of the third circuit board and the second conductor is disposed on the second face of the third circuit board. In some embodiments, the third circuit board is sandwiched between a first spacer and a second spacer. In some embodiments, the first spacer has a groove on a first face thereof and the groove is aligned with and mirrors the first conductor. In some embodiments, the first spacer has at least one finger for attaching the spacer to the interposer and the interposer has at least one recess for receiving the at least one finger. In some embodiments, the second spacer has a groove on a first face thereof and the groove is aligned with and mirrors the second conductor. In some embodiments, said first of said housings includes a slot configured to receive said a third circuit board. In some embodiments, the first of said housings further includes channels configured to receive said conductor contact sections of said first and second elongated contact members. In some embodiments, said conductor contact sections are flexibly contained within said channels and wherein said channels extend past distal ends of each of said first and second elongated contact members. In some embodiments, said board contact sections include pins with a diameter of less than about 0.04 inches, or, in some embodiments, less than about 0.03 inches, or, in some embodiments, less than about 0.02 inches. In some embodiments, said housings have widths of less than about 0.3 inches, or, in some embodiments, less than about 0.2 inches, or, in some embodiments, less than about 0.15 inches. In some preferred embodiments, said connector supports differential applications at more than about 5 GBPS, or, in some embodiments, at more than about 10 GBPS.

According to some other embodiments, an interposer assembly for high-speed and high density differential applications is provided that includes: a) an interposer having a first face and a second face opposite the first face; b) said interposer including an array of apertures extending from the first face of the interposer to the second face of the interposer; c) a plurality of cells located within said array of apertures, each of said cells including a housing supporting a first elongated contact member and a second elongated contact member; d) said interposer being made with a conductive material or coated with a conductive material; e) said housings each being made with dielectric material; f) a first of said first elongated contact members having a conductor contact section, a board contact section and an interim section between the conductor contact section and the board contact section, the conductor contact section being configured to apply a pressure contact without attachment to a first conductor, the board contact section including a compliant pin having a diameter of less than about 0.04 inches, and at least a portion of the interim section being engaged with a first of said housings; and g) a first of said second elongated contact members having a conductor contact section, a board contact section and an interim section between the conductor contact section and the board contact section, the conductor contact section being configured to apply a pressure contact without attachment to a second conductor, the board contact section including a compliant pin having a diameter of less than about 0.04 inches, and at least a portion of the interim section being engaged with said first of said housings.

According to some other embodiments, a connector for high-speed and high density differential applications electrically connecting a signal path on a first circuit board with a signal path on a second circuit board is provided that includes: a) an interposer having a first face and a second face opposite the first face; b) said interposer including an array of apertures extending from the first face of the interposer to the second face of the interposer; c) a plurality of cells located within said array of apertures, each of said cells including a housing supporting a first elongated contact member and a second elongated contact member; d) said interposer being made with conductive material or coated with conductive material; e) said housings each being made with dielectric material; f) a plurality of circuit boards extending generally perpendicular to said interposer; g) a plurality of spacers between said circuit boards; and f) said housings each including a slot configured to receive an edge of a respective one of said circuit boards.

In some embodiments, said first and second elongated contact members include leaf springs that press against respective conductors on said circuit boards. In some embodiments, the said circuit boards include a plurality of signal conductors, and wherein a number of signal conductors disposed on a first face of one of said circuit boards is not equal to a number of signal conductors disposed on a first face of a second circuit board. In some embodiments, the number of signal conductors disposed on the second face of the first circuit board is one less or one more than the number of signal conductors disposed on the first face of the second circuit board. In some embodiments, each housing includes at least one tab arranged to mate with at least one corresponding slot in said interposer. In some embodiments, said conductors of adjacent circuit boards are staggered to increase distances between said conductors of said adjacent printed circuit boards.

According to some other embodiments, a method of manufacturing a connector is performed that includes: a) providing an interposer with an array of apertures extending from a first face of the interposer to a second face of the interposer, wherein said interposer is made with conductive material or coated with conductive material; b) providing a plurality of cells each including a housing supporting a first elongated contact member and a second elongated contact member, each said housing being made with dielectric material, and each said housing including a slot configured to receive an edge of a respective circuit board; c) moving a plurality of printed circuit boards in a direction generally perpendicular to and towards said interposer such that edges of said printed circuit boards are received within respective ones of said slots in said housings and such that said first and second elongated contact members engage respective conductors on opposite sides of said printed circuit boards.

In some embodiments, the first and second elongated contact members engage respective conductors on opposite sides of said printed circuit boards by providing said first and second elongated contact members with leaf spring portions that are displaced by the printed circuit boards upon insertion into said slots. In some embodiments, the method further includes aligning a plurality of spacers in between said printed circuit boards by inserting protrusions extending from said spacers into engaging recesses in said interposer. In some embodiments, the method further includes inserting said housing into said interposer until an outwardly extending tab is received within a respective slot in said interposer.

BRIEF DESCRIPTION OF THE DRAWINGS

The accompanying drawings, which are incorporated herein and form part of the specification, help illustrate various embodiments of the present invention and, together with the description, further serve to explain the principles of the invention and to enable a person skilled in the pertinent art to make and use the invention. In the drawings, like reference numbers indicate identical or functionally similar elements. Additionally, to facilitate reference, the left-most digit(s) of a reference number in many cases identifies the drawing in which the reference number first appears.

In summary, FIGS. 37–46 are views of additional preferred embodiments related to, inter alia, compliant mount connectors or interconnects.

FIG. 1 is an exploded view of a connector in accordance with an example embodiment of the present invention.

FIG. 2 is a view of a printed circuit board according to an embodiment of the present invention.

FIG. 3 is a front side view of the printed circuit board shown in FIG. 2.

FIG. 4 is a perspective view of a spacer in accordance with an example embodiment of the present invention.

FIG. 5 is a top view of a first face of the spacer shown in FIG. 4.

FIG. 6 is a top view of a second face of the spacer shown in FIG. 4.

FIG. 7 is a front side view of the spacer shown in FIG. 4.

FIG. 8 is a top view of a first face of a second spacer.

FIG. 9 is a top view of a second face of the second spacer.

FIG. 10 is a perspective view of an apparatus consisting of a circuit board sandwiched between two spacers.

FIG. 11 is a front side view of the apparatus shown in FIG. 10.

FIG. 12 illustrates an arrangement of multiple circuit boards and multiple spacers according to an example embodiment of the present invention.

FIG. 13 is a top view of a first face of a circuit board according to an embodiment of the present invention.

FIG. 14 illustrates how the alignment of the conductors on an A type circuit board differs from alignment of the conductors on a B type circuit board.

FIG. 15 illustrates a contact member according to one embodiment of the invention.

FIGS. 16 and 17 illustrate a cell according to one embodiment of the invention.

FIGS. 18 and 19 illustrate that cells may be configured to fit into an aperture of an interposer.

FIG. 20 illustrates a finger of a spacer inserted into a corresponding notch of an interposer.

FIG. 21 illustrates the arrangement of the interposers 180 in relation to board 120 and in relation to boards 2190 and 2180, according to one embodiment FIG. 22 is a cross-sectional view of an embodiment of the connector 100.

FIG. 23 illustrates an embodiment of backbone 150.

FIG. 24 illustrates an embodiment of an end cap 199.

FIG. 25 is an exploded view of backbone 150 and an end cap 199.

FIG. 26 is a view of a backbone 150 and an end cap 199 assembled together.

FIG. 27 is a view of a spacer connected to backbone 150.

FIG. 28 illustrates an embodiment of mounting clip 190b.

FIG. 29 is an exploded view of clip 190b and end cap 199.

FIG. 30 is a view of clip 190b having an end cap 199 attached thereto.

FIG. 31 illustrates an embodiment of shield 160.

FIG. 32 is an exploded view of shield 160 and an interposer 180.

FIG. 33 is a view of shield 160 being connected to an interposer 180.

FIG. 34 is a view of an assembled connector with an interposer 180 and clip 190a omitted.

FIGS. 35 and 36 are different views of a connector 100 according to one embodiment assembled without cells in FIG. 35 and with 2 cells in FIG. 36.

As indicated, FIGS. 37–46 are views of additional preferred embodiments related to, inter alia, compliant mount connectors or interconnects.

FIG. 37 is a perspective front view of illustrative components of a connector according to some illustrative additional embodiments of the invention, including an insert-loaded interposer, spacers, etc.

FIG. 38 is a perspective side view, from a rear right side in the direction of arrow 38 shown in FIG. 37, showing illustrative components of a connector, showing, inter alia, insert-loaded interposer and a spacer.

FIG. 39 is a perspective side view, from a rear right side in the direction of arrow 39 shown in FIG. 37, showing illustrative components of a connector, showing, inter alia, a printed circuit board.

FIG. 40 is a close-up view of a portion of FIG. 37 showing a close-up view of a plurality of cells or inserts loaded in the interposer.

FIG. 41 is an even closer-up view of a portion of FIG. 37 showing a close-up view of single one of the cells or inserts loaded in the interposer.

FIG. 42 is a rough schematic representation that shows the spatial relationships of the connector's electrical components as they correspond to a motherboard or daughtercard footprint, depicting, e.g., a connector loaded with a plurality of generally parallel printed circuit boards and spacers.

FIG. 43 is a schematic representation of a rearward cross-sectional view of a portion of the loaded interposer shown in FIG. 37 taken in a direction as illustrated by the arrows A—A shown in FIG. 42.

FIG. 44 is a top view of a cell or insert for loading within the interposer according to some preferred embodiments of the invention.

FIG. 45 is a front end view of a cell or insert shown in FIG. 44.

FIG. 46 is a front perspective view of a cell or insert shown in FIG. 44.

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

The following description is presented in two parts: Part 1 related to, inter alia, compression mount connectors or interconnects described for the most part in conjunction with, e.g., FIGS. 1–36; and Part 2 related, inter alia, compliant mount connectors or interconnects described for the most part in conjunction with, e.g., FIGS. 37–46.

Figure 1:
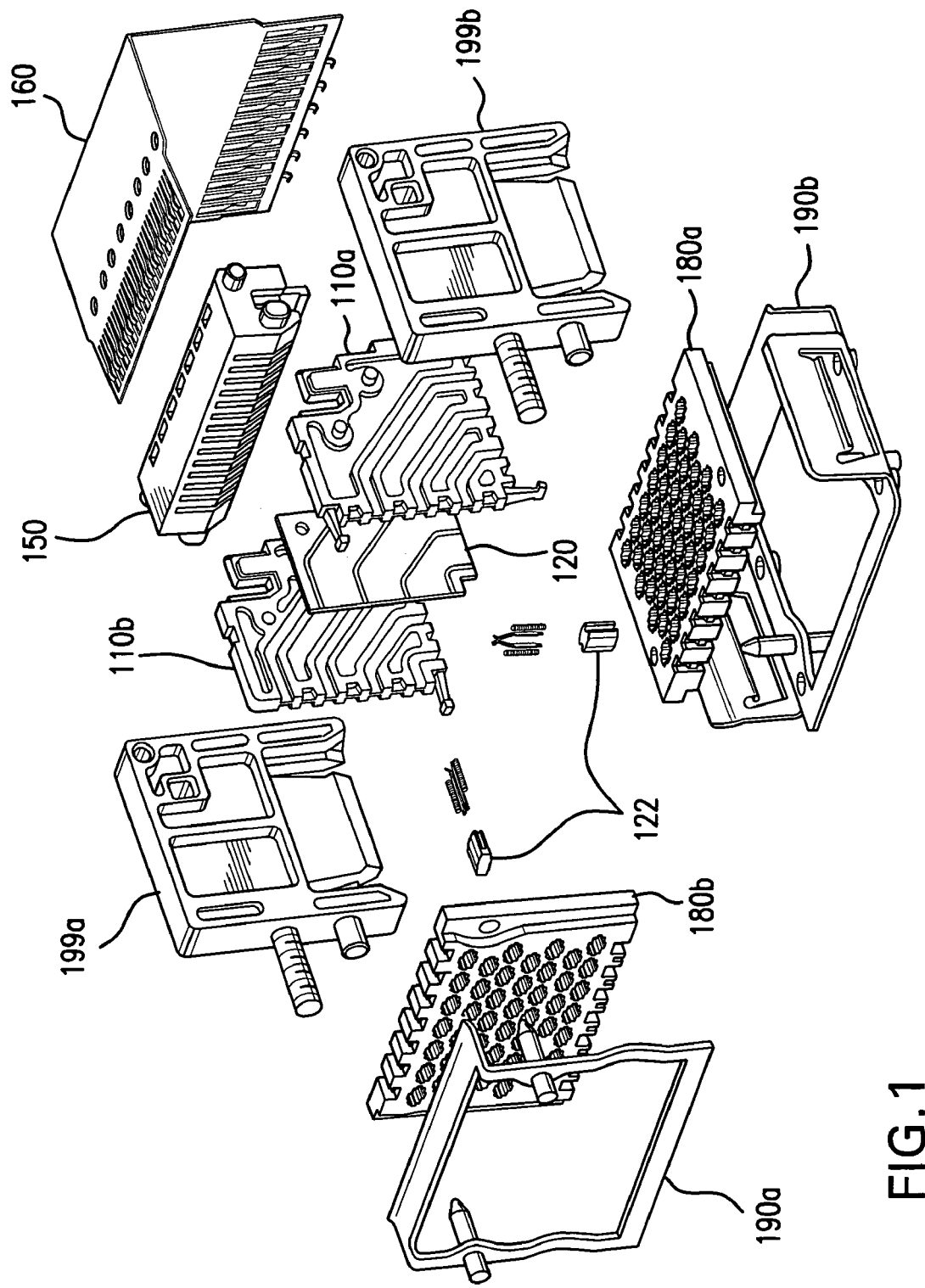
FIGS. 1–36 are views of illustrative preferred embodiments related to, inter alia, compression mount connectors or interconnects.

Part 1: Embodiments Related to, E.G., Compression Mount Connectors and the Like:

FIG. 1 is an exploded view of a connector 100 in accordance with an example preferred embodiment of the present invention. Some elements have been omitted for the sake of clarity. As illustrated in FIG. 1, connector 100 may include at least one printed circuit board 120 having electrical conductors printed thereon. In the embodiment shown, connector 100 may further include a pair of spacers 110a and 110b, a pair of interposers 180a and 180b, a pair of end-caps 190a and 190b, a backbone 150, a shield 160, and a pair of endplates 190 (i.e., 190a and 190b). Although only one circuit board and only two spacers are shown in FIG. 1, one skilled in the art will appreciate that in typical configurations connector 100 will include a number of circuit boards and spacers, with each circuit board being disposed between two spacers, as will be described herein.

Figure 2:
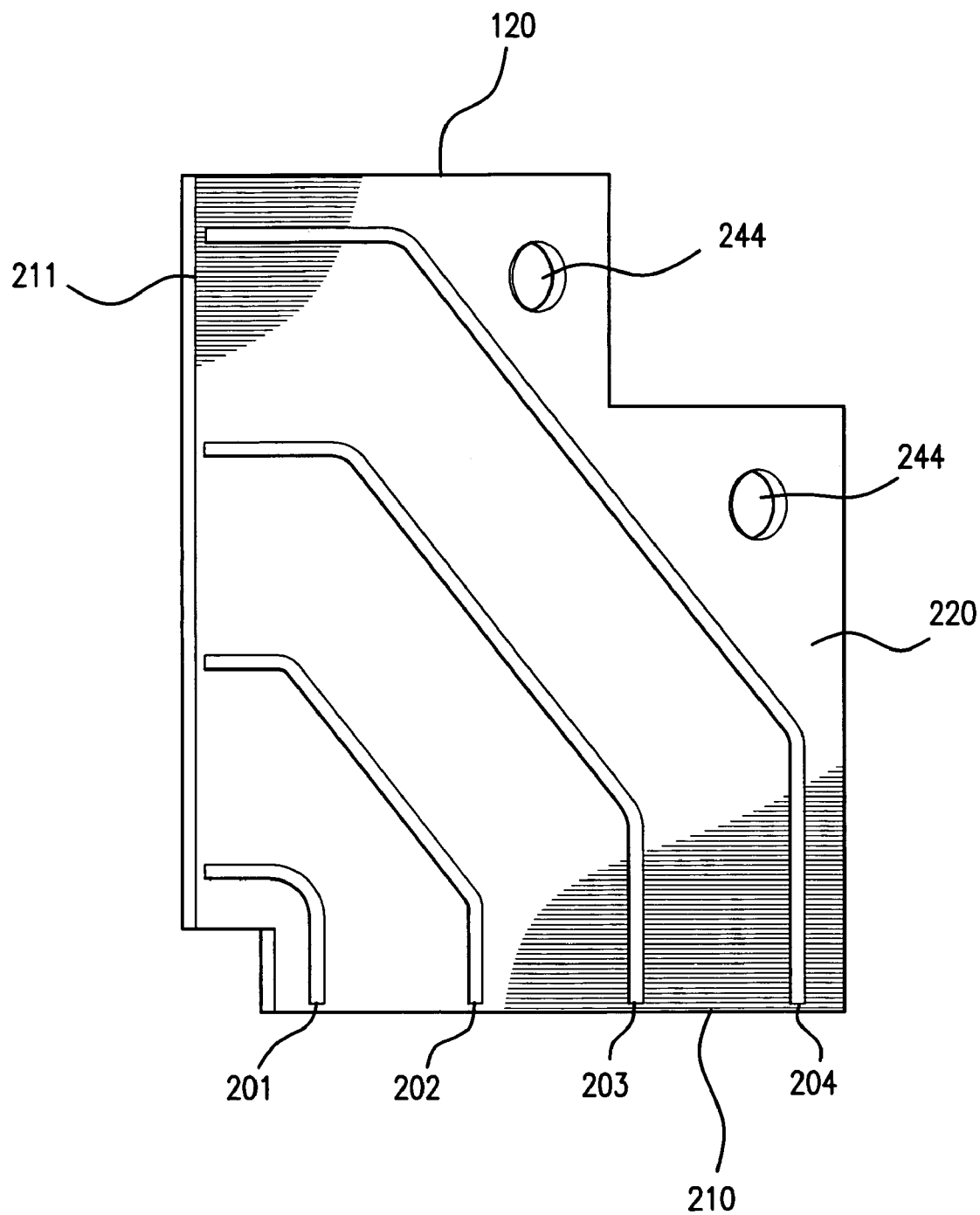

FIG. 2 is a view of printed circuit board 120. In the embodiment shown, circuit board 120 is generally rectangular in shape. As shown, circuit board 120 may have one or more electrical conductors disposed on a face 220 thereof. In the embodiment shown, board 120 has four conductors 201, 202, 203, and 204 disposed on face 220. Each conductor 201–204 has a first end, a second and an interim section between the first and second ends. The first end of each conductor is located at a point on or adjacent a first edge 210 of face 220 and the second end of each conductor is located at a point on or adjacent a second edge 211 of face 220. In many embodiments, second edge 211 of face 220 is perpendicular to first edge 210, as shown in the embodiment illustrated in FIG. 2.

Figure 3:
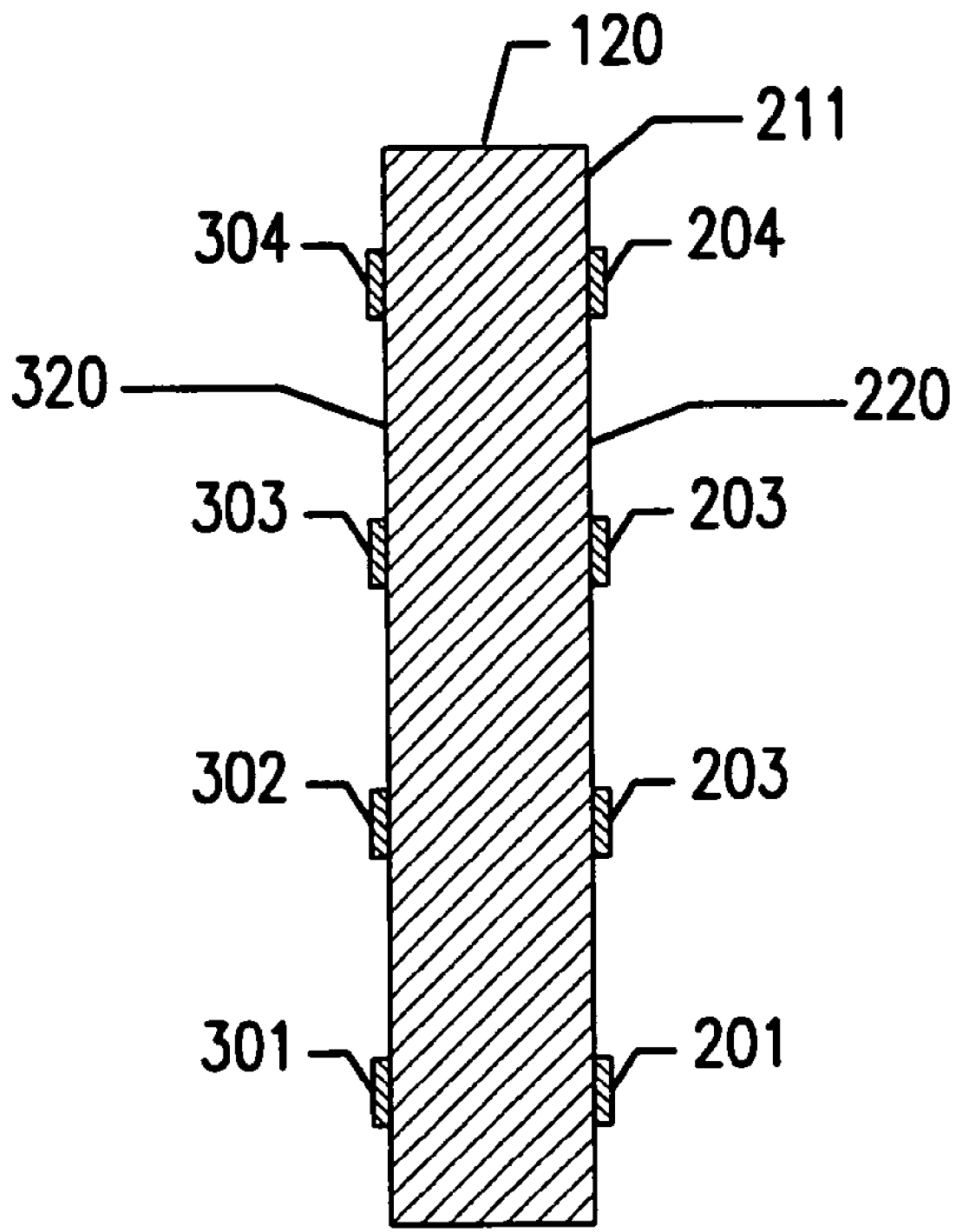

Although not shown in FIG. 2, there are corresponding electrical conductors on the opposite face of circuit board 120. More specifically, for each conductor 201-204, there is a conductor on the opposite face that is a mirror image of the conductor. This feature is illustrated in FIG. 3, which is a front side view of board 120. As shown in FIG. 3, conductors 301–304 are disposed on face 320 of board 120, which face 320 faces in the opposite direction of face 220. As further illustrated, conductors 301-304 correspond to conductors 201–204, respectively.

When the interconnection system 100 of the present invention is used to transmit differential signals, one of the electrical conductors 201–204 and its corresponding electrical conductor on the opposite face may be utilized together to form the two wire balanced pair required for transmitting the differential signal. Since the length of the two electrical conductors is identical, there should be no skew between the two electrical conductors (skew being the difference in time that it takes for a signal to propagate the two electrical conductors).

In configurations where connector 100 includes multiple circuit boards 120, the circuit boards are preferably arranged in a row in parallel relationship. Preferably, in such a configuration, each circuit board 120 of connector 100 is positioned between two spacers 110.

Figure 4:
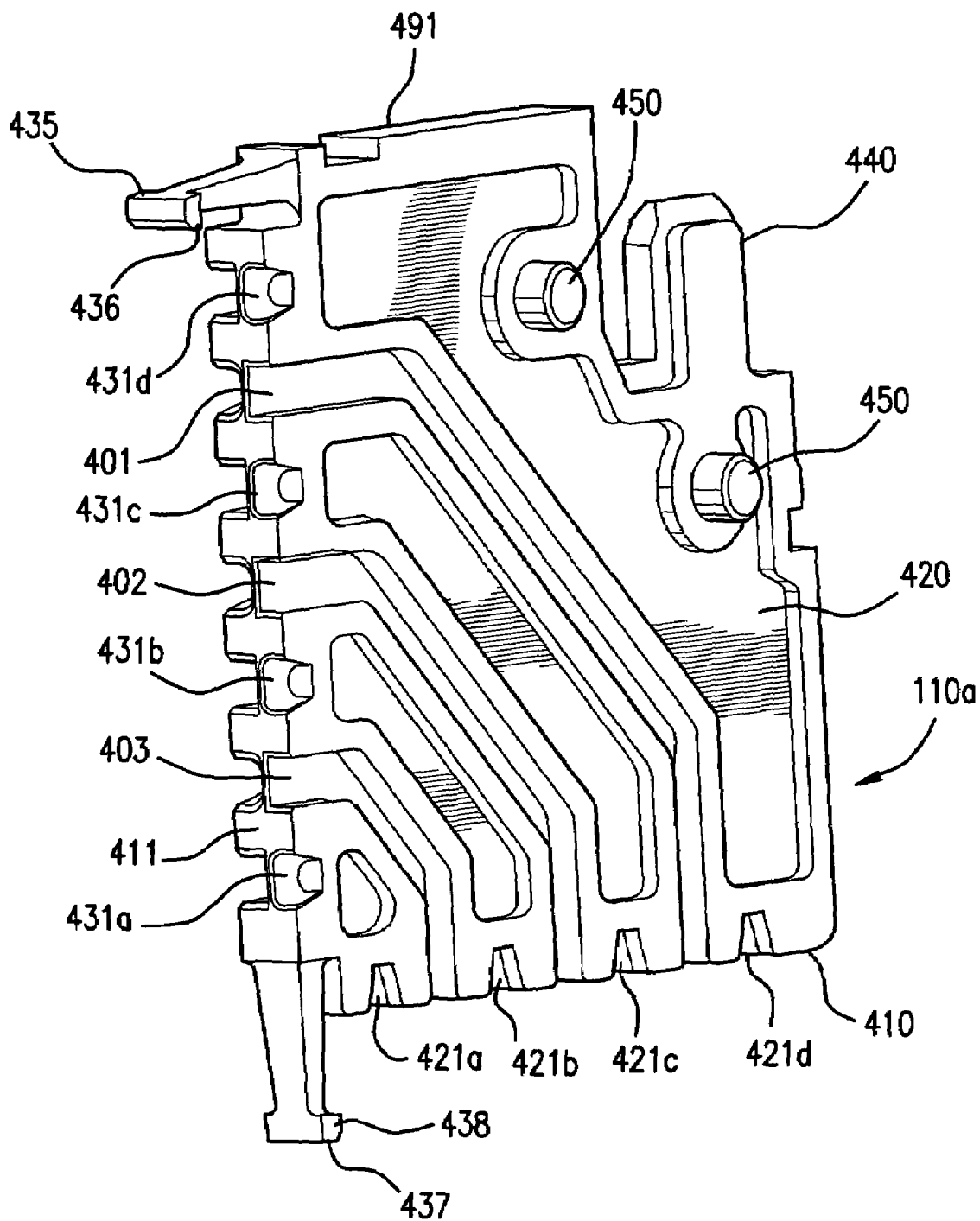

FIG. 4 is a perspective side view of spacer 110a according to one embodiment of the invention. As shown, spacer 110a may have one or more grooves disposed on a face 420 thereof, which face 420 faces away from board 120. In the embodiment shown, face 420 of spacer 110a has three grooves 401, 402 and 403 disposed thereon. Each groove 401–403 extends from a point at or near a first edge 410 of face 420 to a point at or near second edge 411 of face 420. In many embodiments, second edge 411 of face 420 is perpendicular to first edge 410, as shown in the embodiment illustrated in FIG. 4.

As further shown, face 420 of spacer 110a may have one or more recesses disposed at an edge of face 420. In the embodiment shown, there are two sets of four recesses disposed at an edge on face 420. The first set of recesses includes recesses 421a–d, and the second set of recesses includes recesses 431a–d. Each recess 421a–d is positioned directly adjacent to the end of at least one groove and extends from a point on edge 410 of face 420 to a second point spaced inwardly from edge 410a short distance. Similarly, each recess 431a–d is positioned directly adjacent to the end of at least one groove and extends from a point on edge 411 of face 420 to a second point spaced inwardly from edge 411a short distance. Accordingly, in the embodiment shown, there is at least one recess between the ends of all the grooves. Each recess 421, 431 is designed to receive the end of spring element (see FIG. 16, elements 1520).

Figure 6:
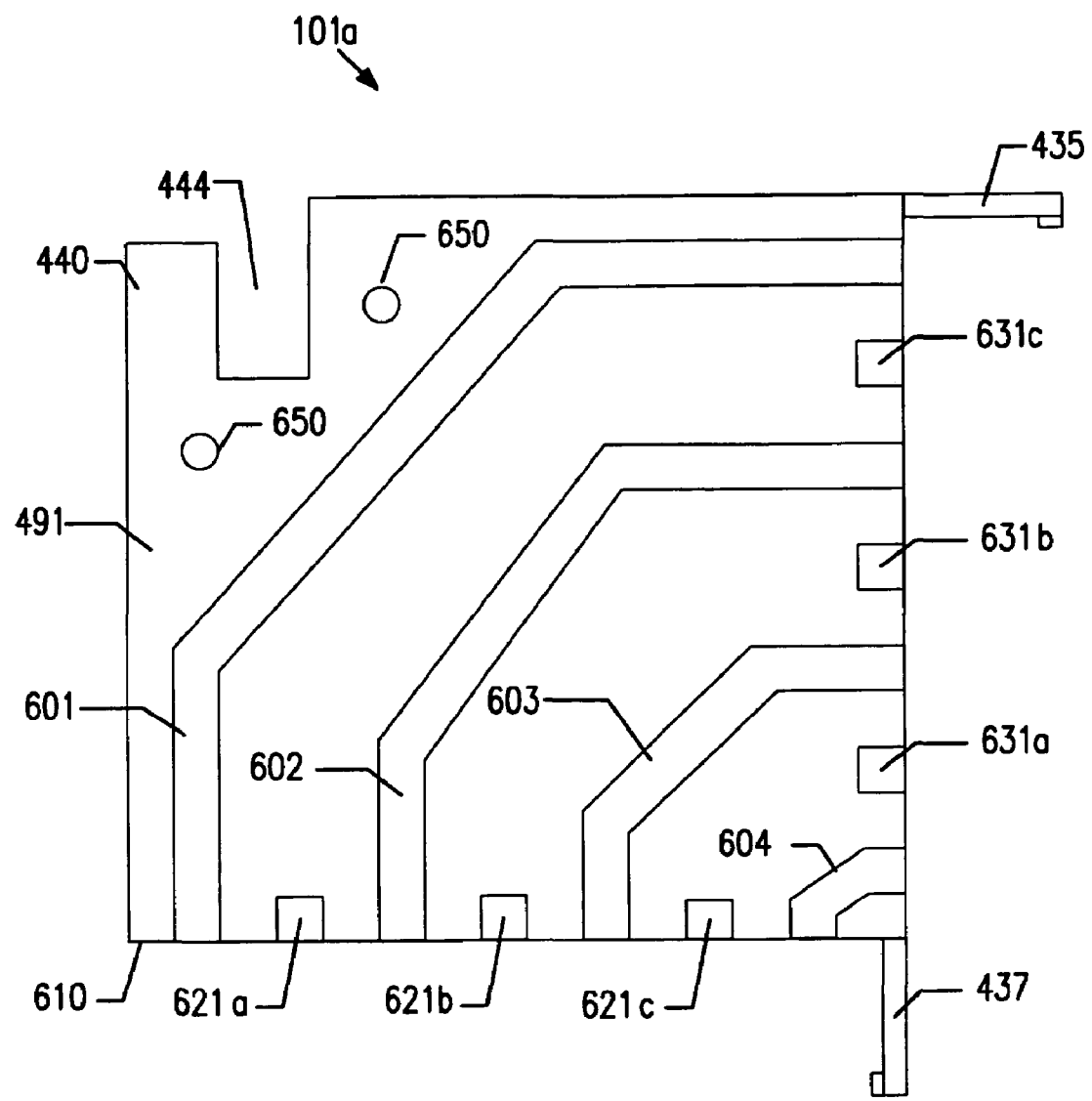
Figure 7:
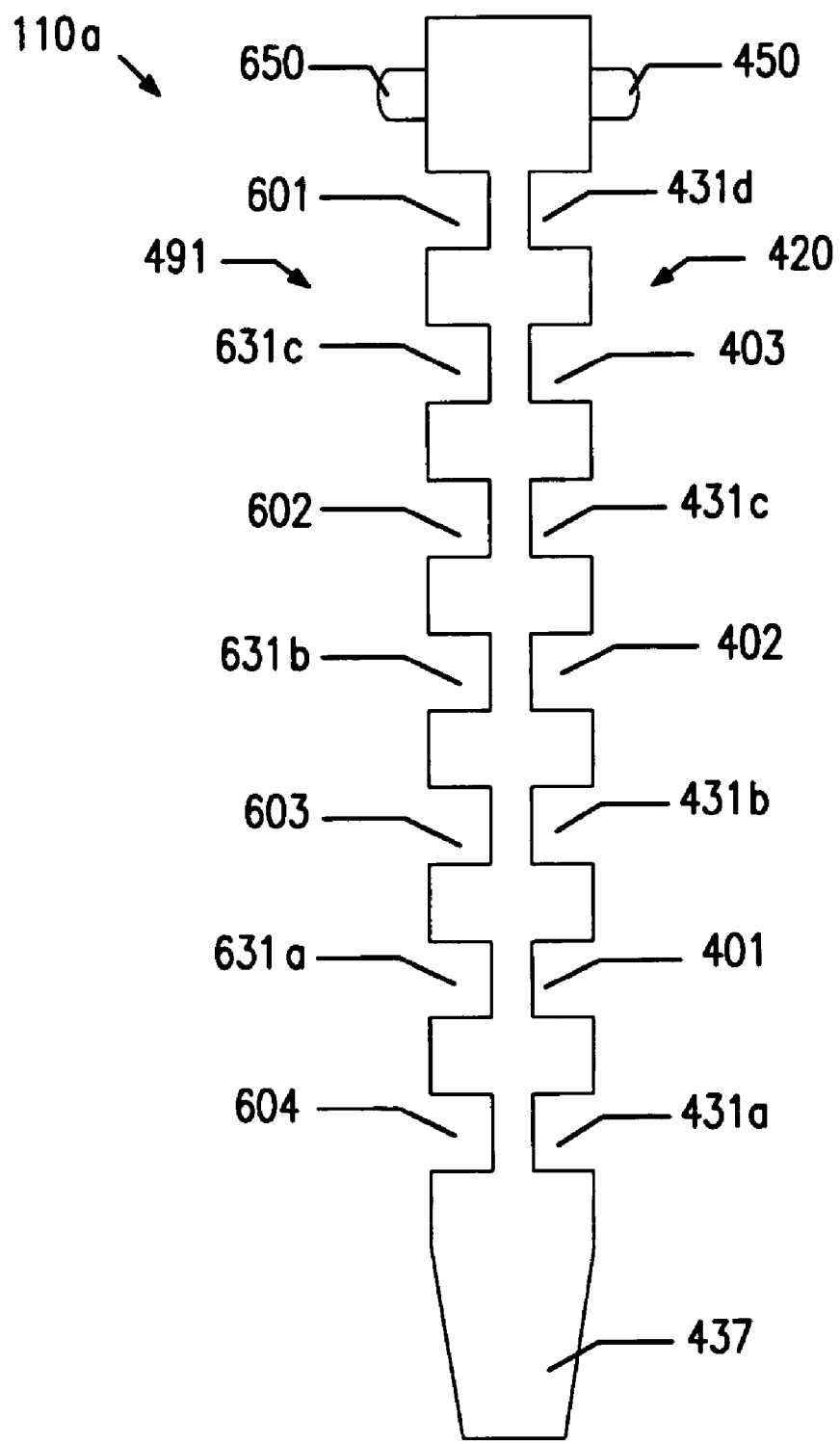

Although not shown in FIG. 4, there may be grooves and recesses on the opposite face 491 of spacer 110a. In a preferred embodiment, the number of grooves on the first face of a spacer 110 is one less (or one more) than the number of grooves on the second face of the spacer 110, but this is not a requirement. Similarly, in the preferred embodiment, the number of recesses on the first face of a spacer 110 is two less (or two more) than the number of recesses on the second face of the spacer 110. This feature is illustrated in FIGS. 5–7, where FIG. 5 is a top view of face 420, FIG. 6 is a top view of the opposite face (i.e., face 491), and FIG. 7 is a front side view of spacer 110a.

Figure 5:
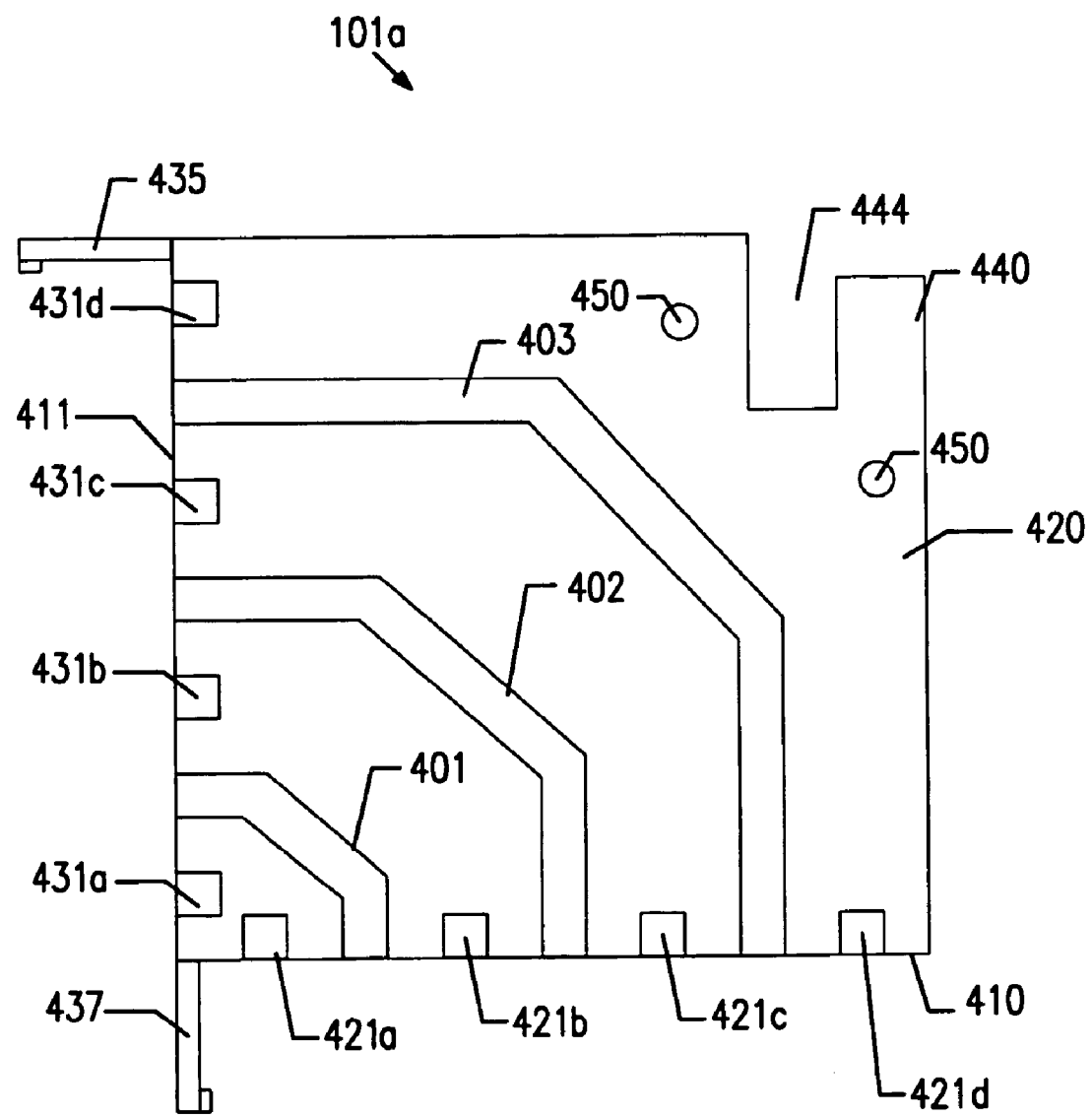

As shown in FIG. 5, grooves 401–403, recesses 421a–d, and recesses 431a–d are disposed on face 420 of spacer 110a. Similarly, as shown in FIG. 6, grooves 601–604, recesses 621a–c, and recesses 631a–c are disposed on face 491 of spacer 110a, which face 491 faces in the opposite direction of face 420.

Grooves 601–604 are similar to grooves 401–404 in that each groove 601–604 extends from a point on a first edge 610 of face 491 to a point on a second edge 611 of face 491. Likewise, recesses 621 and 631 are similar to recesses 421 and 431. Like each recess 421, each recess 621 extends from a point on edge 610 of face 491 to a second point spaced inwardly from edge 610 a short distance. Similarly, each recess 631 extends from a point on edge 611 of face 491 to a second point spaced inwardly from edge 611 a short distance. Each recess 621, 631 is designed to receive the end of a spring element (see FIG. 16, elements 1520).

The figures illustrate that, in some embodiments, the number of grooves on one face of a spacer 110 is one less (or one more) than the number of grooves on the opposite face of the spacer. And also show that the number of recesses on one face may be two less (or two more) than the number of recesses on the opposite face.

In the embodiment shown in FIGS. 4–6, each recess on one face is positioned so that it is generally directly opposite an end of a groove on the other face. For example, recess 421a is generally directly opposite an end of groove 604 and recess 621a is generally directly opposite an end of groove 403. This feature can be more easily seen by examining FIG. 7, which is a front side view of the spacer.

Referring back to FIG. 4-6, FIG. 4 shows that spacer 110a may further include three fingers 435, 437, and 440. It also shows that that spacer 110a may also include a slot 444 and a first pair of bosses 450 disposed on and projecting outwardly from face 420 and a second pair of bosses 650 disposed on and projecting outwardly from face 491. Bosses 650 are provided to fit in the apertures 244 of circuit board 120. This feature enables board 120 to be properly aligned with respect to the adjacent spacers 110a and 110b.

Finger 435 is located towards the top of the front side of spacer 110a and finger 437 is located towards the front of the bottom side of spacer 110a. Finger 435 projects outwardly from the front side of spacer 110a in a direction that is perpendicular to the front side of the spacer. Similarly, finger 437 projects outwardly from the bottom side of spacer 110a in a direction that is perpendicular to the bottom side of the spacer. Fingers 435, 437 function to attach spacer 110a to interposers 180b, 180a, respectively. More specifically, interposer 180a includes a recess 1810 (see FIG. 18) for receiving and retaining finger 437. Similarly interposer 180b includes a recess for receiving and retaining finger 435. Fingers 435, 437 each include a protrusion 436 and 438, respectively. The protrusions are sufficiently resilient to allow them to snap into corresponding recesses in the corresponding interposers.

Slot 444 is located towards but spaced apart from the backside of spacer 110a. Slot 444 extends downwardly from the top side of spacer 110 to form finger 440. Finger 440 and slot 444 function together to attach spacer 110a to backbone 150.

Figure 8:
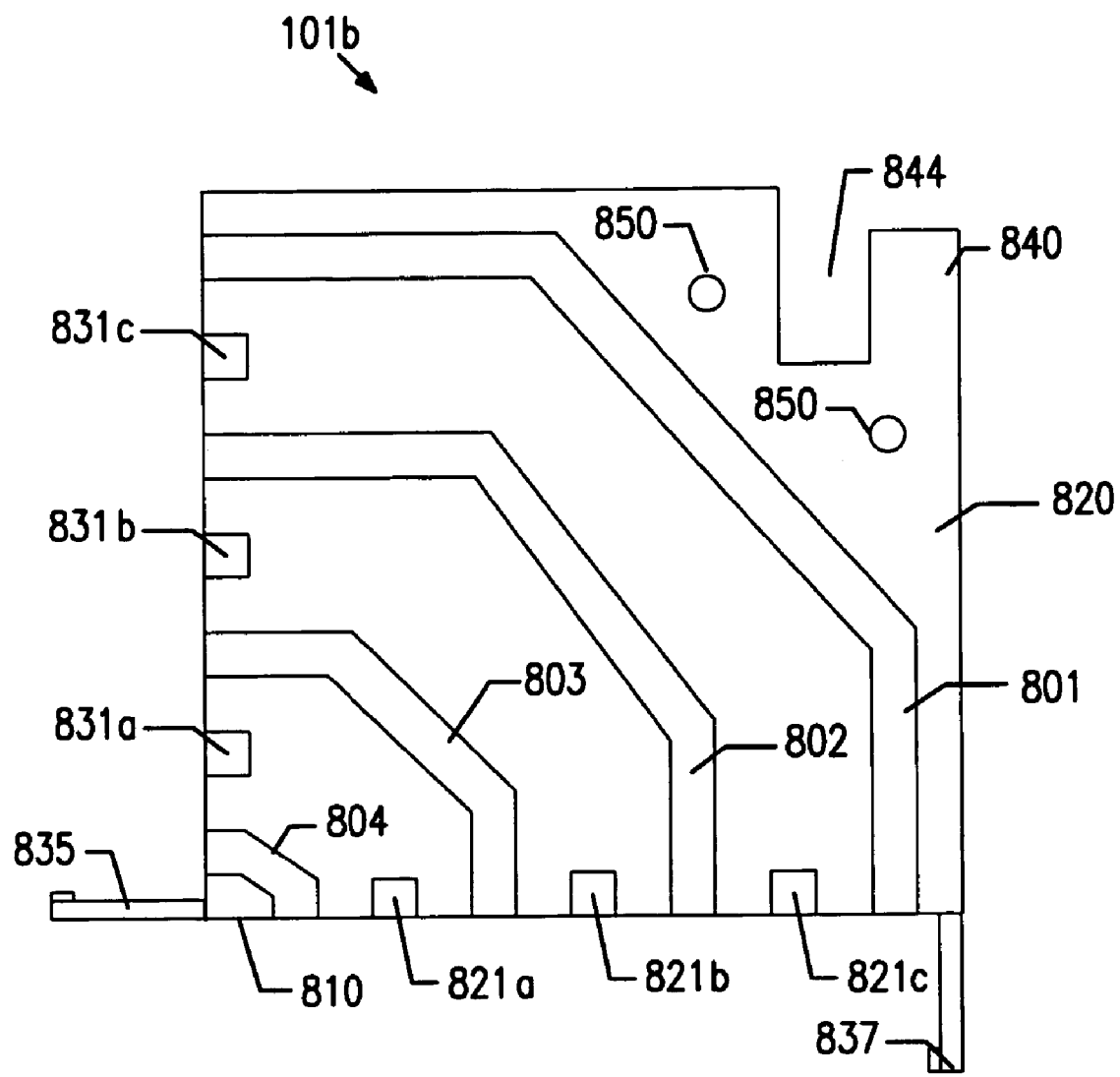
Figure 9:
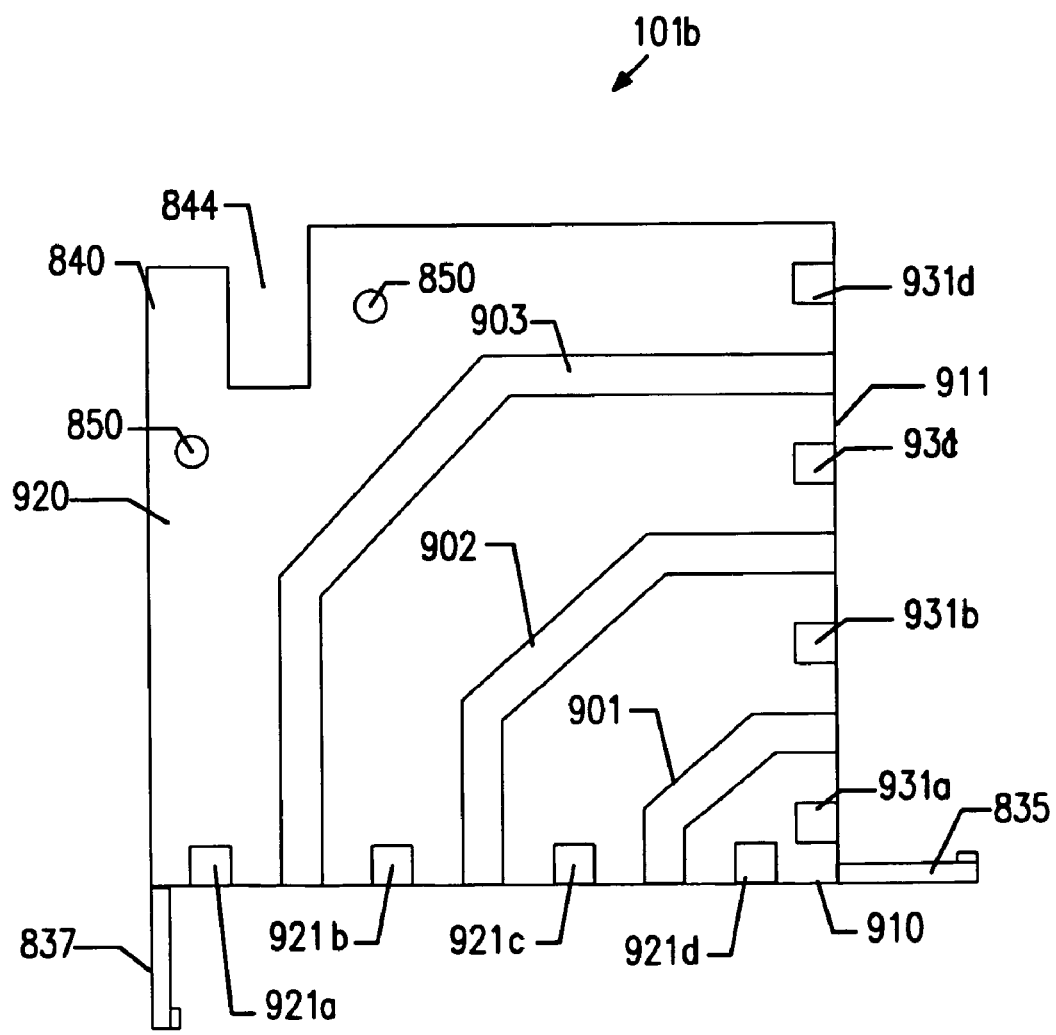

Referring back to spacer 110b (see FIG. 1), in the embodiment shown, spacer 110b is similar but not identical to spacer 110a. Accordingly, in some embodiments connector 100 includes two types of spacers: type A and type B. In other embodiments, more or less than two types of spacers may be used. FIGS. 8 and 9 further illustrate spacer 110b (the type B spacer) according to one embodiment. FIG. 8 is a top view of a face 820 of spacer 110b. Face 820 faces circuit board 120. As shown in FIG. 8, face 820 is similar to face 491 of spacer 110a, which also faces board 120. Like face 491, face 820 has four grooves 801–804, a first set of three recesses 821a–c, and a second set of three recesses 831a–c.

Grooves 801–804 are similar to grooves 601–604 in that each groove 801–804 extends from a point on a first edge 810 of face 820 to a point on a second edge 811 of face 820. Likewise, recesses 821 and 831 are similar to recesses 621 and 631. Like each recess 621, each recess 821 extends from a point on edge 810 of face 820 to a second point spaced inwardly from edge 810 a short distance. Similarly, each recess 831 extends from a point on edge 811 of face 820 to a second point spaced inwardly from edge 811 a short distance.

FIG. 9 is a top view of a face 920 of spacer 110b. Face 920 faces away from circuit board 120 in the opposite direction of face 820. As shown in FIG. 9, face 920 is similar to face 420 of spacer 110a, which also faces away from board 120. Like face 420, face 920 has three grooves 901–903, a first set of four recesses 921a–d, and a second set of four recesses 931a–d.

Grooves 901–903 are similar to grooves 401–403 in that each groove 901–903 extends from a point on a first edge 910 of face 920 to a point on a second edge 911 of face 920. Likewise, recesses 921 and 931 are similar to recesses 421 and 431. Each recess 421 extends from a point on edge 910 of face 920 to a second point spaced inwardly from edge 910 a short distance, and each recess 931 extends from a point on edge 911 of face 920 to a second point spaced inwardly from edge 911 a short distance.

Spacer 110b also includes three fingers 835, 837, and 840, a slot 844, and a pair apertures 850 extending through spacer 110b. Apertures 850 are provided to receive bosses 650. This feature enables spacer 110b to be properly aligned with respect to spacers 110a.

Unlike finger 435, which is located towards the top of the front side of spacer 110a, finger 835 is located towards the bottom of the front side of spacer 110b. Similarly, unlike finger 437, which is located towards the front of the bottom side of spacer 110a, finger 837 is located towards the back of the bottom side of spacer 110b. Finger 835 projects outwardly from the front side of spacer 110a in a direction that is perpendicular to the front side of the spacer, and finger 437 projects outwardly from the bottom side of spacer 110a in a direction that is perpendicular to the bottom side of the spacer. Like fingers 435, 437, fingers 835, 837 function to attach spacer 110b to interposers 180b, 180a, respectively.

Figure 10:
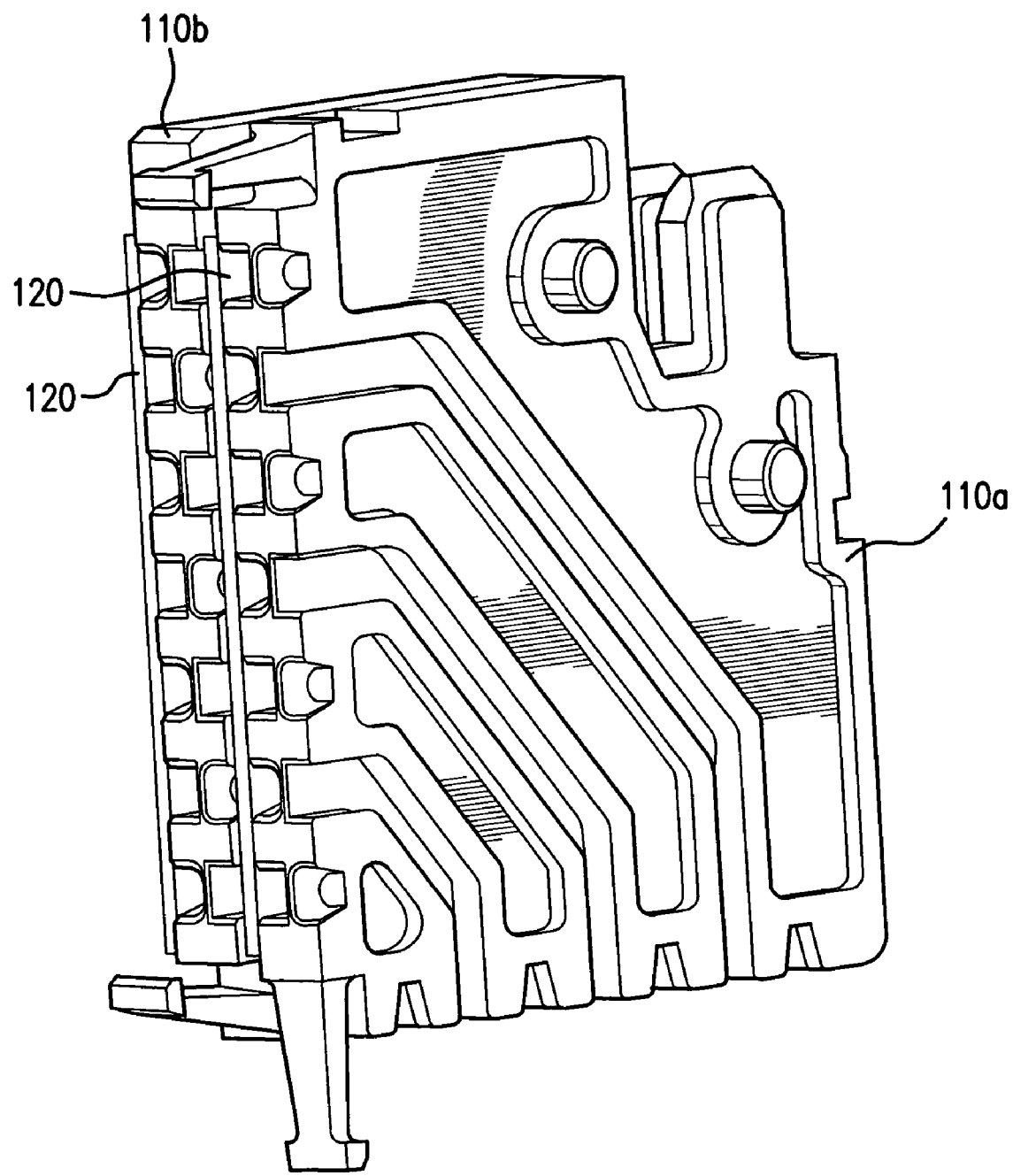

As discussed above, board 120 is positioned between spacers 110a and 110b. This feature is illustrated in FIG. 10. Although not shown in FIG. 10, bosses 650 of spacer 110a protrude though apertures 244 of board 120 and through apertures 850 of spacer 110b. This use of bosses 650 facilitates the proper alignment of spacers 110a,b and board 120. When board 120 is properly aligned with the spacers, conductors 201–204 and 301–304 are aligned with grooves 601–604 and 801–804, respectively. This feature is illustrated in FIG. 11.

Figure 11:
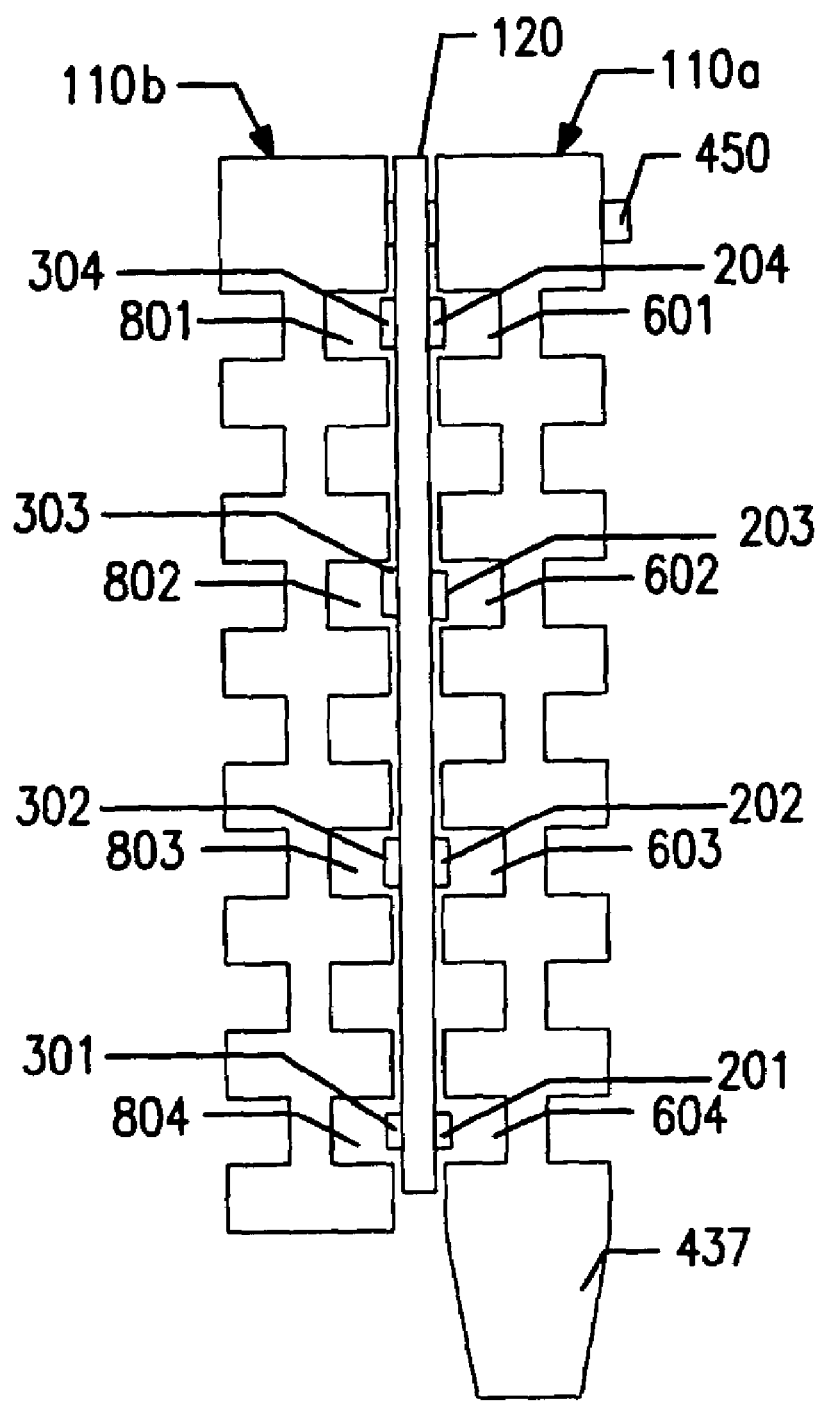

As shown in FIG. 11, grooves 601–604, which are disposed on the side of spacer 110a facing board 120, are positioned on the spacer to mirror electrical conductors 201–204 on printed circuit board 120. Likewise, grooves 801–804, which are disposed on the side of spacer 110b facing board 120, are positioned on the spacer to mirror electrical conductors 301–304. Grooves 601–604 and 801–804, among other things, prevent electrical conductors 201–204 and 301–304 from touching spacer 110a and 110b, respectively. In this way, the electrical conductors disposed on board 120 are insulated by the air caught between board 120 and the grooves.

Spacers 110 may be fabricated either from an electrically conductive material or from a dielectric material and coated with an electrically conductive layer to electromagnetically shield the electrical conductors of the printed circuit board 120. Furthermore, the complex impedances of the electrical conductors and their associated grooves can be adjusted by varying the dimensions thereof. Still furthermore, the grooves can include a layer of a dielectric material, such as Teflon, to further adjust the complex impedances of the electrical conductors and their associated channels as well as adjusting the breakdown voltage thereof.

Figure 12:
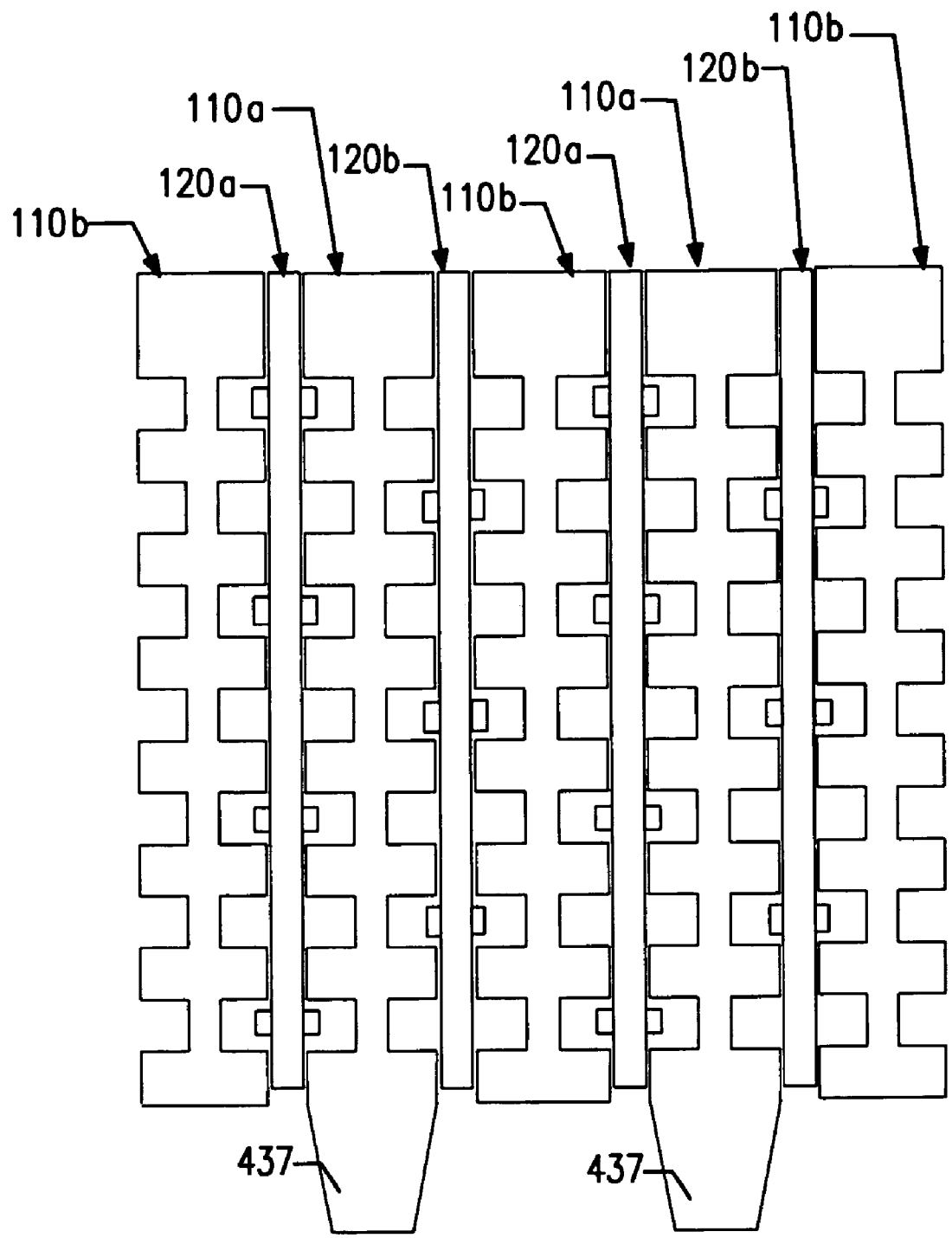

Referring now to FIG. 12, FIG. 12 illustrates an example arrangement of spacers 110 and circuit boards 120 when multiple circuit boards are used in connector 100. As shown, boards 120 and spacers 110 are aligned in a row in parallel relationship and each circuit board 120 is sandwiched between two spacers 110. In the example shown, there are two types of circuit boards (A) and (B), as well as the two types of spacers (A) and (B) discussed above. The A type circuit boards are identical to each other and the B type circuit boards are identical to each other. Similarly, The A type spacers are identical to each other and the B type spacers are identical to each other.

In the embodiment shown, spacers 110 and boards 120 are arranged in an alternating sequence, which means that between any two given A type spacers there is a B type spacer and vice-versa, and between any two given A type boards there is a B type board and vice-versa. Thus, an A type spacer is not adjacent to another A type spacer and an A type board is not adjacent to another A type board. Accordingly, in this example configuration, each board 120 is disposed between an A type spacer and a B type spacer.

Figure 13:
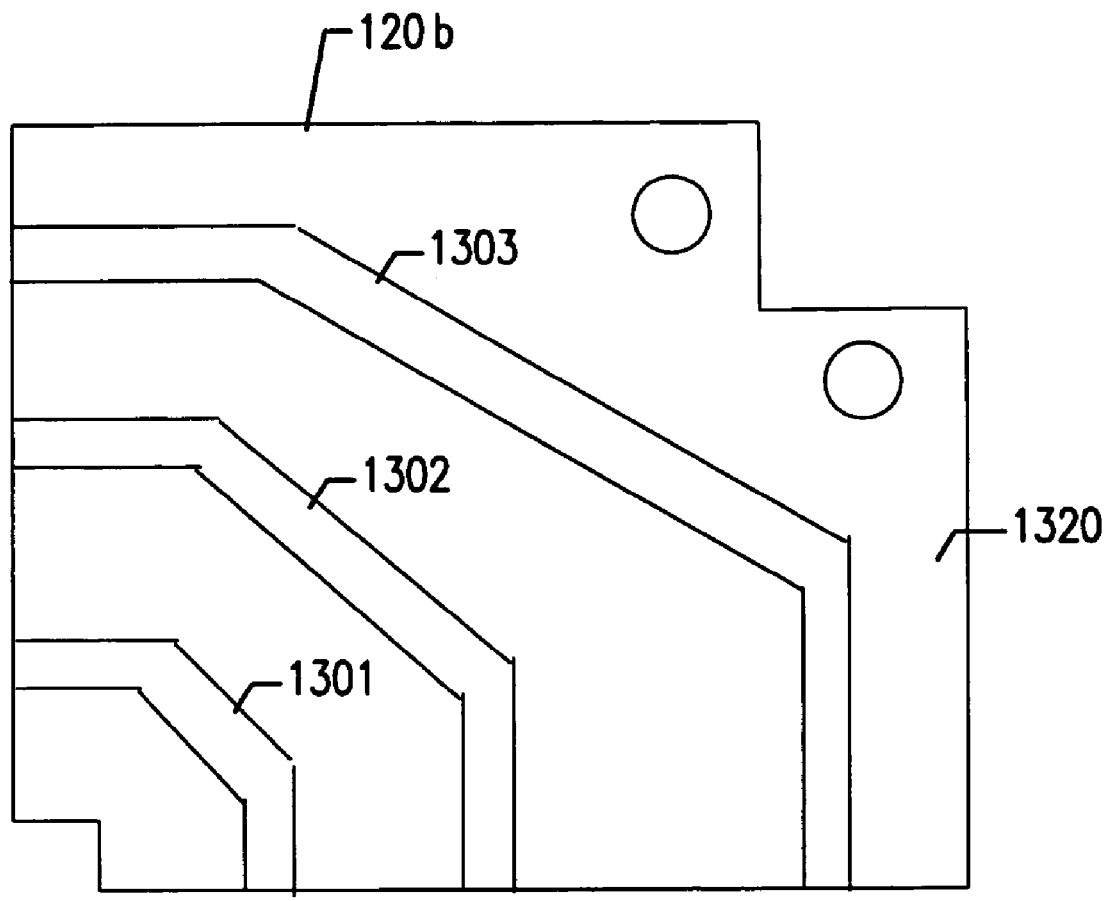

As can be seen from FIG. 12, each face of each board 120b (the B type board) has three conductors thereon. FIG. 13 is a top view of one face 1320 of a B type board (the other face not shown is a mirror image of face 1320). As shown in FIG. 13, there are three conductors 1301, 1302, and 1303 disposed on face 1320. By comparing FIG. 13 to FIG. 2 (which is a top view of a face of an A type board), one can see that the A and B type boards are nearly identical. One difference being the number of conductors on each face and the alignment of the conductors on the face. In the embodiment shown, the B type boards have one less electrical conductor than do the A type boards.

Figure 14:
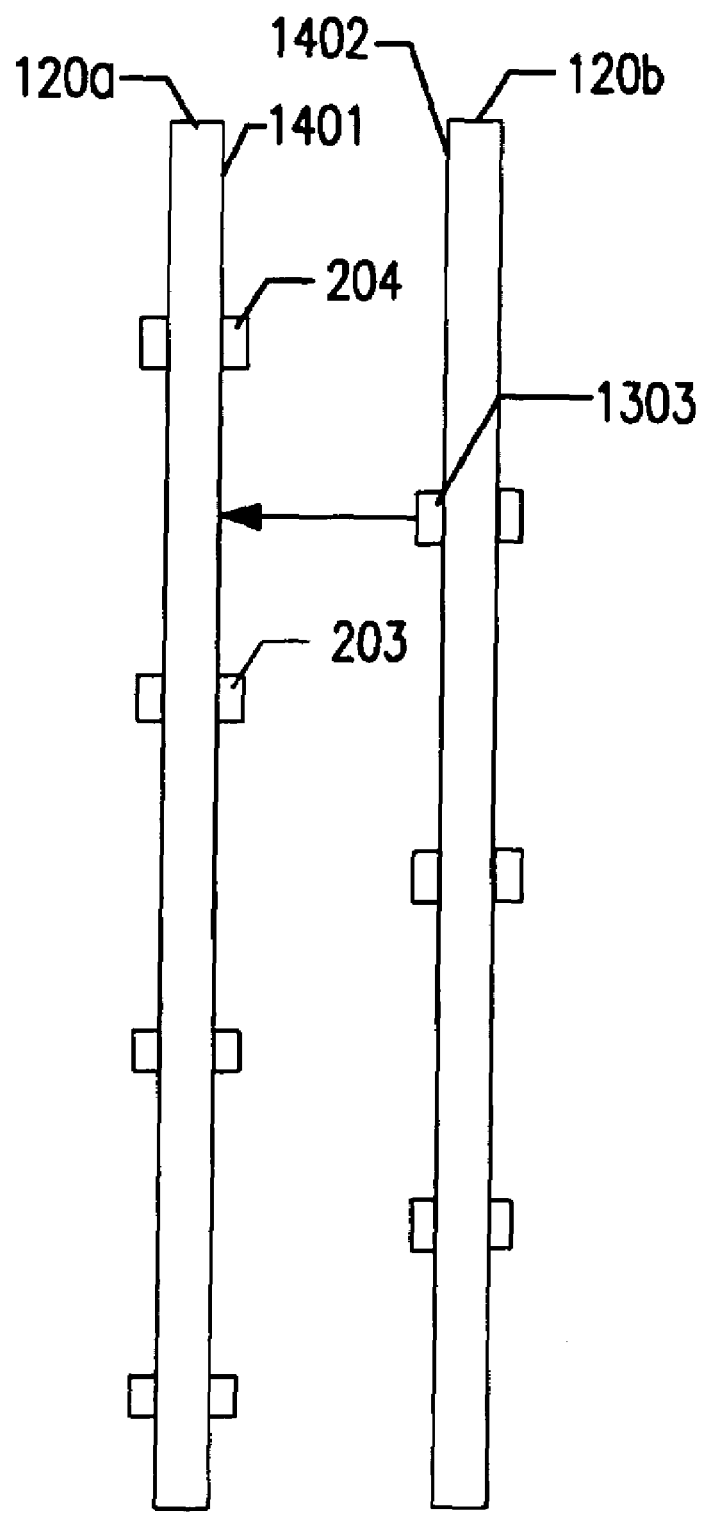

Referring to FIG. 14, FIG. 14 illustrates how the alignment of the conductors 1301–1303 on the B type boards differs from alignment of the conductors 201–204 on the A type boards. FIG. 14 shows representative boards 120a and 120b in a side by side arrangement so that a front edge 1401 on board 120a is spaced apart from and parallel with a corresponding front edge 1402 on board 120b. From FIG. 14, one can clearly see that the ends of the conductors on the B type board located at edge 1402 are not aligned with the ends of the conductors on the A type board located at edge 1401. For example, in the example shown, the end of any given conductor on the B type board is interstitially aligned with respect to the ends of two adjacent conductors on the A type board. That is, if one were to draw the shortest line from the end of each conductor on the B board to the adjacent face of the A board, each line would terminate at a point that is between the ends of two conductors on the A board. For example, the shortest line from the end of conductor 1301 to the adjacent face of board 120*a* ends at a point that is between the ends of conductors 204 and 203. An advantage of having the conductors be misaligned is that it may reduce cross-talk in the connector.

Referring back to FIG. 12, one can clearly see that each conductor on each board 120 is aligned with a groove on the spacer directly adjacent the conductor. That is, each groove on each spacer 110 is designed to mirror a corresponding conductor on an adjacent board 120. Because each conductor is aligned with a corresponding groove, there is a space between the conductor and the spacer.

When connector 100 is fully assembled, each conductor on a board 120 comes into physical and electrical contact with two contact members (see FIG. 15 for a representative contact member 1530*a*), an end of each of which fits into the space between the adjacent spacer and the conductor. More specifically, the first end of each conductor comes into physical and electrical contact with the contact portion of a first contact member and the second end of each conductor comes into physical and electrical contact with the contact portion second contact member, and the contact portions of the first and second contact members are each disposed in the space between the corresponding end of the conductor and the spacer. Each contact member functions to electrically connect the conductor to which it makes contact to a trace on a circuit board to which the connector 100 is attached.

Figure 15:
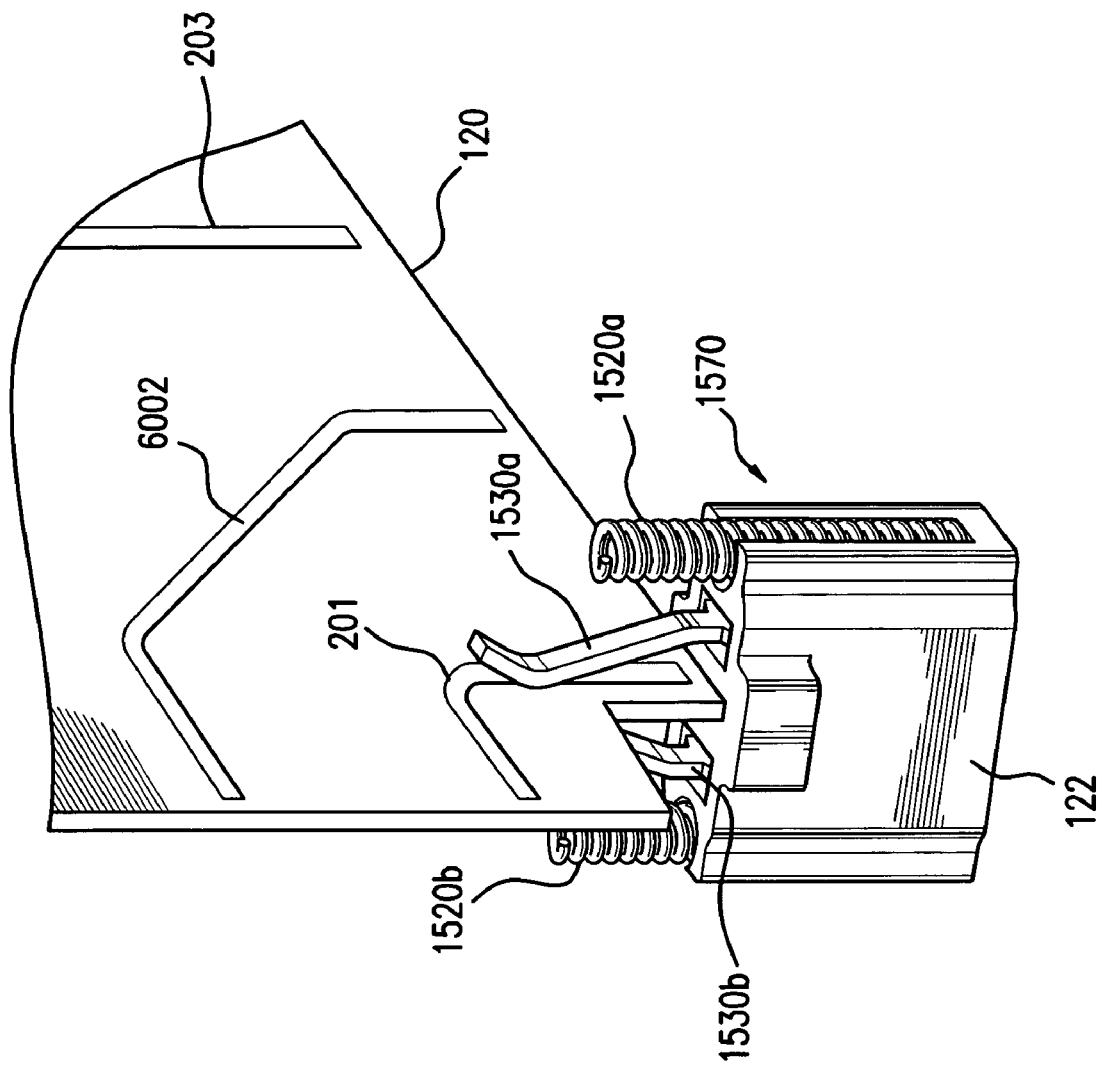

FIG. 15 illustrates a contact member 1530*a*, according to one embodiment of the invention, for electrically connecting a conductor 201 on a board 120 to trace on a circuit board (not shown in FIG. 15) to which the connector 100 is attached. Only a portion of contact member 1530*a* is visible in FIG. 15 because a portion is disposed within a housing 1522.

As shown in FIG. 15, contact member 1530*a* contacts an end of conductor 201 (the spacers and interposers are not shown to better illustrate this feature). In some embodiments, the ends of the conductor 201 are wider than the interim portions so as to provide more surface area for receiving the contact portion of the contact members.

Partially shown in FIG. 15 is another contact member 1530*b*. Contact member 1530*b* has a bottom portion that is also housed in housing 1522. Contact member 1530*b* contacts an end of conductor 301, which can't be seen in FIG. 15. Housing 1522 is preferably fabricated of an electrically insulative material, such as a plastic. The electrical contacts 1530 of each housing 1522 can either be disposed within the housing during fabrication or subsequently fitted within the housing.

Contact members 1530 may be fabricated by commonly available techniques utilizing any material having suitable electrical and mechanical characteristics. They may be fabricated of laminated materials such as gold plated phosphor bronze. While they are illustrated as being of unitary construction, one skilled in the art will appreciate that they may be made from multiple components.

As further shown in FIG. 15, housing 1522 may be configured to hold two elongate springs 1520*a* and 1520*b*. Springs 1520 extend in the same direction as contact members 1530 and 1531. The distal end of a spring 1520 is designed to be inserted into a corresponding spacer recess. For example, distal end of spring 1520*a* is designed to be received in recess 621*c*. The combination of the housing 1522, contact members 1530, and springs 1520 is referred to as a cell 1570.

Figure 16:
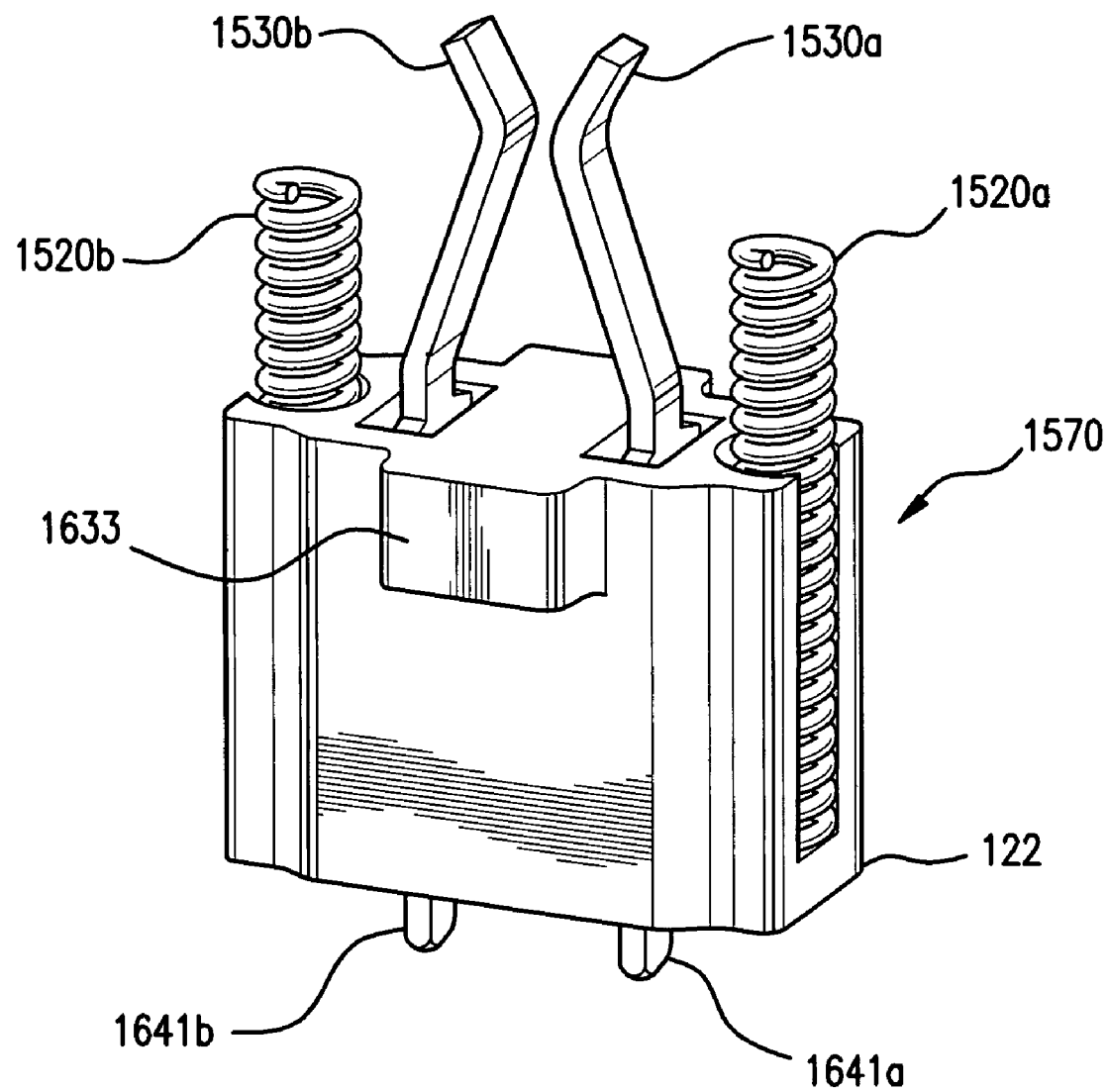
Figure 17:
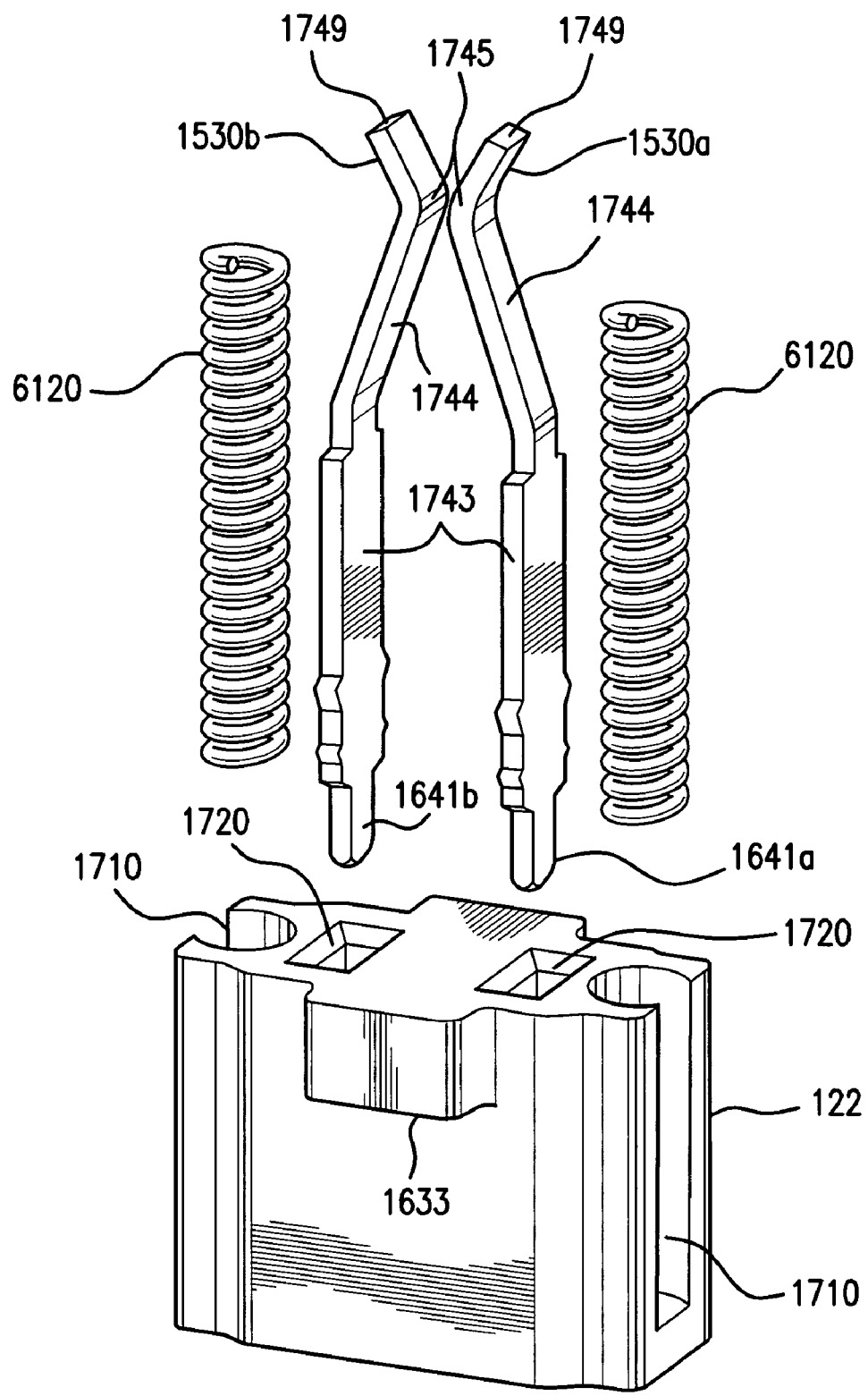

FIGSS. 16 and 17 further illustrate cell 1570 according to one embodiment. FIG. 17 is an exploded view of cell 1570. As shown, the housing 1522 is generally rectangular in shape and includes apertures 1710 for receiving springs 1520 and apertures 1720 for receiving contact members 1530. Apertures 1720 extend from the top side of housing to bottom side of the housing so that proximal ends 1641 of contact members 1730 can project beyond the bottom side of housing 1522, as shown in FIG. 16.

Apertures 1710 extend from the top surface of housing 1522 towards the bottom surface, but do not reach the bottom surface. Accordingly, when a spring 1520 is inserted into an aperture 1710 the proximal end will not project beyond the bottom surface of housing 1522. While open apertures 1710 are illustrated, it is understood that closed apertures can also be used As illustrated in FIG. 17, each contact member 1530, according to the embodiment shown, has a proximal end 1641 and a distal end 1749. Between ends 1641 and 1749 there is a base portion 1743, a transition portion 1744 and a contact portion 1745. Base portion 1743 is between proximal end 1641 and transition portion 1744, transition portion is between base portion 1743 and contact portion 1745, and contact portion 1745 is between transition portion 1744 and distal end 1749. In the embodiment shown, base portion 1743 is disposed in aperture 1720 so that generally the entire base portion is within housing 1522, transition portion 1744 is angled inwardly with respect to the base portion, and distal end 1749 is angled outwardly with respect to the transition portion and therefore functions as a lead-in portion.

In a preferred embodiment, the contact portion of a contact member is not fixed to the end of the conductor with which it makes physical and electrical contact. For example, the contact portions are not soldered or otherwise fixed to the board 120 conductors, as is typical in the prior art. Instead, in a preferred embodiment, a contact member 1630 is electrically connected to its corresponding conductor with a wiping action similar to that used in card edge connectors. That is, the contact portion of the contact member merely presses against the end of the corresponding conductor. For example, referring back to FIG. 15, the contact portion of contact member 1530*a* merely presses or pushes against the end portion of conductor 201. Because it is not fixed to the conductor, the contact portion can move along the length of the conductor while still pressing against the conductor, creating a wiping action. This wiping action may ensure a good electrical connection between the contact members and the corresponding electrical conductors of the printed circuit boards 120.

Figure 18:
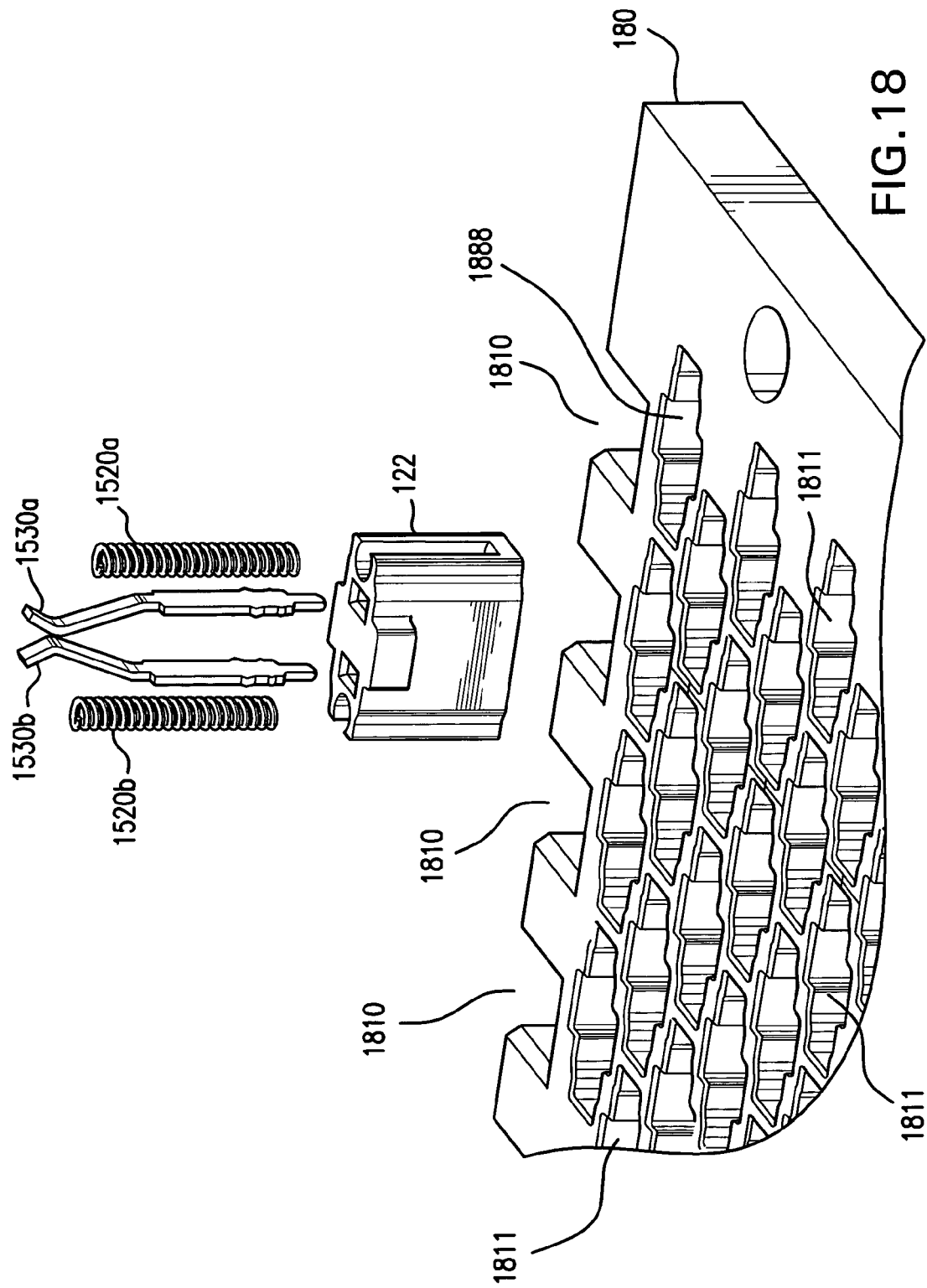
Figure 19:
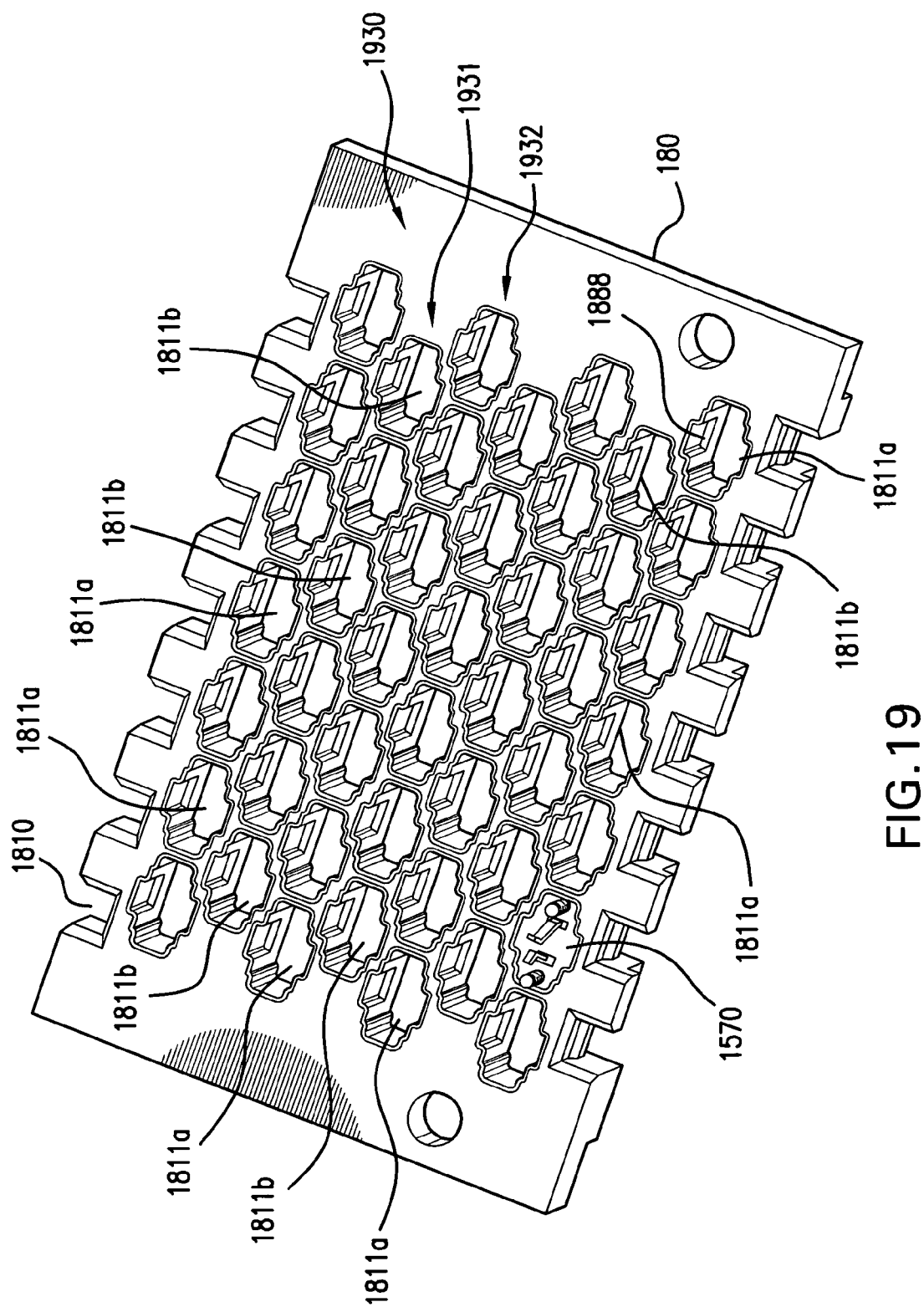

Referring now to FIGS. 18 and 19, FIGS. 18 and 19 illustrate that each cell 1570 is designed to fit into an aperture 1811 of an interposer 180. In the embodiment shown, each interposer 180 includes a first set of apertures 1811*a* (see FIG. 19) arranged in a first set of aligned rows to create a first row and column configuration and a second set of apertures 1811*b* arranged in a second set of aligned rows to create second row and column configuration. In the embodiment shown, each row in the second set is disposed between two rows from the first set. For example, row 1931, which is a row of apertures 1811*b*, is disposed between rows 1930 and 1932, each of which is a row of apertures 1811*a*.

As shown in the figures, the second row and column configuration is offset from the first row and column configuration so that the apertures of the second set are aligned with each other but not aligned with the apertures of the first set, and vice-versa An interposer 180 may electromagnetically shield the electrical conductors of the printed circuit boards 120 by being fabricated either of a conductive material or of a non-conductive material coated with a conductive material.

Figure 20:
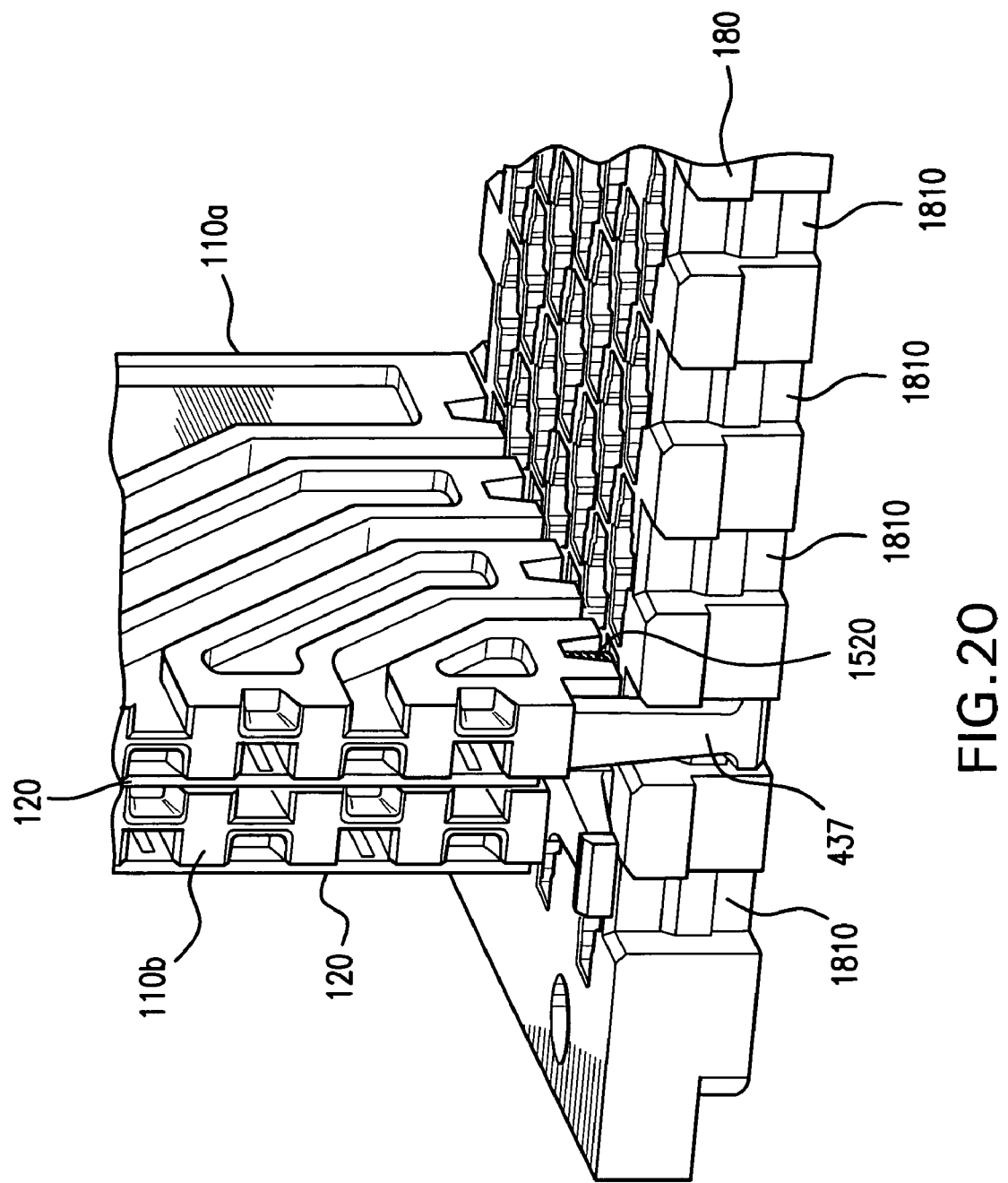

As also shown in FIGS. 18 and 19, interposers 180 include notches 1810 along a top and bottom side. Each notch 1810 is designed to receive the end of a finger of a spacer 110. Preferably, the finger snaps into a corresponding notch to firmly attach the spacer 110 to the interposer 180. This feature is illustrated in FIG. 20.

When connector 100 is fully constructed, each aperture in the first and second set receives a cell 1570. The housing 1522 of each cell 1570 has a tab 1633 arranged to fit within a slot 1888 disposed within a corresponding aperture of the interposer 180, which slot 1888 does not extend the entire length of the aperture. The tab 1633, therefore, prevents the cell 1570 from falling through the aperture. It is to be understood that the specific shape of the cells and corresponding apertures are merely for exemplary purposes. The present invention is not limited to these shapes.

Figure 21:
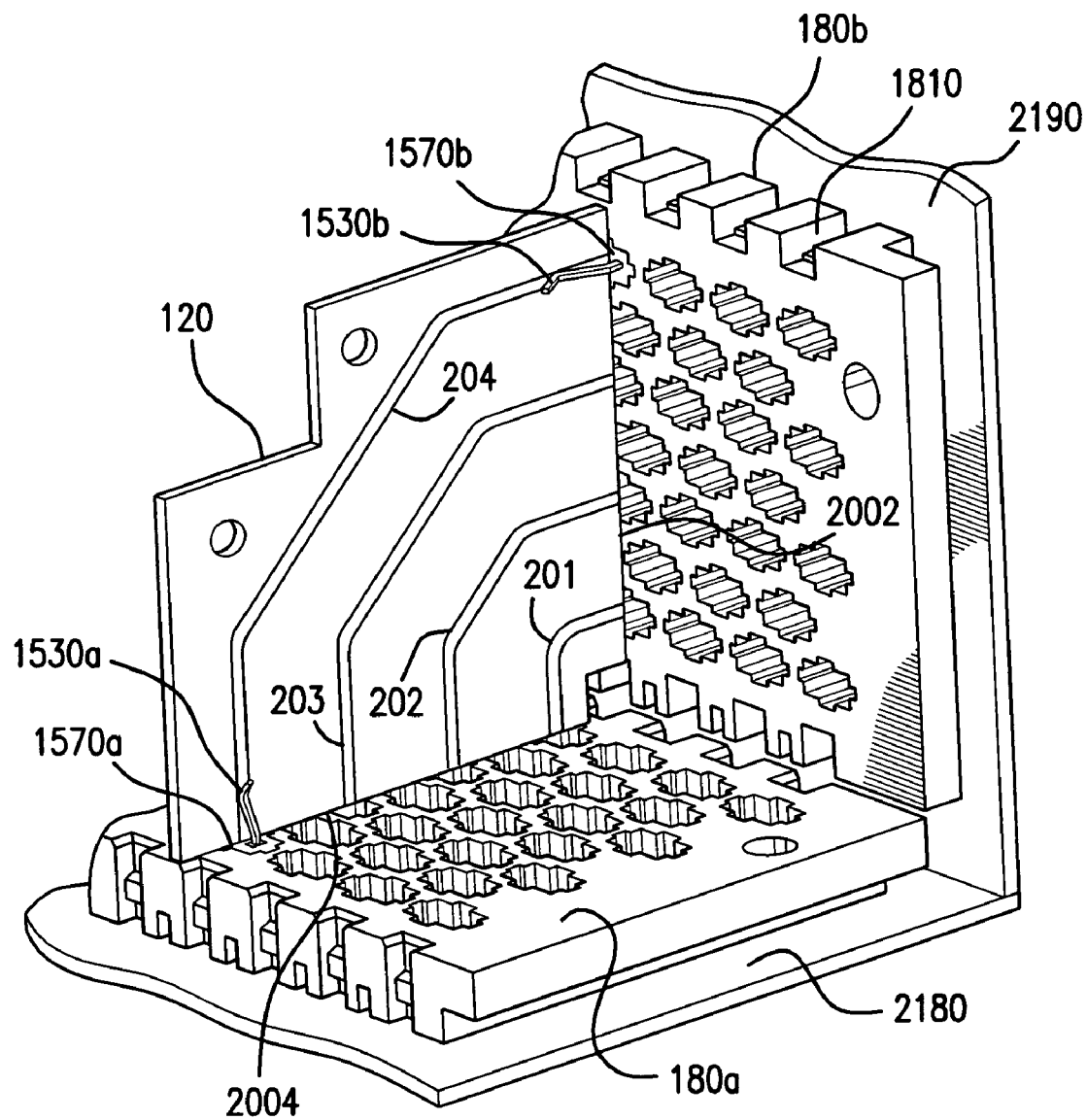

Additionally, when connector is fully constructed, the interposers are arranged so that the contact portion 1745 of each contact member 1530 contacts a corresponding conductor. FIG. 21 illustrates this concept.

FIG. 21 illustrates the arrangement of the interposers 180 in relation to board 120 and in relation to boards 2190 and 2180. The spacers 110 are not shown in the figure to illustrate that board 120 and interposers 180 are arranged so that the front side 2102 of board 120 is aligned with the center line of a column of apertures on spacer 180*b* and so that the bottom side 2104 of board 120 is aligned with the center line of a column of apertures on spacer 180*a*. FIG. 21 also shows two cells 1570, each disposed in an aperture of an interposer 180. As shown in FIG. 21, a contact member 1530 of each cell 1570 makes physical contact with a corresponding conductor.

Although not shown in FIG. 21, when connector 100 is in use, the proximal end 1641 of each contact member 1530*a,b* contacts a conducting element on a circuit board connected to connector 100. For example, end 1641 of contact member 1530*b* contacts a conducting element on circuit board 2190 and end 1641 of contact member 1530*a* contacts a conducting element on circuit board 2180. Accordingly, FIG. 21 illustrates that there is at least one electrical signal path from board 2190 to board 2180 through connector 100. This electrical signal path includes conductor 214, contact member 1530*b* and contact member 1530*a*. As is appreciated by one skilled in the art, connector 100 provides multiple electrical signal paths from board 2190 and 2180, wherein each signal path includes two contact members 1530 and a conductor on a board 120.

According to the embodiment illustrated in FIG. 21, each interposer is arranged in parallel relationship with one circuit board connected to connector 100. More specifically, interposer 180*a* is in parallel relationship with circuit board 2180 and interposer 180*b* is in parallel relationship with circuit board 2190. Accordingly, one face of interposer 180*a* faces board 2180 and one face of interposer 180*b* faces board 2190.

Figure 22:
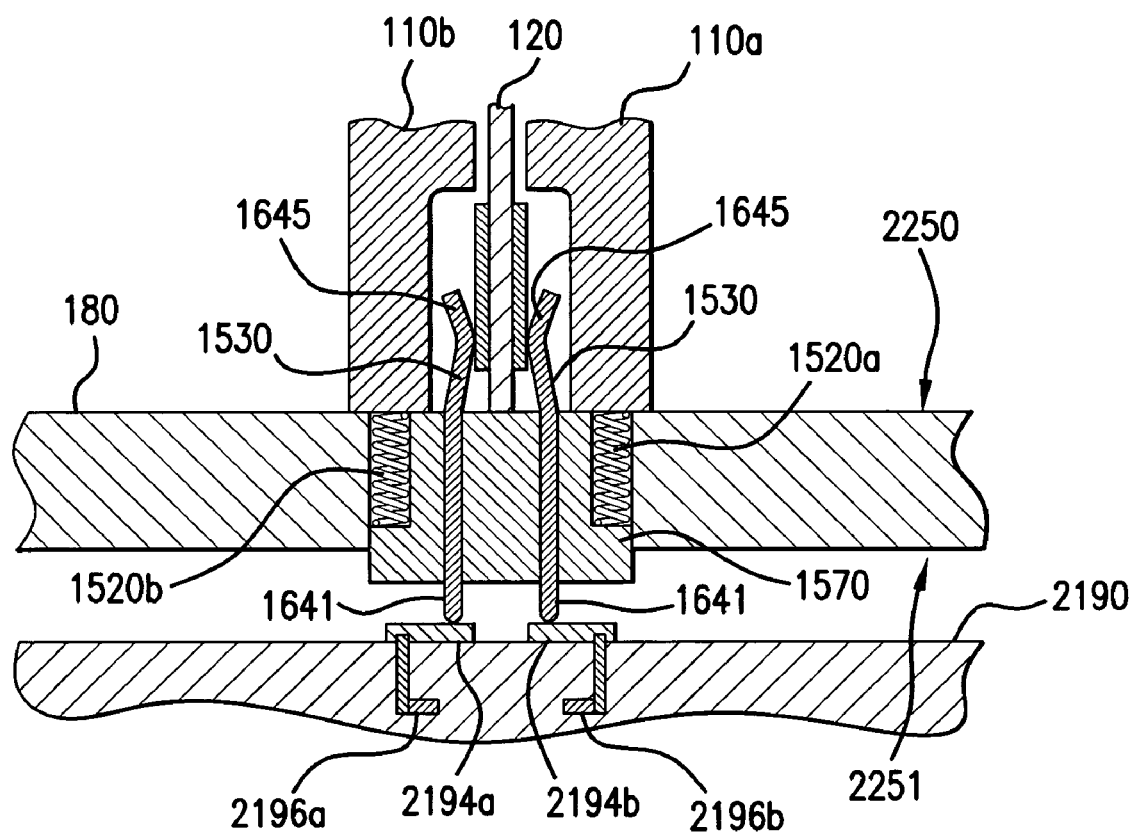

Referring now to FIG. 22, FIG. 22 is a cross-sectional view of the connector 100 and shows that when connector 100 is in use, as described above, each proximal end 1641 of each contact member 1530 contacts a conducting element 2194 on circuit board 2190. In a preferred embodiment, each conducting element 2194 is a signal pad, and not a via. Accordingly, in a preferred embodiment, connector 100 is a compression mount connector because each proximal end 1641 merely presses against the circuit board and is not inserted into a via in the circuit board. However, in other embodiments, each element 2194 may be a via or other electrically conducting element.

In a preferred embodiment, the board 2190 includes a differential signal path that includes a first signal path 2196*a* (e.g., a first trace) and a second signal path 2196*b* (e.g., a second trace). As shown, the first pad 2194 is connected to the first signal path 2196*a* and the second conducting element 2194*b* is connected to the first signal path 2196*b*. It should be noted that the second circuit board 2180 may also have a pair of conducting elements, like elements 2194, electrically connected to a pair of signal paths, like paths 2196.

As shown in FIG. 22, a cell 1570 is inserted into an aperture of interposer 180. As further shown, the distal end of each contact member 1530 of cell 1570 extends beyond the upper face 2250 of the interposer and the proximal end 1641 of each contact member 1530 extends beyond the bottom face 2251 of the interposer, which faces board 2190 and is generally parallel thereto. Each proximal end 1641 presses against a conducting element 2194 on board 2190. Likewise, each contact portion 1745 of contact member 1530 presses against a conductor on board 120. Thus, a contact member 1530 electrically connects a conductor on board 120 with a conducting element 2194 on board 2190. As illustrated in FIG. 22, the ends of the conductors on board 120 are near the upper face 2250 of interposer.

When end 1641 of a contact member 1530 presses against a corresponding element 2194*a* normal force caused by the element is exerted on the contact member. Because the contact member 1530 is held firmly within housing 1570, the normal force will cause housing 1522 to move in the direction of the normal force (i.e., away from the circuit board 2190). However, springs 1520 limit how far housing 1522 will move away from board 2190 because when the housing 1522 moves away from board 2190, springs 1520 will compress and exert a force on the housing in a direction that is opposite of the direction of the normal force caused by board 2190. This is so because the distal ends of the springs abut a surface of a spacer 110 and the spacer is firmly attached to the interposer 180, which itself does not move relative to the board 2190. Thus, springs 1502 will compress and exert a force on housing in a direction opposite the normal force.

Referring back to FIG. 1, each spacer 110 may be configured to attach to an elongate backbone 150. Additionally, connector 100 may include two end caps 100*a* and 100*b*, each of which is designed to attach to a respective end of backbone 150. The backbone 150 and end caps 100 are discussed below.

Figure 23:
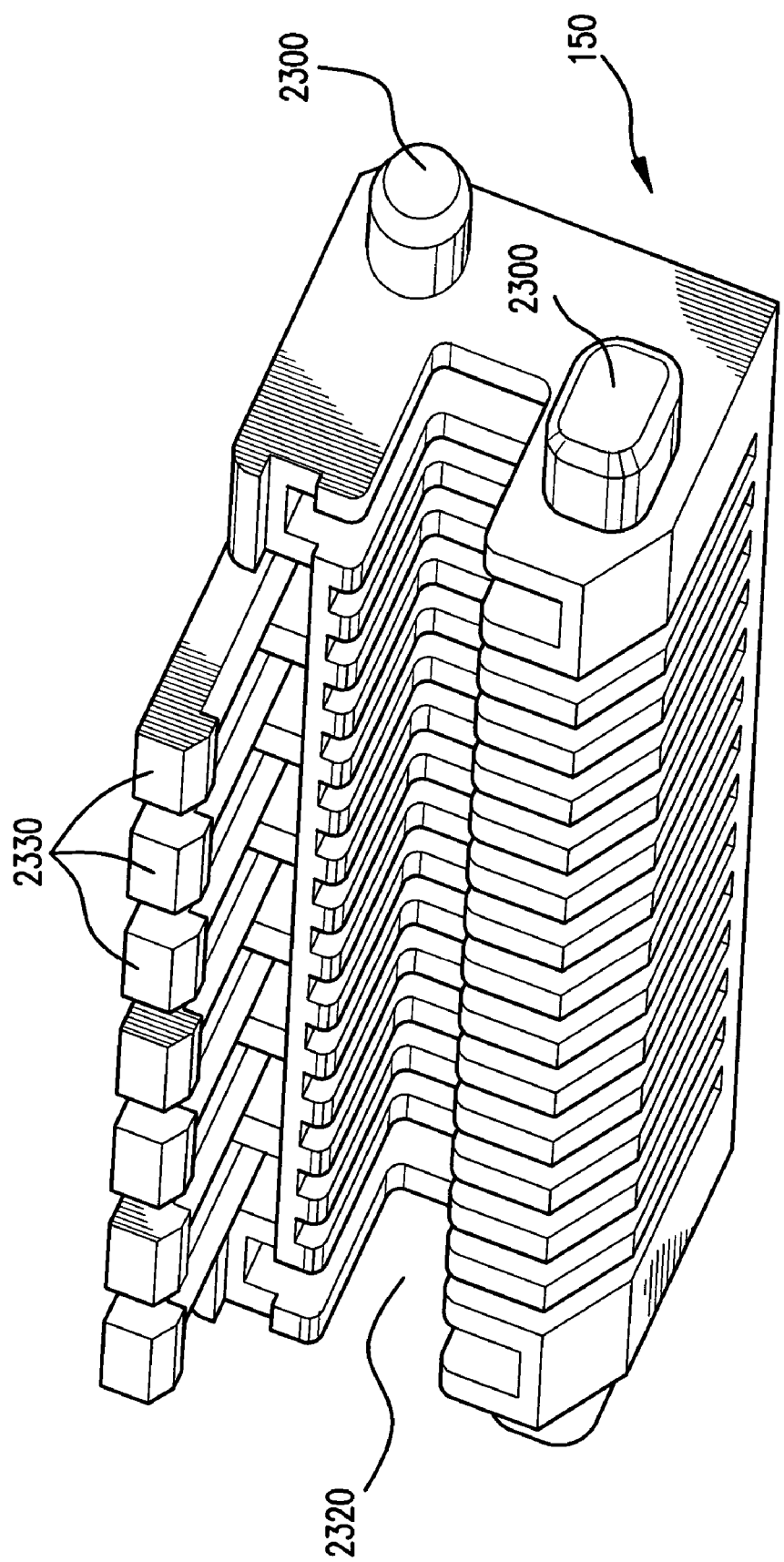
Figure 27:
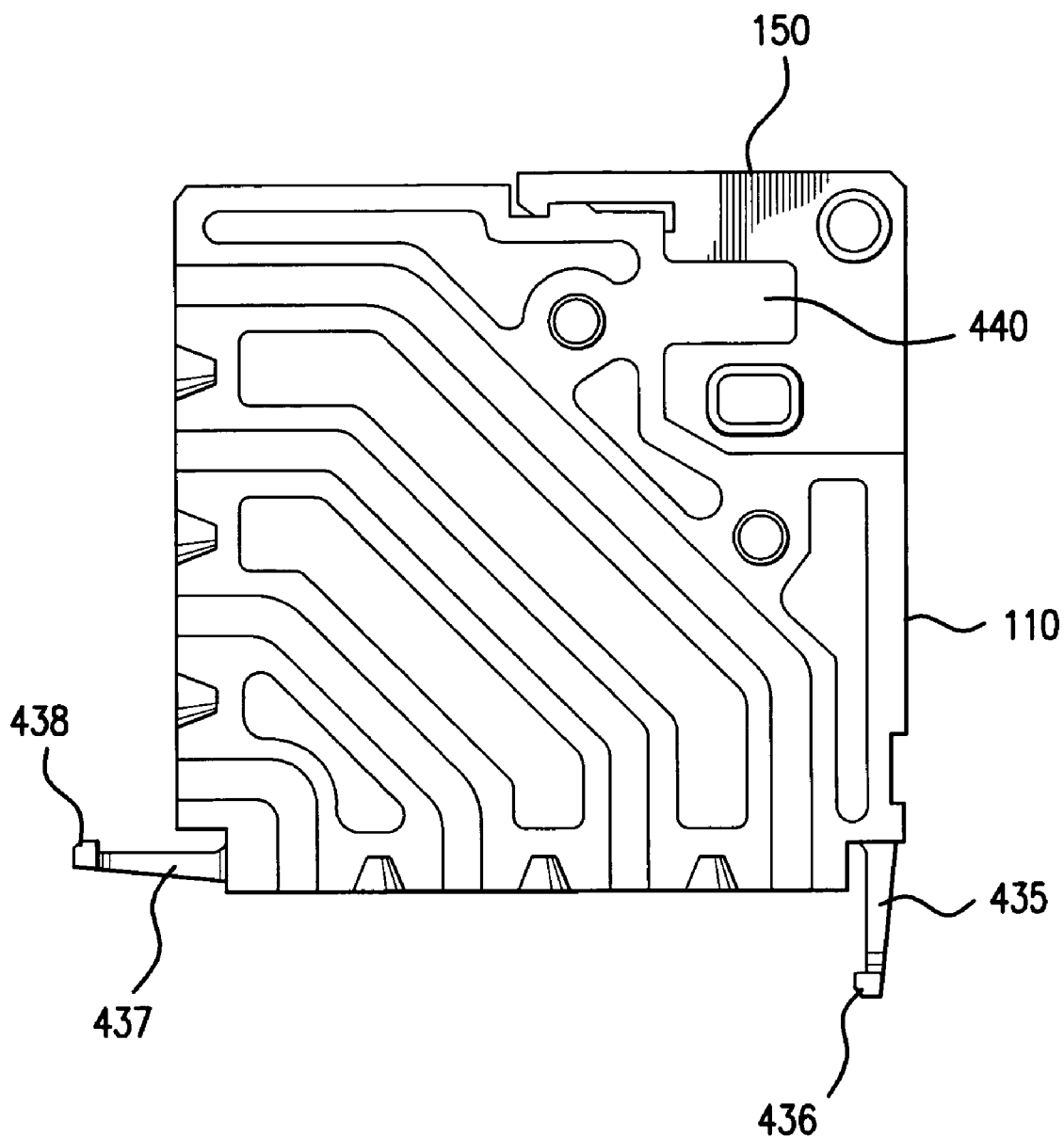

Referring to FIG. 23, FIG. 23 illustrates an embodiment of backbone 150. Backbone 150, according to the embodiment shown, includes bosses 2300 arranged to mate with the end caps 100 as well as slots 2320, each arranged to receive finger 440 of a spacer 110, as shown in FIG. 27. Backbone 150 may further include tines 2330 arranged to mate with the spacers 110.

Figure 24:
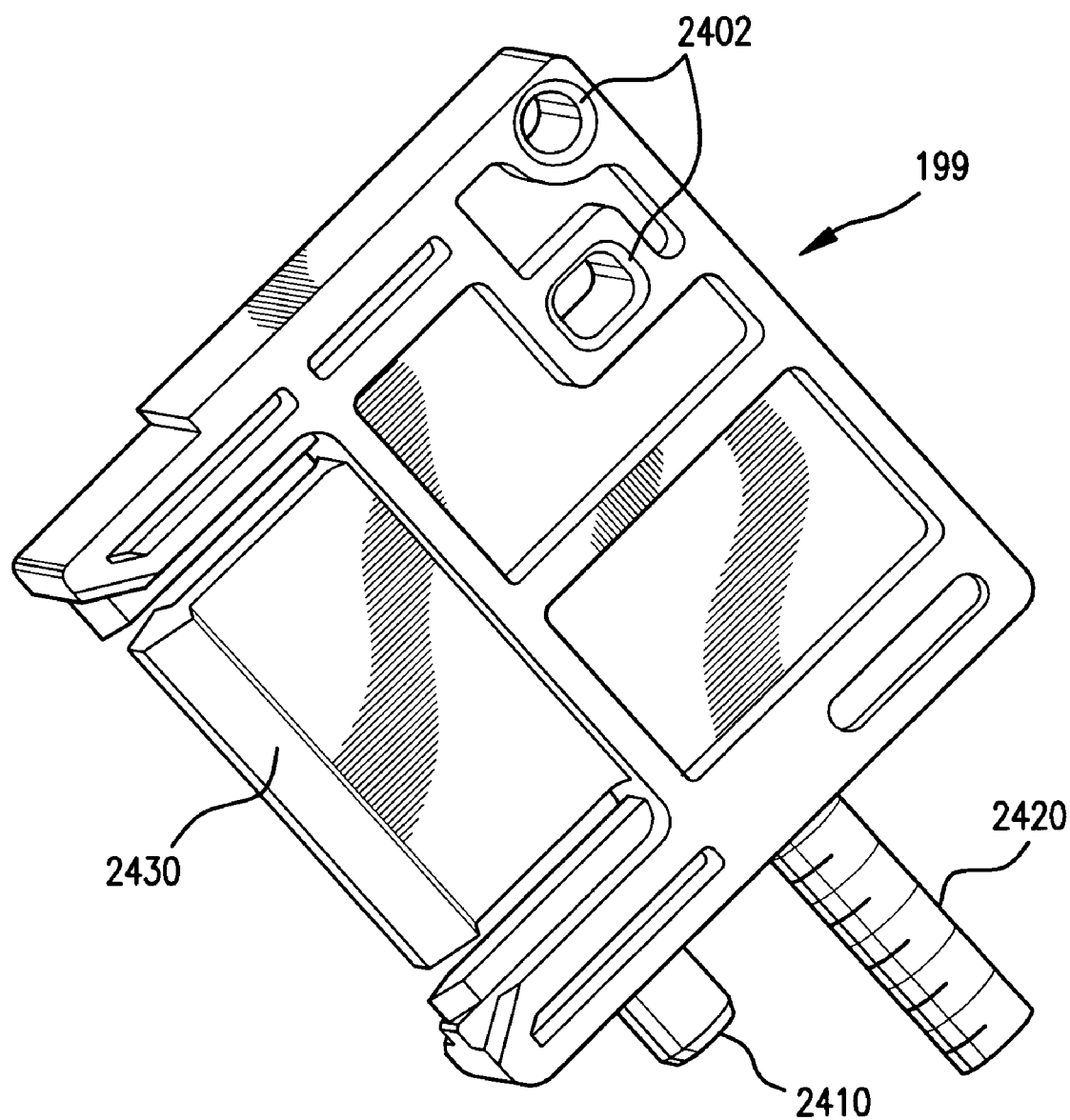

Referring to FIG. 24, FIG. 24 illustrates an embodiment of an end cap 199. End cap 199, according to the embodiment shown, includes apertures 2402 arranged to mate with bosses disposed on adjacent spacers as well as bosses 2300 disposed on the backbone 150. The end cap 199 further includes both a screw 2420 and a pin 2410 arranged to mechanically interface connector 100 with a circuit board, which may have a large number of layers, for example, more than 30 layers, as well as a tongue 2430 arranged to mate with an end plate 191b (see FIGS. 1 and 25).

While the end cap 199 is illustrated as being symmetrical, that is, can be used on either end of connector 100, separate left and right-handed end caps may also be used. The screw 2420 and pin 2410 of the end cap 199 may be integrally formed with the end cap 199 or may be attached thereto after fabrication of the end cap 199. It has been found that it is often necessary to utilize a metal rather than a plastic screw 2420 in view of the mechanical stresses involved. It is understood that the present invention is not limited to the use of a screw 2420 and pin 2410 but rather other fastening means may also be used.

As noted previously, both the end caps 100 and spacers 110 can be fabricated of an insulative material, such as a plastic, covered with a conductive material to provide electromagnetic shielding or can be fabricated entirely of a conductive material, such as a metal.

Figure 25:
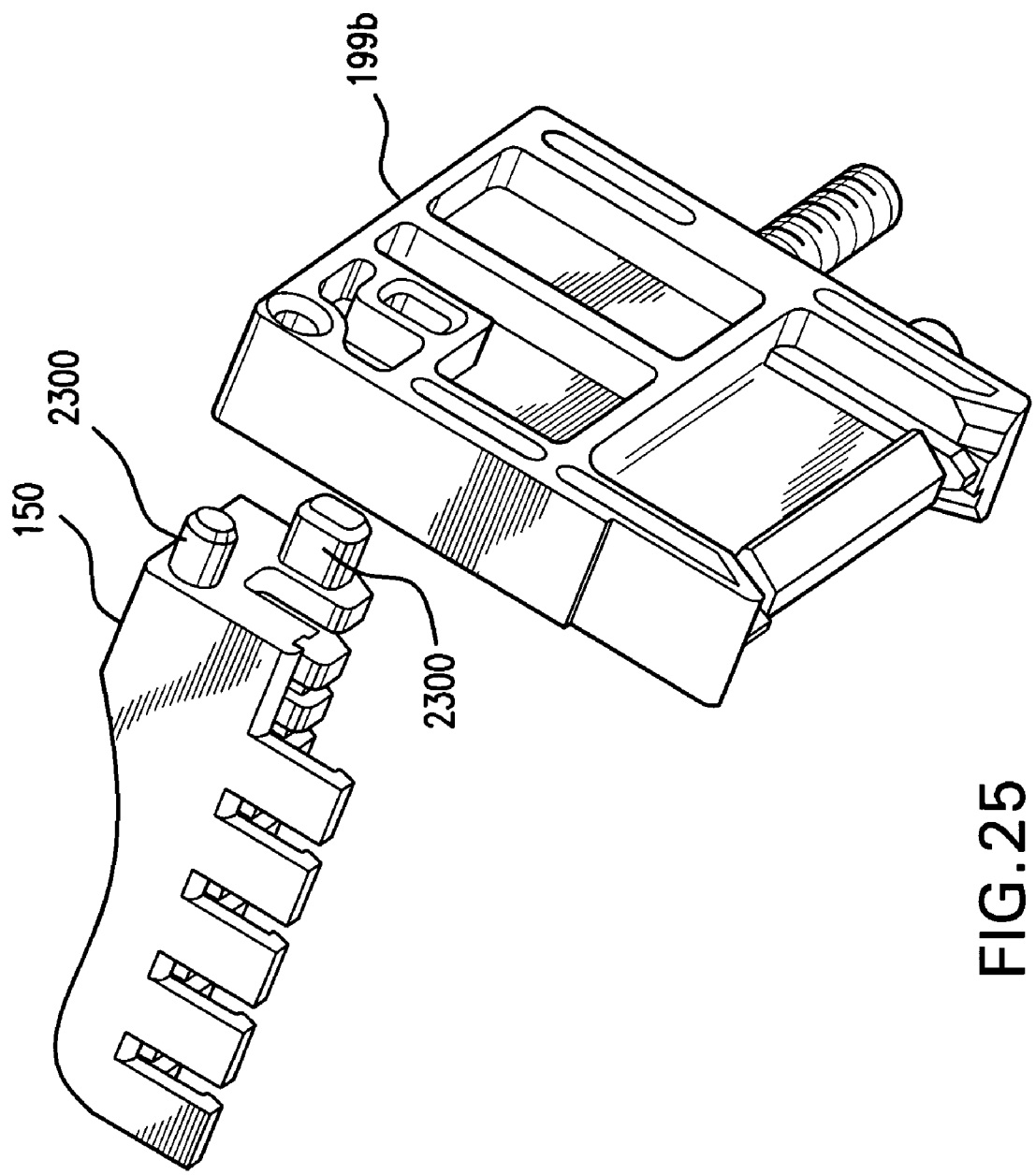
Figure 26:
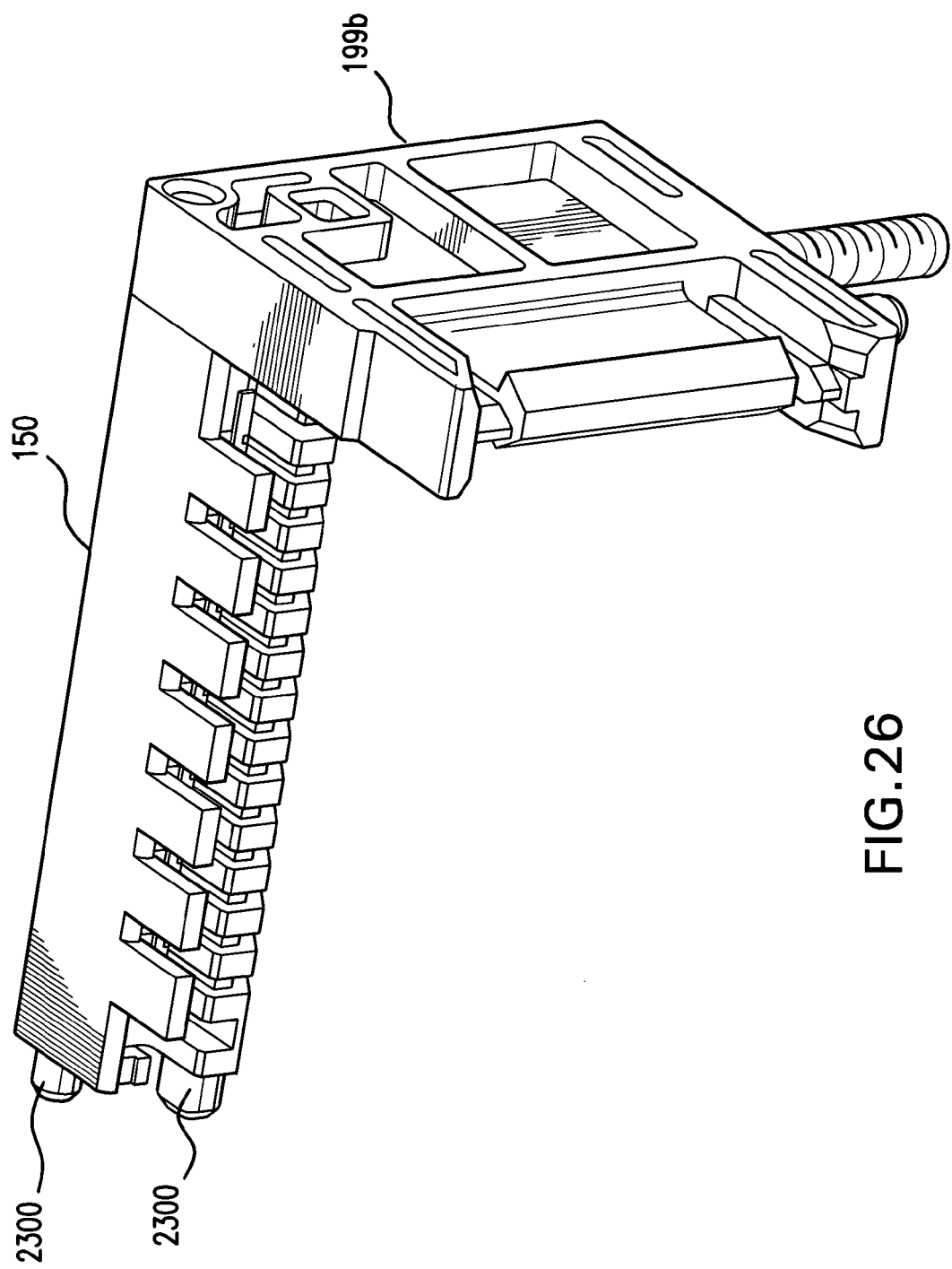

FIG. 25 is an exploded view of backbone 150 and an end cap 199 and FIG. 26 is a view of a backbone 150 and an end cap 199 assembled together.

Referring to FIGS. 25 and 26, the bosses 2300 of the backbone 150 are disposed within corresponding apertures 2402 in the end caps 100 forming a rigid structure. The use of bosses 2300 and apertures 2402 is for exemplary purposes and the present invention is not limited thereto. That is, other fastening means can be used to mechanically connect the backbone 150 to the end caps 100.

Furthermore, as shown in FIG. 27, a combination of fingers 440 and mating slots are used to mechanically connect the spacers 110 to the backbone 150. The illustrated combination is for exemplary purposes and the present invention is not limited thereto. In a similar fashion, as discussed above, the fingers 435, 437, 835, 837 of the spacers 110 are arranged to mate with corresponding slots in the interposer 180. The illustrated combination of fingers and slots is for exemplary purposes and the present invention is not limited thereto.

Referring back to FIG. 1, FIG. 1 shows that connector 100 may also include a two mounting clips 190a and 190b and a shield 160. Mounting clips 190 and shield 160 are combined with the above described parts of the connector 100 to form a composite arrangement. The mounting clip 190 and shield 160 may be electrically conductive so as to electromagnetically shield the signal carrying elements of connector 100. The mounting clip 190 and shield 160 will be discussed in detail below.

Figure 28:
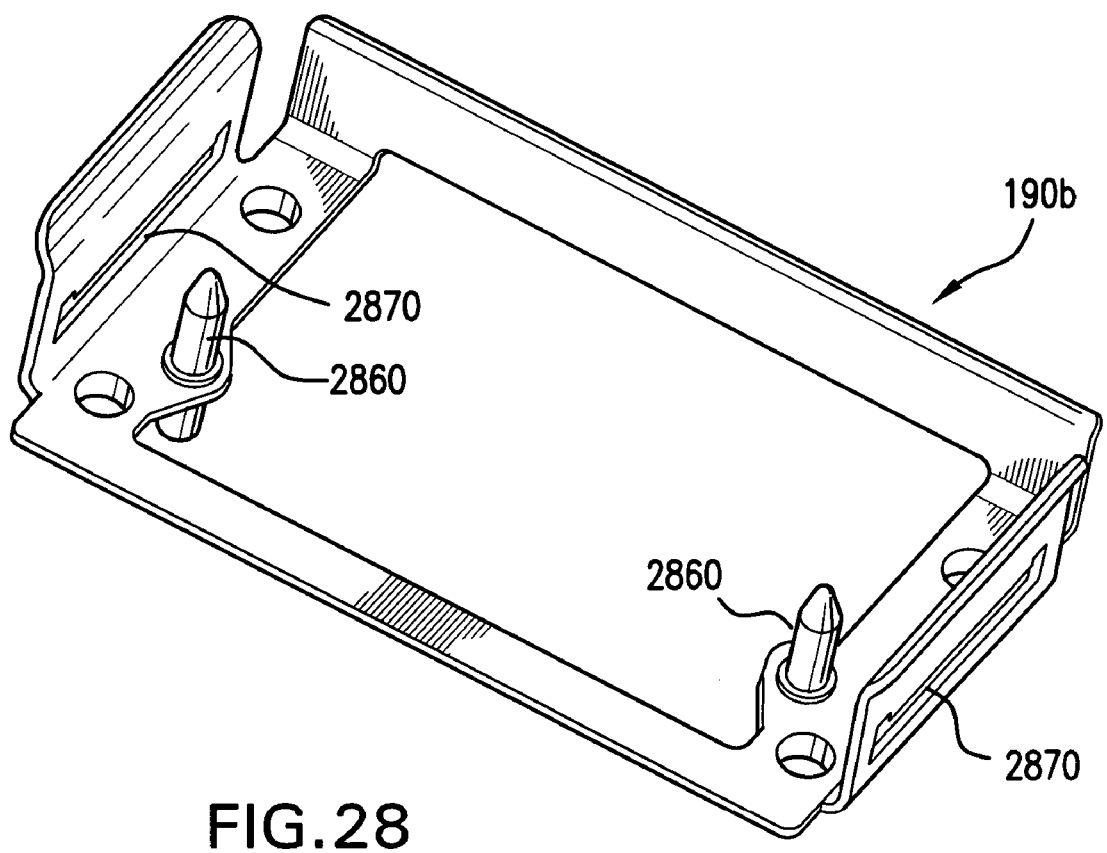

FIG. 28 illustrates an embodiment of mounting clip 190b. Mounting clip 190b, according to the embodiment shown, includes: (a) pins 2860 arranged to mate with a hole in a circuit board (e.g., board 2190 or 2180) and (b) slots 2870 arranged to receive the tongues and 2430 of the end caps 100. Pins 2860 function to connect clip 190b to a circuit board by mating with the circuit board holes mentioned above. Pins 2860 may be electrically conducting and may electrically and physically connect to a ground plane of the circuit board to which it is connected.

Figure 29:
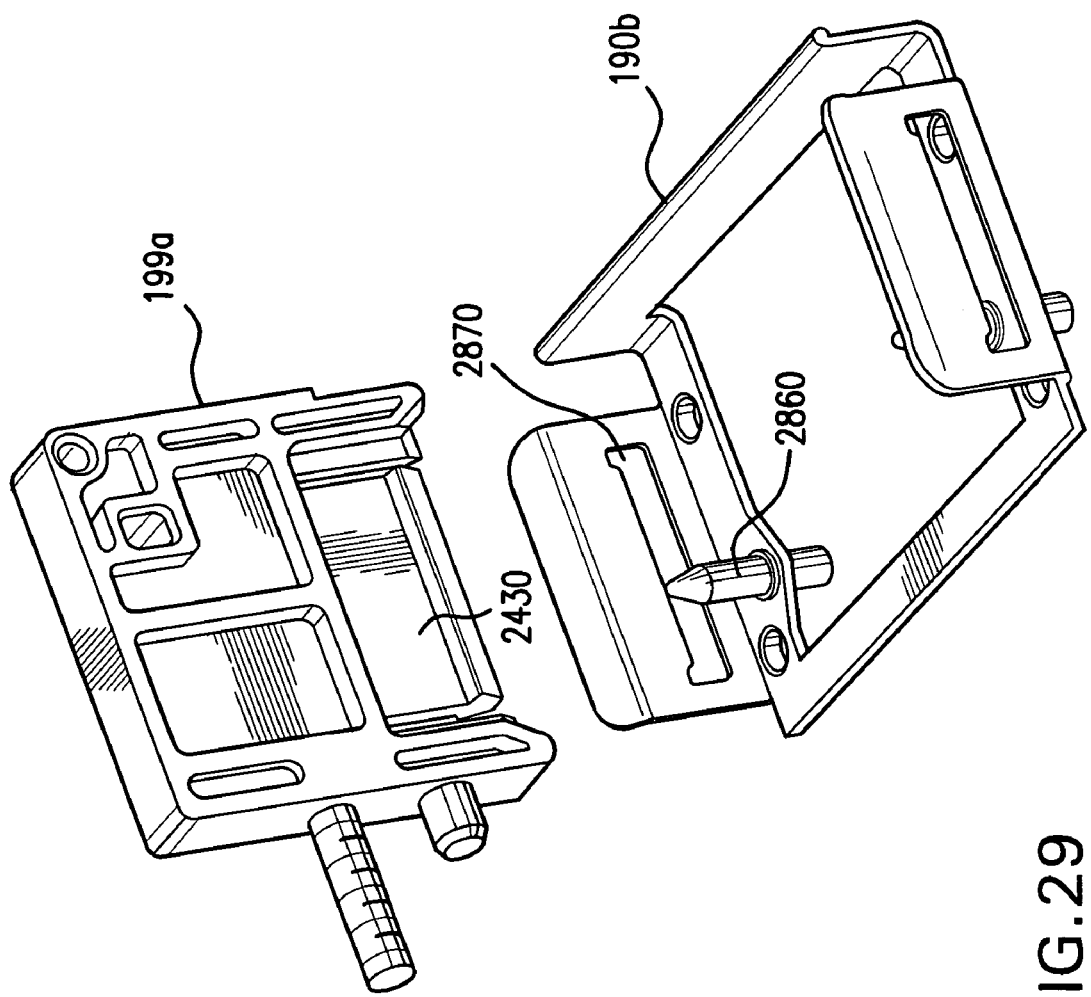
Figure 30:
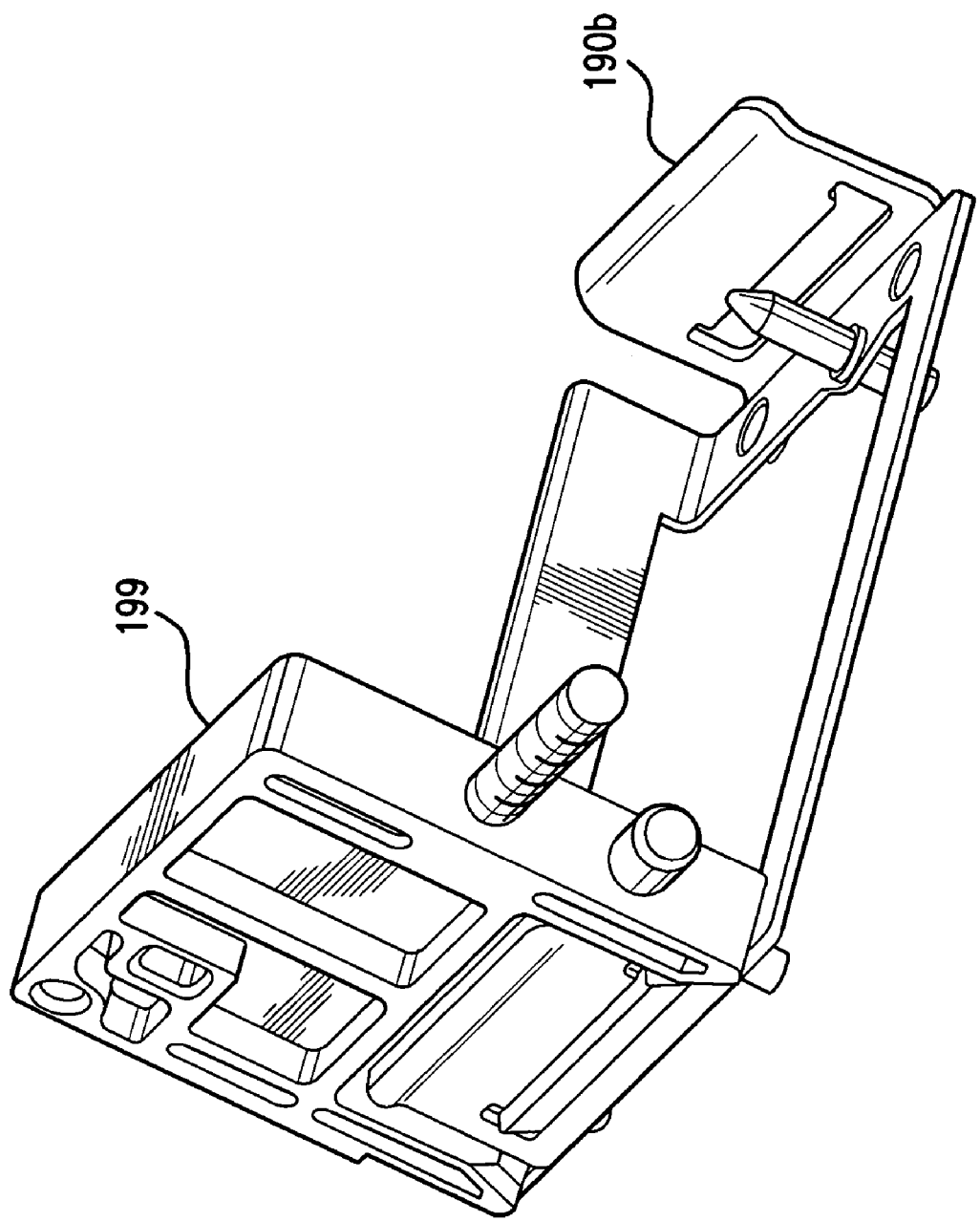

FIG. 29 is an exploded view of clip 190b and end cap 199 and FIG. 30 is a view of clip 190b having an end cap 199 attached thereto. As shown in FIG. 30, tongue 2430 of end cap 199 is arranged to mate with a corresponding slot 2870 in clip 190b. As with the other illustrated fastening means, the present invention is not limited to the use of a tongue and corresponding slot.

Figure 31:
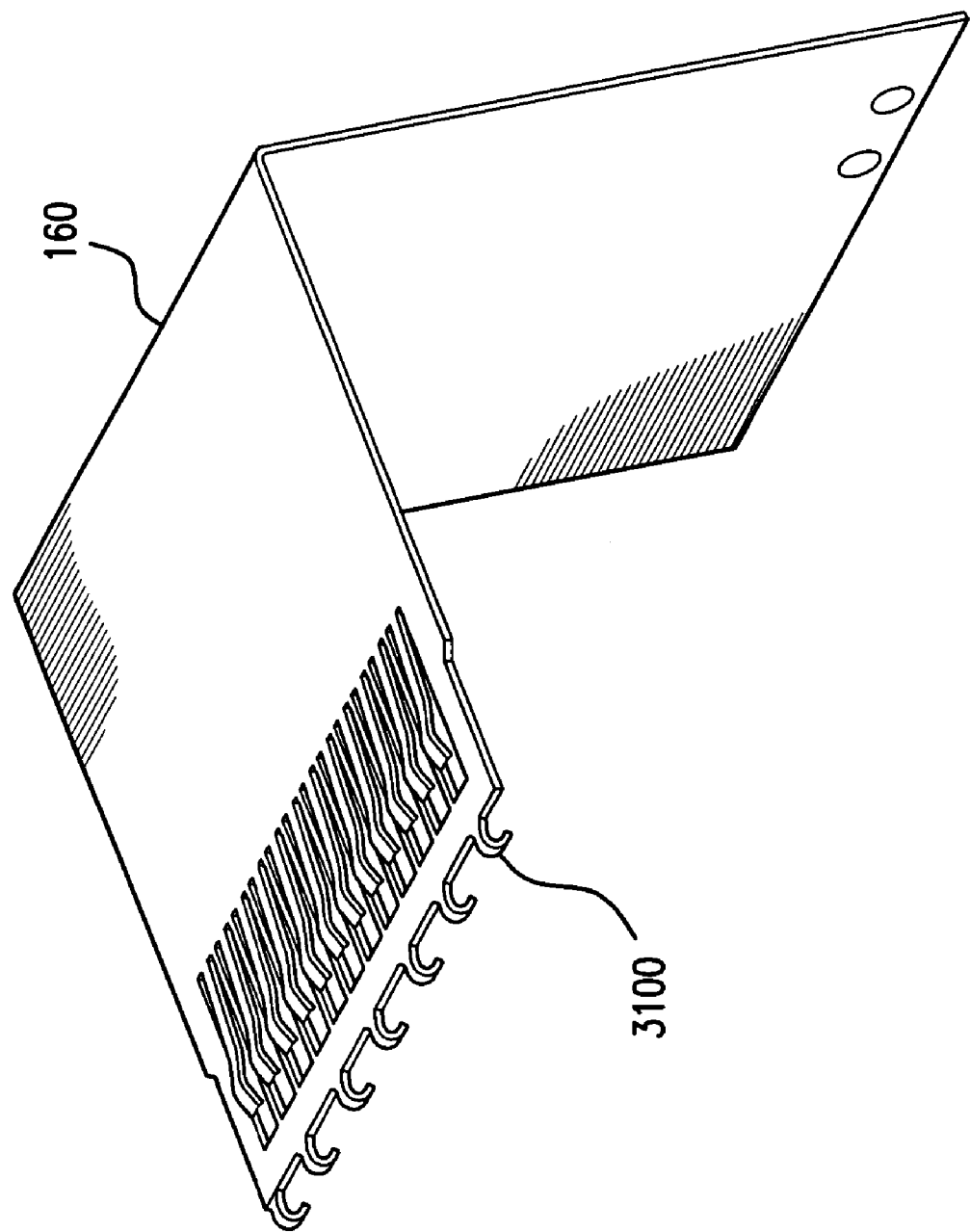
Figure 32:
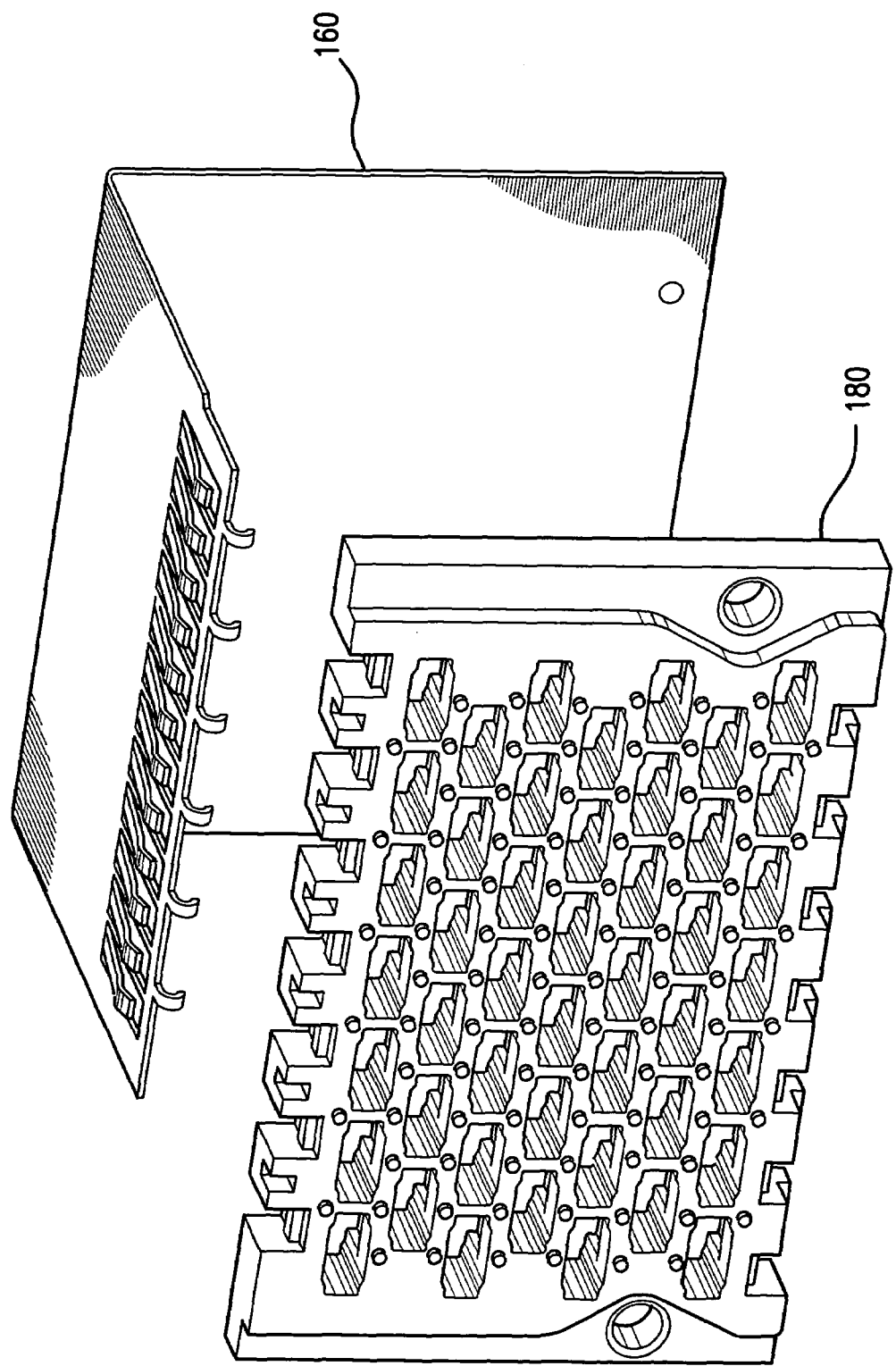
Figure 33:
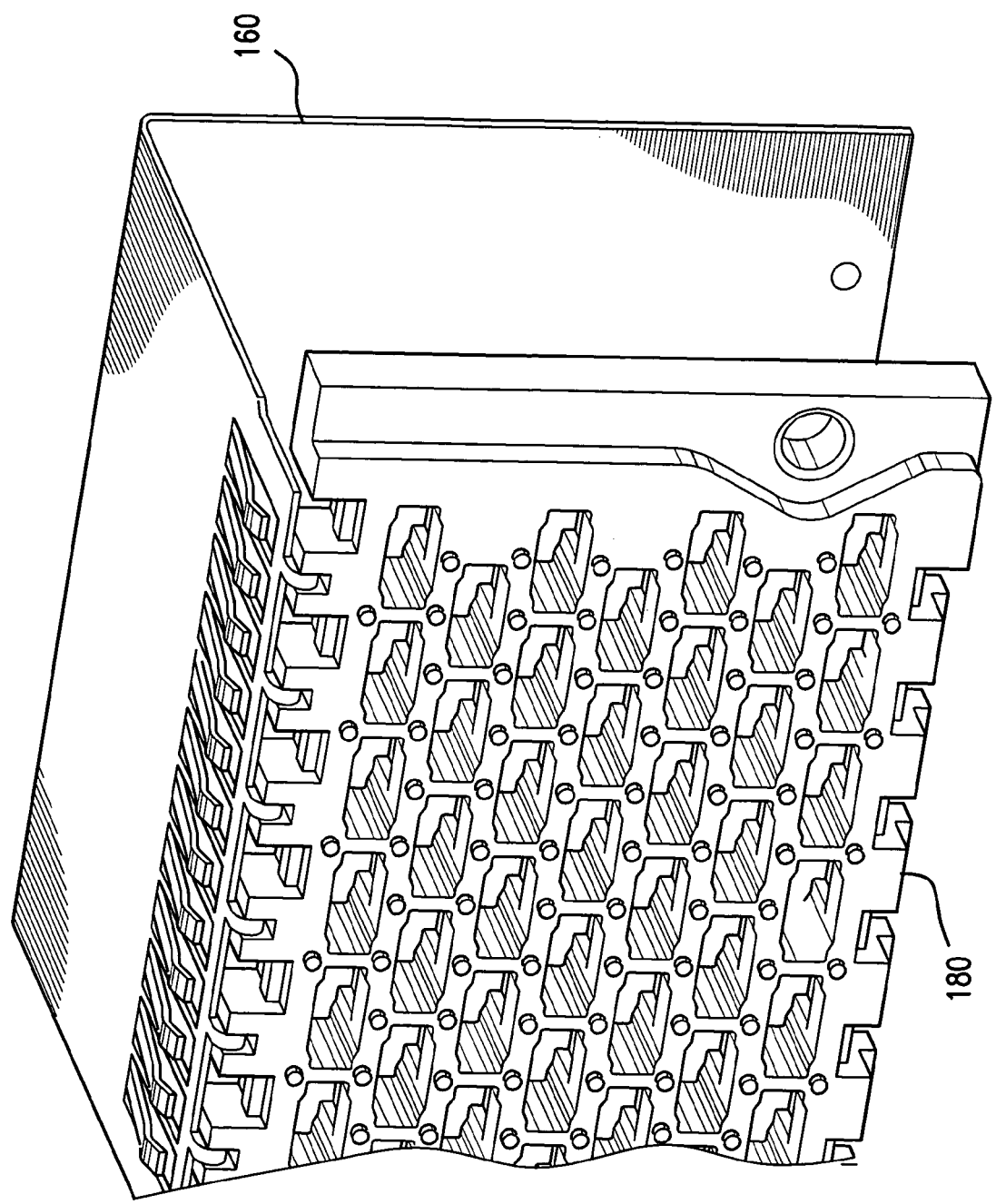

Referring now to FIG. 31, FIG. 31 illustrates an embodiment of shield 160. Shield 160, according to the embodiment shown, includes hooks 3100 arranged to fit in slots in an interposer 180. FIG. 32 is an exploded view of shield 160 and an interposer 180. FIG. 33 is a view of shield 160 being connected to an interposer 180. FIG. 33 illustrates how the hooks 3100 of shield 160 snap into slots in interposer 180, thereby mechanically connecting the two.

Figure 34:
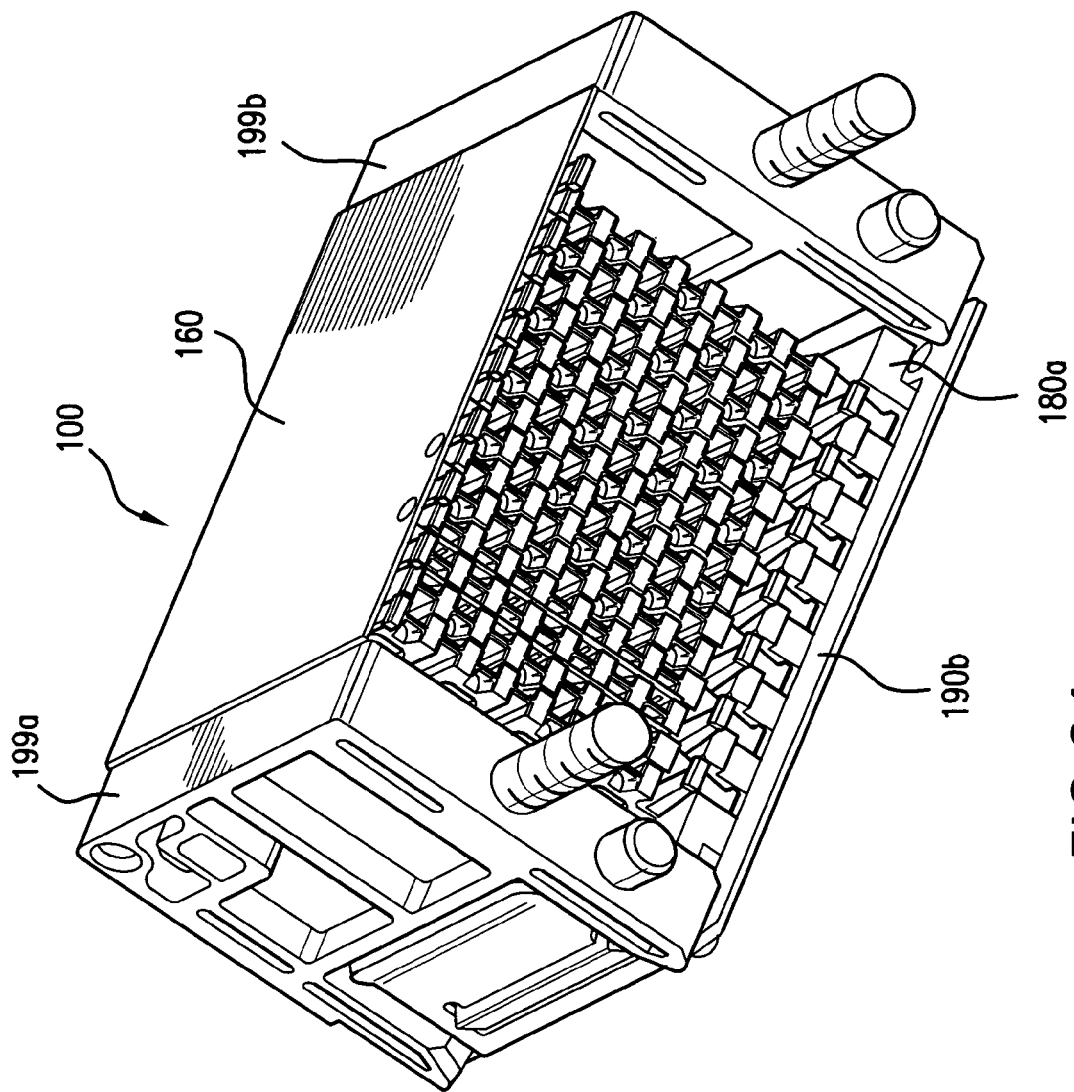
Figure 35:
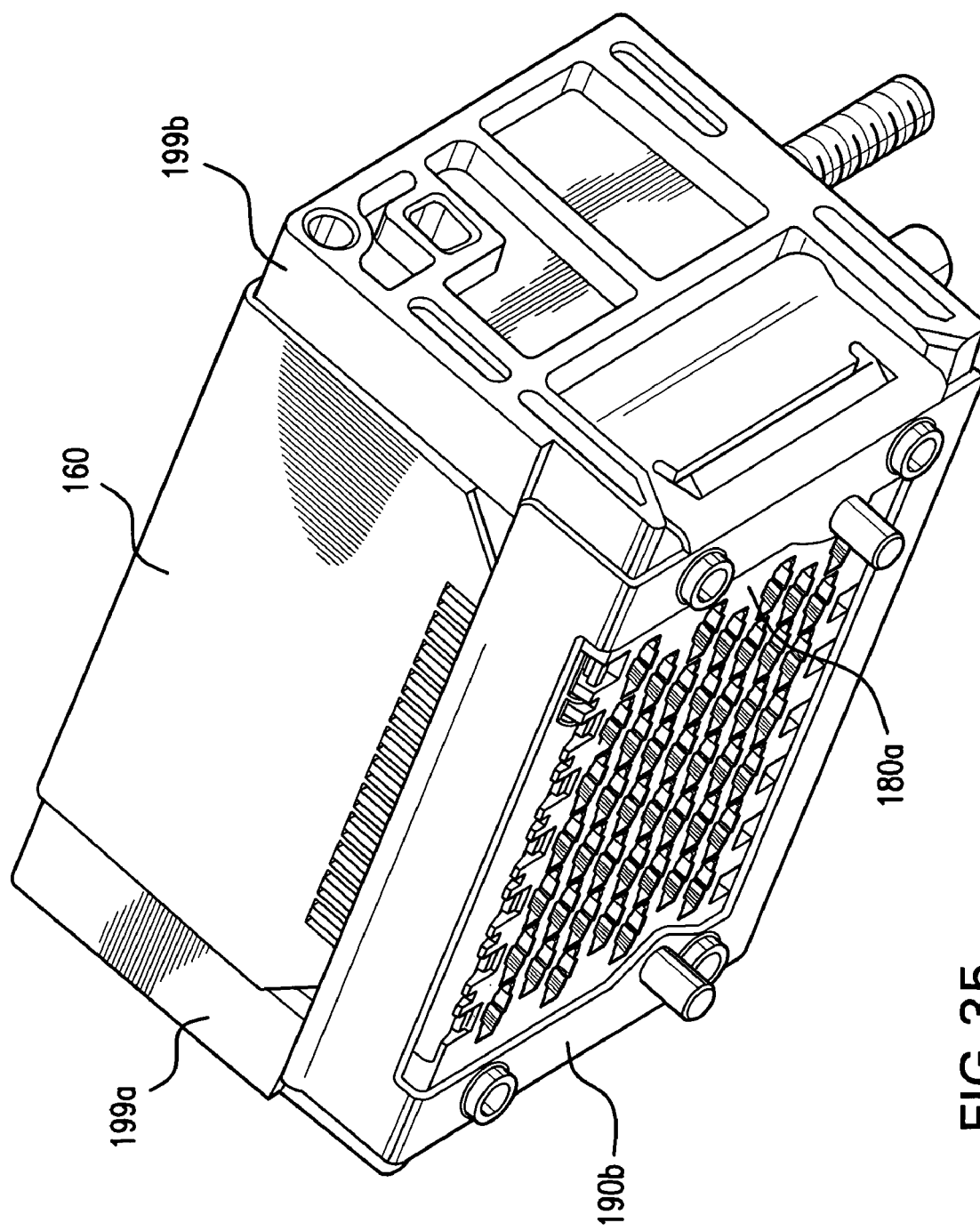
Figure 36:
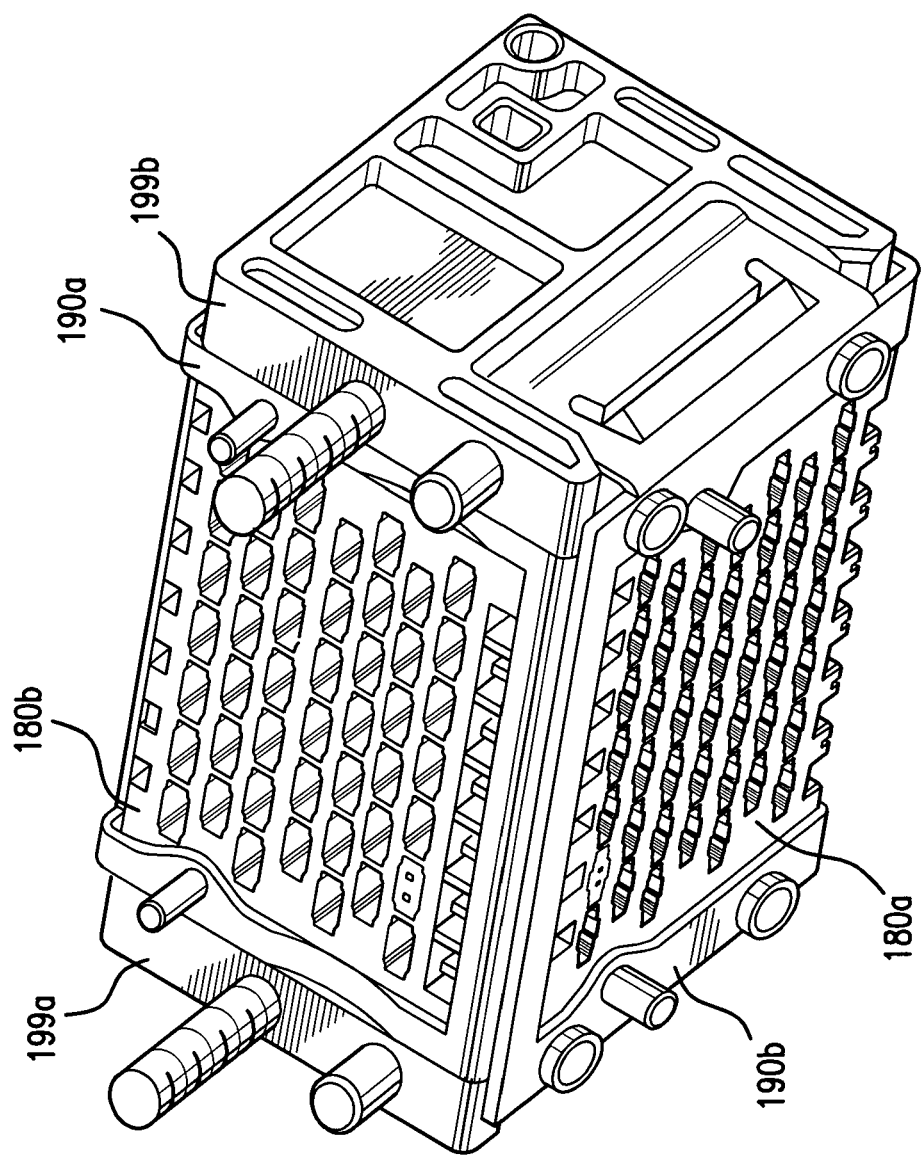

FIG. 34 is a view of an assembled connector with an interposer 180 and clip 190a omitted. FIGS. 35 and 36 are different views of a fully assembled connector 100 according to one embodiment. Referring to FIG. 35, FIG. 35 shows end caps 199a and 199b, shield 160, interposer 180a and clip 190b.

Referring to FIGS. 36, FIG. 36 shows end caps 199a and 199b, interposers 180a and 180b, and clips 190a and 190b. The clip 190a may be attached to the overall assembly by any usual fastening means and can include pins or other fastening means to attach the assembled connector 100 to a daughtercard, for example.

The additional interposer 180b and additional clip 190a may be identical to the interposer 180a and end plate 190b or can be different (or not present at all), depending upon the application of the interconnection system assembly.

While the two interposers 180 have been illustrated as being perpendicular to each other, the present invention is not limited thereto. That is, for some applications, the planes of the two interposers 180 can be at a 45-degree angle or other angle, for example. Thus, connector 100 need not be a "right-angle" connector.

As can be seen from FIGS. 34–36, the entire interconnection system assembly attaches together to form a rigid structure in which the electrical conductors on the printed circuit boards 120 may be entirely electromagnetically shielded.

Part 2: Embodiments Related to, E.G., Complaint Pin Connectors and the like:

FIGS. 37–46 show some additional preferred embodiments of the invention. Among other things, the, the embodiments shown in FIGS. 37–46 are generally similar to embodiments described herein-above and have similar commercial applications thereto. However, the embodiments shown in FIGS. 37–46 preferably include a 2-piece connector having compliant pin connections.

The components depicted in FIGS. 37–46 can be employed within a modified connector 100 that is general similar to that of any of the embodiments described above with reference to FIGS. 1–36. As with the embodiments described above, a modified connector 100 preferably includes: two interposers 180-C having arrays of apertures; cells 122-C inserted into the apertures of the interposers; at least one printed circuit board 120-C having electrical conductors thereon (e.g., printed or otherwise formed thereon); and a plurality of spacers 110-C (such as, e.g., spacers 110a-C and 110b-C shown). In addition, in some illustrative embodiments, the modified connector also includes a supporting, enclosing and/or the like structure for the maintaining components described with reference to FIGS. 37–46, such as, e.g., in some illustrative and non-limiting embodiments, one or more, preferably all of the following can be employed: a pair of end-caps (see, e.g., herein-above; not shown in FIGS. 37–46); a backbone (see, e.g., herein-above; not shown in FIGS. 37–46); a shield (see, e.g., herein-above; not shown in FIGS. 37–46); and a pair of endplates (see, e.g., herein-above; not shown in FIGS. 37–46). As with embodiments described above, one skilled in the art will appreciate that in typical configurations, a modified connector 100 will include a number of circuit boards and spacers.

However, while the most preferred embodiments of the compression mount versions described above involve a 1-piece type of connector, the most preferred embodiments of the press-fit mounted versions involve a 2-piece type of connector. In this regard, for conventional 2-piece connectors one connector half is typically affixed to a motherboard as a permanent or semi-permanent fixture (such as, e.g., usually through some form of press-fit method of attachment) and a second connector half of the connector is attached to the daughtercard, again using some kind of press-fit arrangement. The motherboard half (the "header") mates with the daughtercard half (the "socket") when the daughtercard is slid into the card cage.

In contrast to 1-piece connectors wherein, the complete connector may be, e.g., fixed to a daughtercard, in the preferred 2-piece embodiments described below, the components are preferably mounted as follows. First, both interposers are pre-assembled with cells 122-C. Then, a first interposer 180-C is assembled to the connector body (including, e.g., the printed circuit boards 120-C and spacers 110-C), such as, e.g., being screwed, snapped, and/or in some other way permanently or semi-permanently affixed to the connector body. Then, this assembly is press-fit onto the daughter card (such as, e.g., in a similar manner to a conventional 2-piece connector socket). On the other hand, a second interposer is mounted directly to the motherboard (such as, e.g., in a similar manner to a header of conventional 2-piece connector). Then, connection between the two connector halves is made when the daughtercard is slid into a card cage and the two connector halves are connected together (NB: as described in further detail below, when the two connector halves are connected together, slots within the cells 122-C preferably help to guide the printed circuit boards 120-C into place). Preferably, to have the daughter-card-side interposer permanently or semi-permanently affixed to the connector body, a latching mechanism is provided to connect the first interposer to the connector body. However, in preferred embodiments, the daughtercard can be unplugged from the motherboard when necessary, and no no latching mechanism is provided between this second interposer and the connector body.

Figure 39:
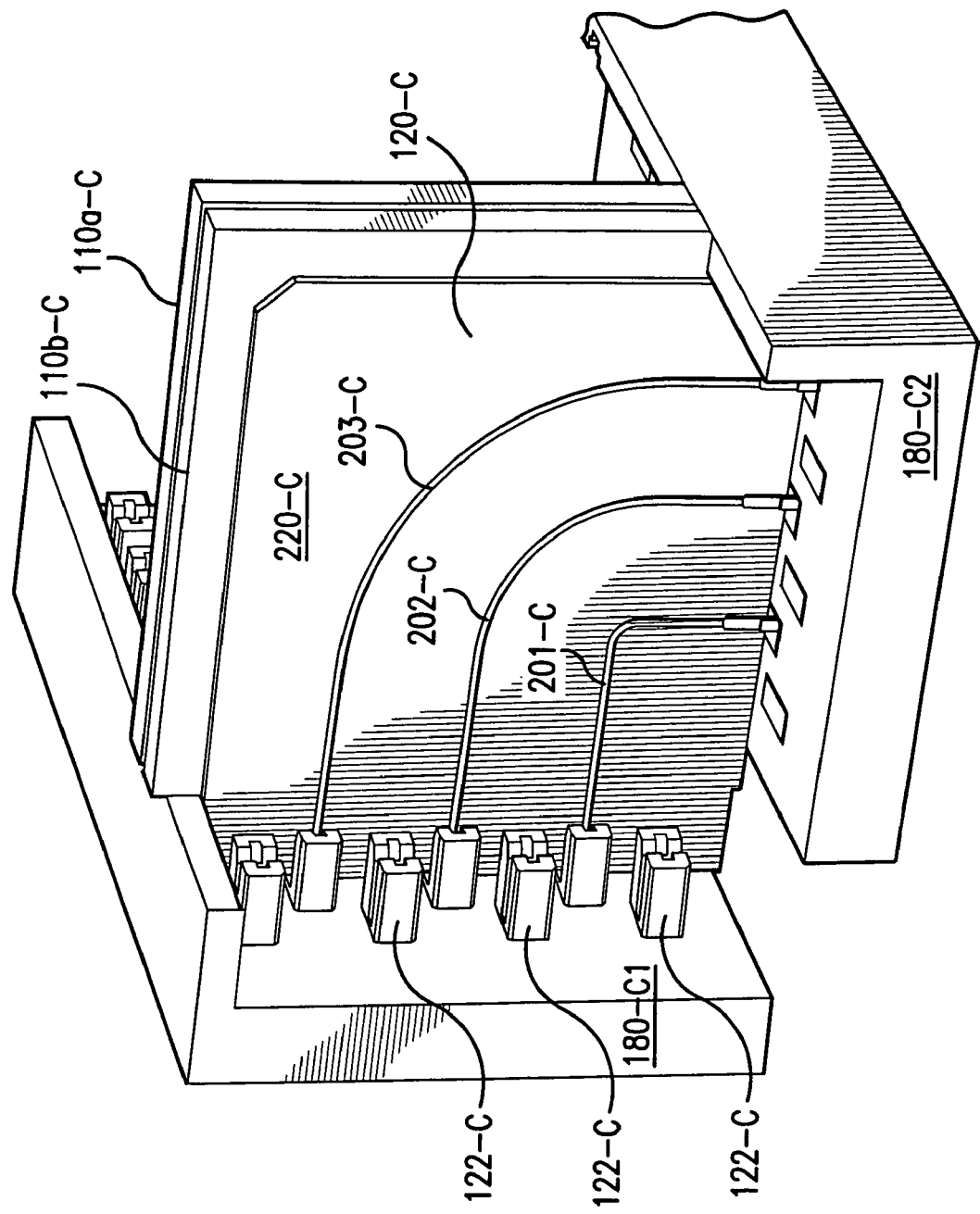

FIG. 39 is a perspective side view that shows, inter alia, a printed circuit board 120-C. In the embodiment shown, circuit board 120-C is generally rectangular in shape. As shown, circuit board 120-C may have one or more electrical conductors disposed on a face 220-C thereof. In the embodiment shown, board 120-C has three conductors 201-C, 202-C, 203-C, and 204-C disposed on the face 220-C. Each conductor 201-C to 204-C has a first end, a second end and an interim section between the first and second ends. As with the previously described conductors, the first end of each conductor is located at a point on or adjacent a first edge of the face 220-C and the second end of each conductor is located at a point on or adjacent a second edge of face 220-C. As with the foregoing embodiments, while the configurations may be varied as desired based on circumstances, in many embodiments, the second edge of the face 220-C is generally perpendicular to the first edge, as shown.

Figure 42:
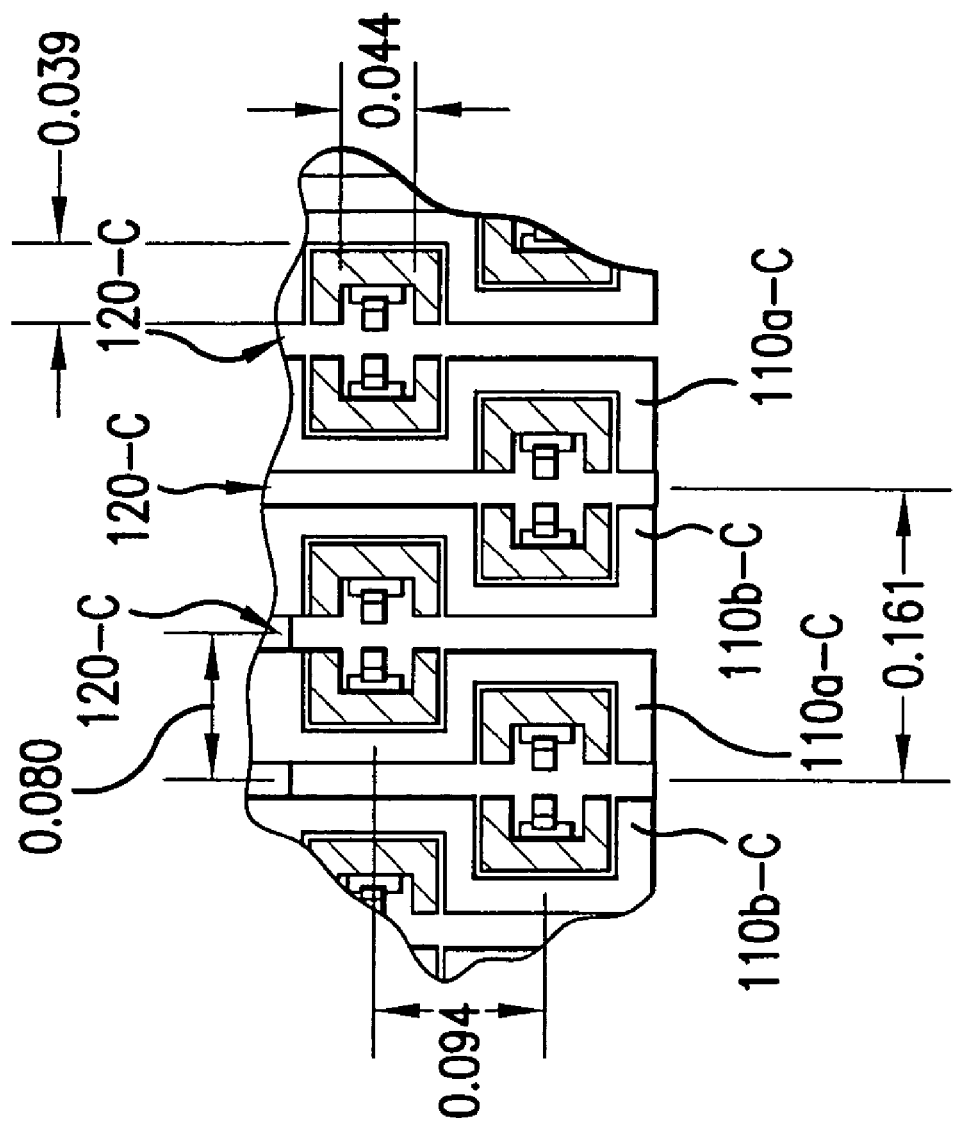

As with the above-described preferred embodiments, although not shown in FIG. 39, there are corresponding electrical conductors on the opposite face of circuit board 120-C. More specifically, for each conductor 201-C to 204-C, there is a corresponding conductor on the opposite face that is a mirror image of the conductor. This feature is illustrated in FIG. 42, which is a view showing a broken-away front sectional view of a plurality of boards 120-C having conductor pairs on opposite faces of the circuit boards 120-C.

As described above, when the modified interconnection system 100 is used to transmit differential signals, one of the electrical conductors and its corresponding electrical conductor on the opposite face may be utilized together to form the two wire balanced pair required for transmitting the differential signal. Once again, in preferred embodiments, since the length of the two electrical conductors is identical, there should be no skew between the two electrical conductors (skew being the difference in time that it takes for a signal to propagate the two electrical conductors).

In configurations where a modified connector 100 includes multiple circuit boards 120-C, the circuit boards are preferably arranged in a row and in a generally parallel relationship. Preferably, in such a configuration, each circuit board 120-C of connector 100 is positioned between two spacers 110-C (see, e.g., spacers 110a-C and 110b-C, each of which is also generically referred to herein by the reference number 110-C).

Figure 38:
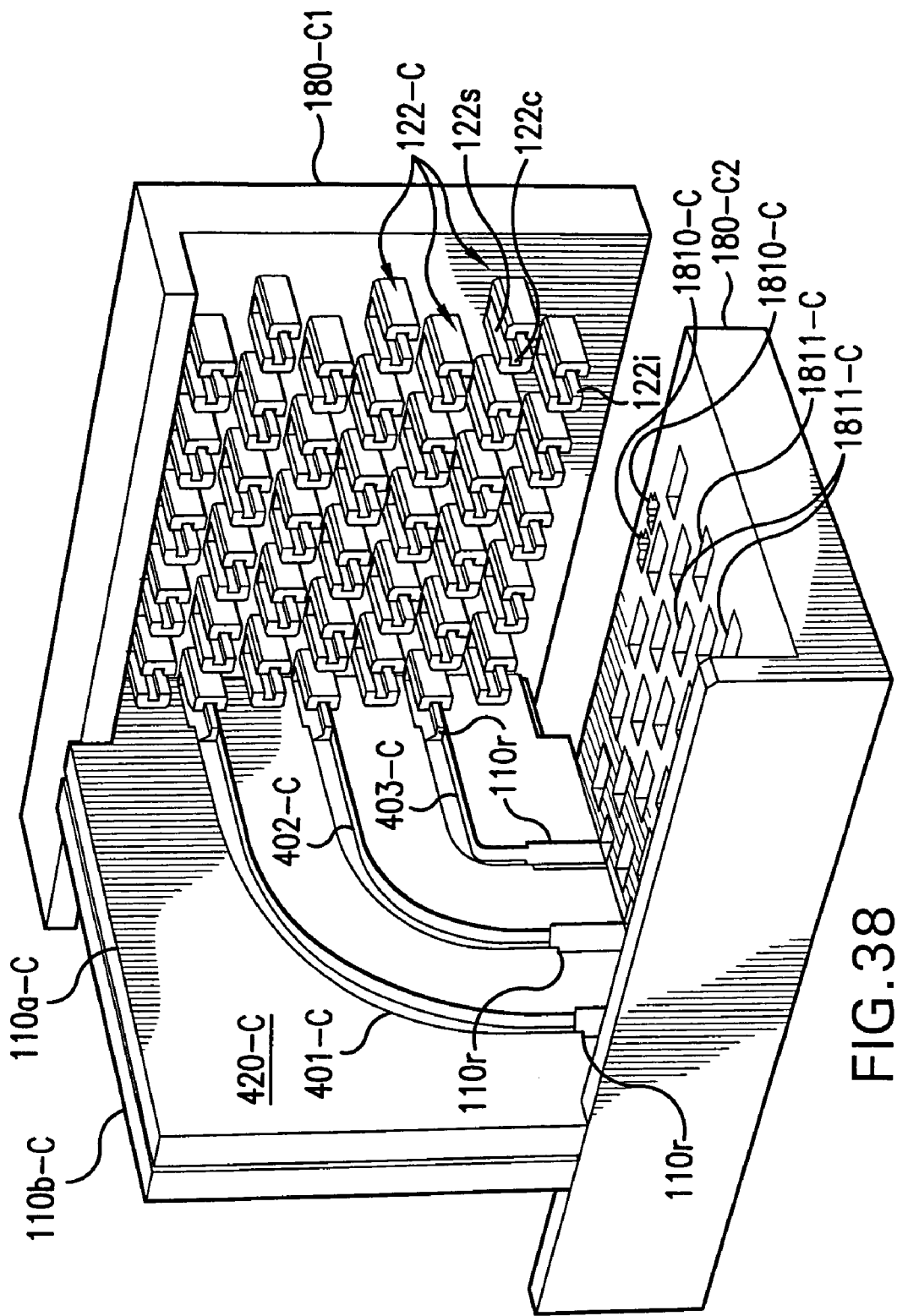

FIG. 38 is a perspective side view of components of a connector 100, including a spacer 110a-C according to one embodiment of the invention. As shown, spacer 110a-C preferably has one or more grooves disposed on a face 420-C thereof. In the embodiment shown, face 420-C of spacer 110a-C has three grooves 401-C, 402-C and 403-C disposed thereon. Each groove 401-C to 403-C extends from a point at or near a first edge of face 420-C to a point at or near second edge of face 420-C.

As shown in FIG. 38, the first and second edges of the spacer 110a-C preferably include a plurality of recesses 110r at each of the ends of the grooves configured to accommodate housings 1522-C (discussed below) of the cells 122-C (discussed below). Each recess preferably extends from a point at the edge of the face to a second point spaced inwardly from the edge a short distance. Accordingly, in the embodiment shown, there are recesses at the ends of all of the grooves. Each recess is designed to receive one side of a respective cell 122-C as shown in FIG. 38.

As best shown in FIG. 42, while not shown in FIG. 38, in some preferred embodiments there are similar grooves and recesses on the opposite face (not shown) of spacer 110a-C (such as, e.g., described above with reference to embodiments shown in FIGS. 1–36). In some preferred embodiments, the number of grooves on the first face of a spacer 110a-C is one less (or one more) than the number of grooves on the second face of the spacer 110a-C, but this is not a requirement. In various embodiments the selection of spacers and grooves thereon can be similar to that in any of the above-noted embodiments described above with reference to FIGS. 1–36. As described above with reference to FIGS. 1–36, by way of example, in some embodiments, the number of grooves on one face of a spacer 110a-C can one less (or one more) than the number of grooves on the opposite face of the spacer.

As with the implementation of fingers shown in the above-discussed embodiments shown, e.g., in FIGS. 4–6, the embodiments shown in FIGS. 37–46 preferably include spacer fingers 435-C and/or 437-C that extend within corresponding receiving slots 1810-C (see FIG. 38) in the interposers 180-C1 and 180-C2 when the connector is fully assembled (such as, e.g., when both connector pieces of a 2-piece connector are attached together as described above) (NB: each of the interposers can also be generically referred to by the reference number 180-C). The fingers are best shown in, e.g., shown in FIGS. 37, 38 and 40. As shown, in preferred embodiments, a plurality of, or preferably all of, the spacers 110-C each includes at least one, preferably two, projecting fingers for engaging with the first interposer 180-C1 and/or each includes at least one, preferably two, projecting fingers for engaging with the second interposer 180-C2, which fingers engage within respective receiving slots within the respective interposers. Among other things, such finger and slot engagements can be advantageous when assembling a first interposer and connector body (e.g., attached to a daughter card) and/or when connecting together two pieces of a 2-piece connector (e.g., when a daughter card is slid into the card cage), such as, e.g., facilitating alignment of the printed circuit boards.

Although not shown in FIGS. 37–46, in some embodiments, each of the spacers 110a-C can include one or more bosses (not shown) disposed on and projecting outwardly from its faces that fit in respective apertures of circuit board 120-C. As with embodiments described above with reference to FIGS. 1–36, this feature can also be used to help enable the board 120-C to be properly aligned with respect to the adjacent spacers (such as, e.g., spacers 110a-C and 110b-C).

In some illustrative embodiments, each spacer includes a finger 435-C that is located towards the top of the front side of spacer 110-C and a finger 437-C that is located towards the bottom of the front side of the spacer 110-C. As discussed, similar fingers 435-C and/or 437-C can be used to help in the attachment of the spacers 110-C to the interposers 180-C1 and/or 180-C2. More specifically, in some preferred embodiments, both of the interposers 180-C1 and 180-C2 include two vertically aligned recesses 1810-C for receiving corresponding fingers 435-C and 437-C from a respective spacer. In some embodiments, the fingers can include protrusions that are sufficiently resilient to allow them to snap-fit or to force-fit into the corresponding recesses in the corresponding interposers.

Although not depicted, the embodiments shown in FIGS. 37–46 may, in some illustrative cases, include similar slots 444 and corresponding structure that attach to a similar backbone 150 (discussed further below).

As shown in FIG. 42, in some embodiments, two different spacers types, 110a-C and 110b-C, are alternatively positioned within the connector 100. Accordingly, in some embodiments, the connector 100 includes two types of spacers: type A (i.e., 110a-C) and type B (i.e., 110b-C). In some embodiments, the two spacers types can be similar but not identical to one another. In other embodiments, more or less than two types of spacers may be used. As discussed above with reference to embodiments shown in FIGS. 1–36, the two spacer types A and B can be used, e.g., to enable adjacent printed circuit boards to have conductors situated in a staggered relationship, such as, e.g., shown in FIG. 43. Similarly, as described above, the printed circuit boards 120-C can, thus, also include two types A and B in order to, cooperatively with the spacers, achieve this relationship.

In this regard, in the preferred embodiments, a plurality of generally parallel printed circuit boards 120-C are positioned in between alternating spacers types A and B, see, e.g., spacers 110a-C and 110b-C. As discussed above, this is best shown in FIG. 42.

Once again, although not shown, bosses of one of said spacers can, in some embodiments, protrude though apertures of a respective board 120-C and through apertures of another of said spacers (e.g., similar to embodiments described herein-above). Among other things, this can facilitate the proper alignment of spacers and the board 120, such that conductors on the boards 120-C are aligned with grooves on the spacers, respectively, as depicted in FIG. 42.

In addition, as with embodiments described above, with this alignment, the electrical conductors disposed on board 120-C can be insulated by the air caught between the board 120-C and the grooves.

As with embodiments described above, in various embodiments, spacers 110-C may be fabricated either from an electrically conductive material or from a dielectric material that is coated with an electrically conductive layer to electromagnetically shield the electrical conductors of the printed circuit boards 120-C. Furthermore, the complex impedances of the electrical conductors and their associated grooves can be adjusted by varying the dimensions thereof. Still furthermore, the grooves can include a layer of a dielectric material, such as Teflon, to further adjust the complex impedances of the electrical conductors and their associated channels as well as adjusting the breakdown voltage thereof.

FIG. 42 shows an exemplary arrangement of spacers 110-C and circuit boards 120-C when multiple circuit boards are used in a connector 100. As shown, boards 120-C and spacers 110-C are aligned in a row in a generally parallel relationship and each circuit board 120-C is sandwiched between two spacers 110-C. In the example shown, there are two types of circuit boards A and B and two types of spacers A and B (as discussed above). The A type circuit boards are identical to each other, and the B type circuit boards are identical to each other. Similarly, the A type spacers are identical to each other, and the B type spacers are identical to each other. This is generally similar to the embodiments described herein-above with reference to FIG. 12.

In the embodiment shown in FIG. 42, spacers 110-C and boards 120-C are arranged in an alternating sequence, which means that between any two given A type spacers there is a B type spacer and vice-versa, and between any two given A type boards there is a B type board and vice-versa. Thus, an A type spacer is not adjacent to another A type spacer and an A type board is not adjacent to another A type board. Accordingly, in this exemplary configuration, each board 120-C is disposed between an A type spacer and a B type spacer.

By way of illustration, in some embodiments, each face of each board B type board 120-C has three conductors thereon (such as, e.g., shown in FIG. 39). As explained above with reference to FIG. 13, in some embodiments, the A and B type boards 120-C are nearly identical. One difference being the number of conductors on each face and the alignment of the conductors on the face. In some illustrative embodiments, the B type boards have one less electrical conductor than do the A type boards.

As described herein-above, one advantage of having the conductors misaligned as shown in FIG. 42 is that it may, inter alia, reduce cross-talk in the connector.

As shown in FIG. 42, each conductor on each board 120-C is aligned with a groove on the spacer directly adjacent that conductor. That is, each groove on each spacer 110-C is designed to follow a corresponding conductor on an adjacent board 120. In this manner, because each conductor is aligned with a corresponding groove, there is a space between the conductor and the spacer.

Figure 43:
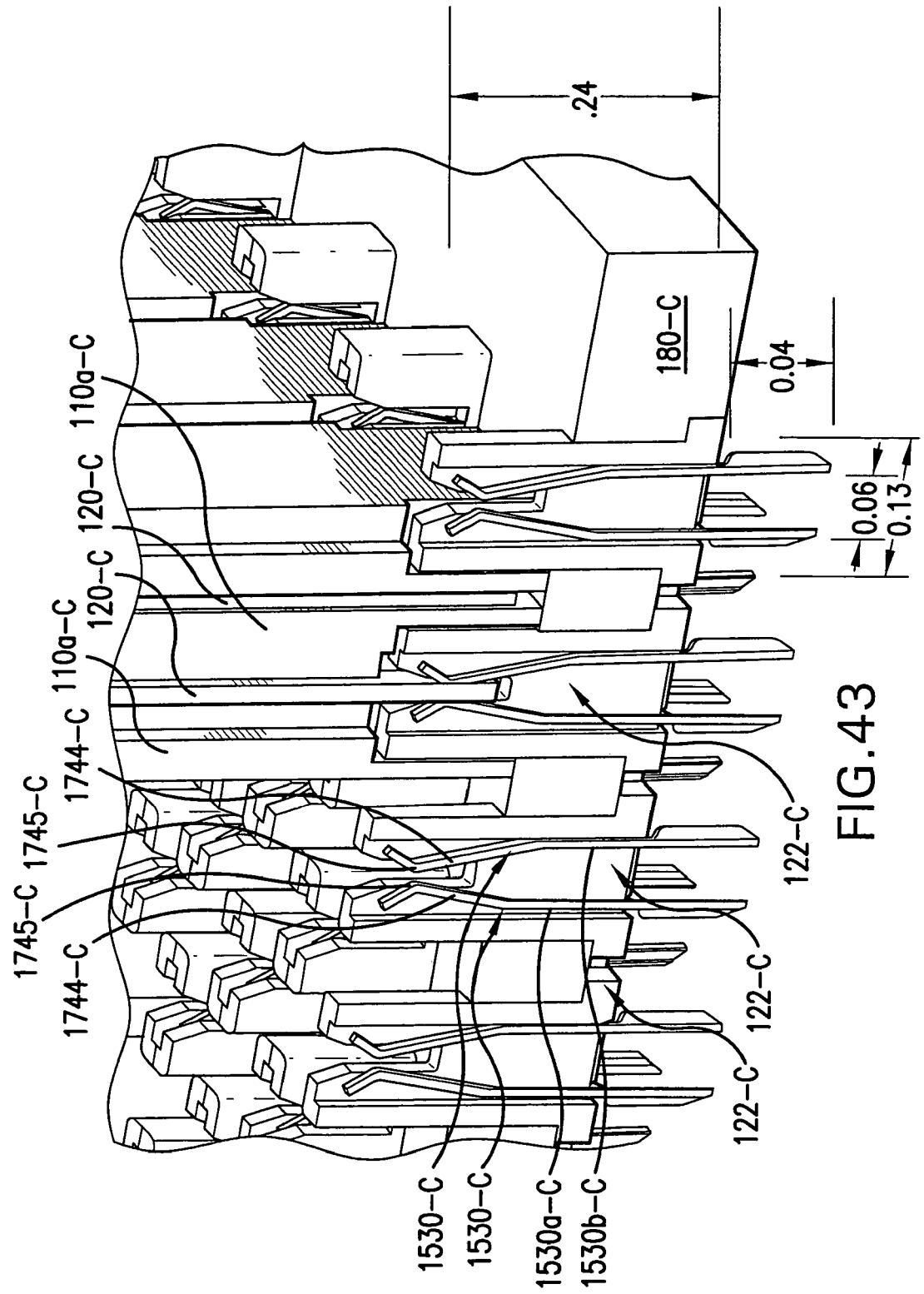

When a modified connector 100 is fully assembled, each conductor on a board 120-C comes into physical and electrical contact with two contact members 1530-C (best shown in FIG. 43), which are each contained within the housing 1522-C of the cell 122-C, and which are located inside corresponding recesses 110r in spacers on opposite sides of the board 120-C. More specifically, the first end of each conductor comes into physical and electrical contact with the contact portion of a first contact member and the second end of each conductor comes into physical and electrical contact with the contact portion of a second contact member, and the contact portions of the first and second contact members are each disposed in a space between the corresponding end of the conductor and the spacer. FIG. 43 depicts such contact members at one end of the conductors, but it should be understood that in the preferred embodiments similar contact members are also provided at the other end of the conductors. Each contact member functions to electrically connect the conductor to which it makes contact to a trace on a circuit board to which the connector 100 is attached.

With further reference to FIG. 43, this figure depicts contact members 1530a-C and 1530b-C (NB: each of the contact members can also be generically referred to by the reference number 1530-C), according to one embodiment of the invention, for electrically connecting a respective conductor on a board 120-C to a respective trace on a circuit board to which the connector 100 is attached. Although the full length of the contact members are depicted in this partially cross-sectional view, it should be understood that in preferred embodiments only a portion of contact member would be exposed because a portion is disposed within a housing 1522-C.

As shown in FIG. 43, contact member 1530a-C contacts an end of conductor (not shown) in a manner similar to that described above with reference to FIG. 15. In some embodiments, as shown in FIG. 39, the ends of the conductors can be made wider than the interim portions so as to provide more surface area for receiving the contact portion of the respective contact members. As shown in FIG. 43, the contact member 1530b-C is generally similar to the contact member 1530a-C and has a bottom portion that is also housed in the housing 1522-C.

As with the housing described herein-above with reference to the embodiments shown in FIGS. 1–36, the housing 1522-C is preferably fabricated of an electrically insulative or dielectric material, such as a plastic. During manufacture, the electrical contacts 1530-C of each housing 1522-C can either be disposed within the housing during fabrication or can be subsequently fitted within the housing.

Contact members 1530-C may be fabricated by commonly available techniques utilizing any material having suitable electrical and mechanical characteristics. For example, the contact members may be fabricated of laminated materials such as gold plated phosphor bronze. While the contact members in these embodiments are illustrated as preferably being of a generally unitary construction, it is contemplated that such may alternatively be made from multiple components.

In contrast to embodiments described above employing springs, in preferred implementations of the embodiments shown in FIGS. 37–46, the housings are preferably fixed in relation to the interposers during use (such as, e.g., by being press-fit into the interposers and/or otherwise retained with respect to the interposers once assembled). In the embodiments shown in FIGS. 37–46, the combination of the housing 1522-C and the contact members 1530-C are referred to as a cell 122-C.

Figure 41:
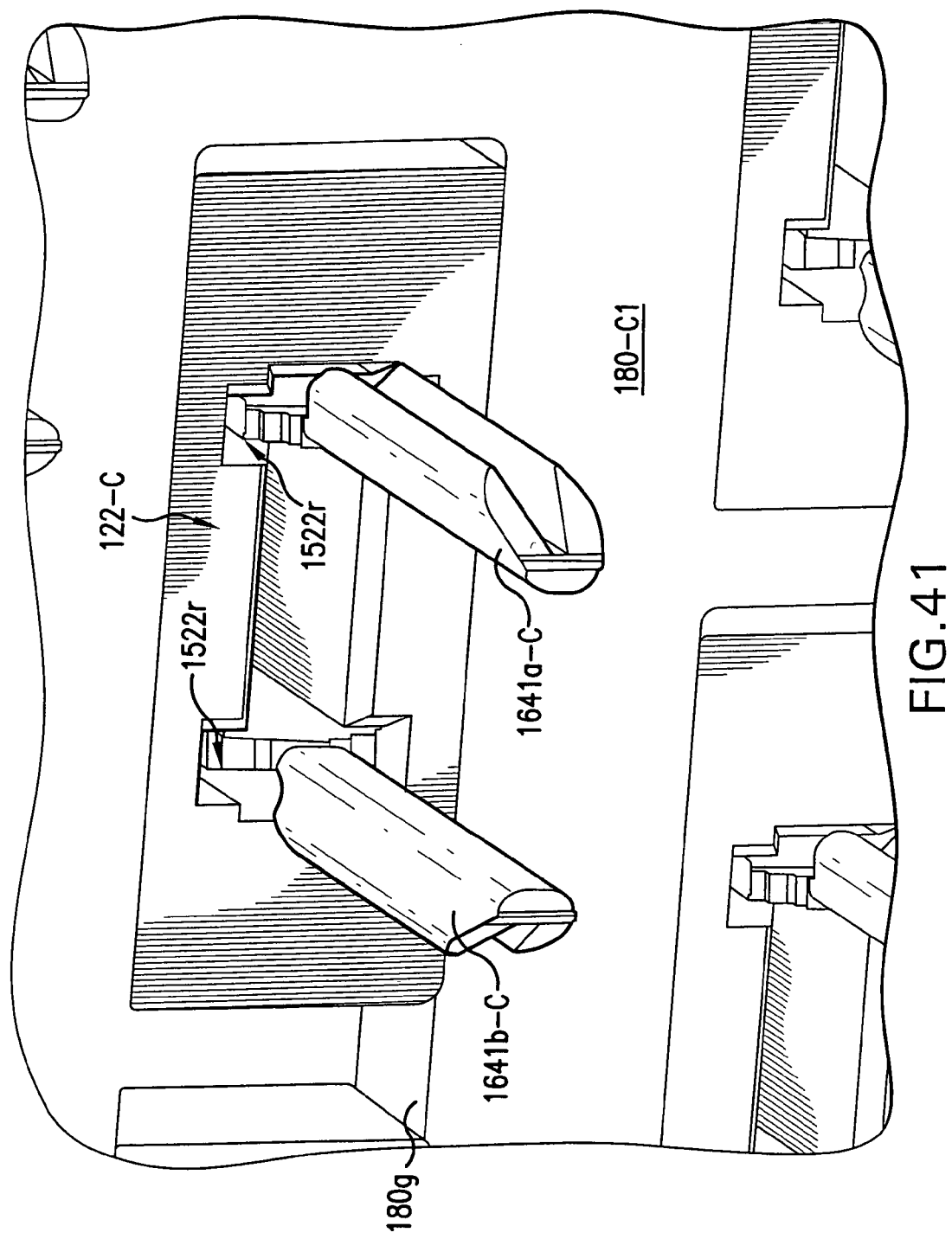
Figure 45:
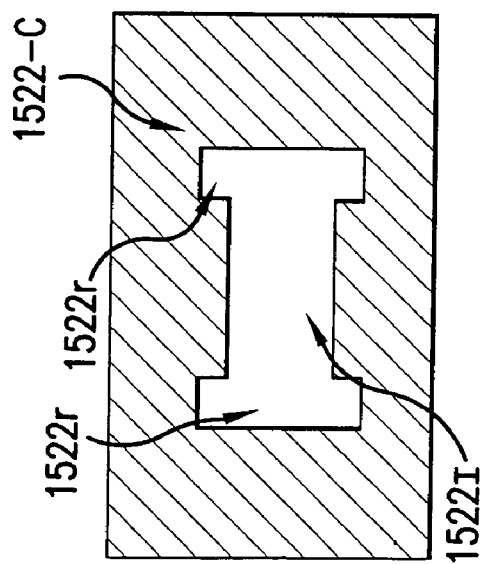

In some preferred embodiments, the housing 1522-C can be generally similar to that shown in FIG. 15, as long as the housing 1522-C is configured to be substantially fixedly located within the interposer. As best shown in FIGS. 41 and 45, the housing 1522-C can include, e.g., generally rectangular apertures 1522r for receiving contact members 1530-C. The apertures extend from the top side of housing to bottom side of the housing so that proximal ends 1641a-C and 1641b-C of the contact members can project beyond the bottom side of housing 1522-C, as shown in, e.g., FIG. 43. With reference to FIG. 45, in some preferred embodiments, the generally rectangular apertures are incorporated within a generally I-shaped passageway 1522I that extends through the housing 1522-C. Among other things, the use of a generally I-shaped passageway 1522I can facilitate insertion of the contact members into the housing by, e.g., allowing for increased expandability of the housing 1522-C. As with the terminology v-shaped, the terminology I-shaped is to be construed generally and does not require an exact I-shaped, but encompasses any configuration in which widened portions (such as, e.g., 1522r) are connected or substantially connected via another portion.

As with the embodiment shown in FIG. 17, each contact member 1530-C, according to some preferred embodiments, has a proximal end 1641-C and a distal end 1749-C. In the preferred embodiments, in between the ends 1641-C and 1749-C, there is a base portion 1743-C, a transition portion 1744-C and a contact portion 1745-C. In the embodiment shown, the base portion 1743-C is disposed in the aperture 1522r in the housing such that generally the entire base portion is within housing 1522-C (i.e., press-fit and/or frictionally engaged within the aperture 1522r section of the housing), the transition portion 1744-C is angled inwardly with respect to the base portion (i.e., movably supported within a board-receiving portion of the housing), and distal end 1749-C is angled outwardly with respect to the transition portion and therefore functions as a lead-in portion.

In a preferred embodiment, the contact portion of a contact member is not fixed to the end of the conductor with which it makes physical and electrical contact. For example, the contact portions are preferably not soldered or otherwise fixed to the board 120-C conductors. Instead, in the preferred embodiments, each contact member is electrically connected to its corresponding conductor through a resilient or pressing force using a connection similar to that used in card edge connectors. That is, the contact portion of the contact member preferably presses against the end of the corresponding conductor. Among other things, although in the preferred implementations of the embodiments shown in FIGS. 37–46, the housing is fixed in relation to the interposer and the board, this form of connection can help to, inter alia, ensure a good electrical connection between the contact members and the corresponding electrical conductors of the printed circuit boards 120-C, can facilitate manufacture and assembly of components, such as, e.g., facilitating the alignment of the printed circuit boards, and/or the like.

As shown in FIGS. 37–41, similar to the embodiments shown in FIGS. 18 and 19, each cell 122-C is designed to fit into an corresponding aperture 1811-C of an respective interposer 180-C. In these illustrative embodiments, each interposer 180-C includes a first set of apertures arranged in a first set of aligned rows to create a first row and column configuration and a second set of apertures arranged in a second set of aligned rows to create second row and column configuration. In these embodiments, each row in the second set is disposed between two rows from the first set in a manner similar to the embodiments described herein-above with reference to, e.g., FIGS. 18–19. As shown in the figures, the second row and column configuration is offset from the first row and column configuration so that the apertures of the second set are aligned with each other but not aligned with the apertures of the first set, and vice-versa.

In illustrative embodiments, an interposer 180-C may electromagnetically shield the electrical conductors of the printed circuit boards 120 by being fabricated either of a conductive material or of a non-conductive material coated with a conductive material.

When the connector 100 is fully constructed, each aperture in the first and second set preferably receives a cell 122-C. The housing 1522-C of each cell 1570 can, if desired, include a tab similar to tab 1633 shown in FIG. 16 arranged to fit within a slot disposed within a corresponding aperture of the interposer 180-C, to help prevent the cell 122-C from falling into the aperture.

Figure 46:
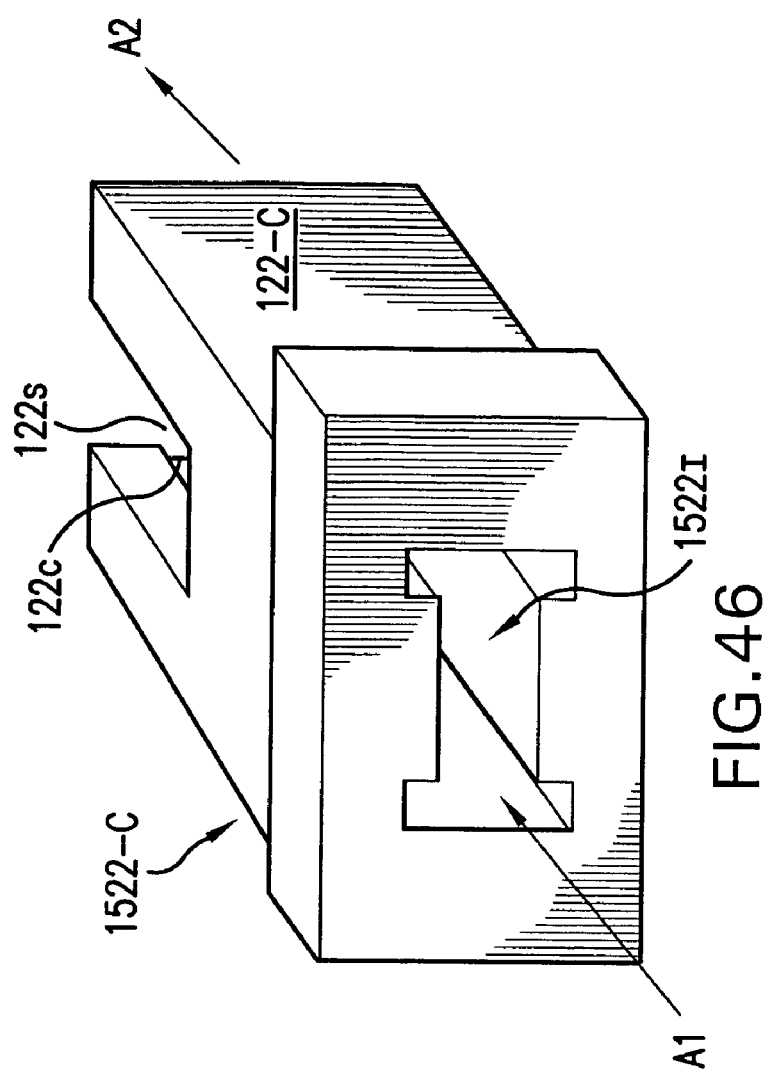

As best shown in FIG. 46, in some preferred embodiments, the housing 1522-C can include a generally T-shaped construction with two laterally extending tabs 1633-C. In addition, the interposers 180-C can include a groove or recess extending between a plurality of the recesses 1811-C, such as, e.g., a lateral groove 180g extending along rows of the recesses as shown in FIGS. 37, 40, 41 and 44.

However, the structure of the housing can be selected based on circumstances at hand and may, preferably, be configured in a manner to be reliably fixed in relation to the position of the interposer during use. It is to be understood that the specific shapes of the cells and corresponding interposer apertures are merely for exemplary purposes. The present invention is not limited to these shapes, but may employ a wide variety of shapes.

As schematically depicted in FIG. 44, when the connector 100 is in use, each of the proximal ends 1641-C of each contact member contacts a respective conducting element on a circuit board 2190-C connected to connector 100. Accordingly, in preferred embodiments, there is at least one electrical signal path from a board 2190-C to the boards within the connector 100. As would be appreciated by one skilled in the art, the connector 100 can provide multiple electrical signal paths from board 2190, wherein each signal path includes two contact members 1530-C and a conductor on a board 120-C.

As schematically shown in FIG. 44, as with embodiments shown in, e.g., FIGS. 21–22, each interposer 180a-C and 180b-C cab be arranged in parallel relationship respective circuit boards connected to connector 100. More specifically, the interposer 180a-C can be located in a parallel relationship with a first circuit board (similar to board 2190-C shown in FIG. 44) and interposer 180b-C can be located in a parallel relationship with another circuit board (similar to board 2190-C shown in FIG. 44). Accordingly, in such embodiments, one face of interposer 180a-C faces a first board and one face of interposer 180b-C faces a second board.

Similar to the embodiments shown in FIG. 22, each proximal end 1641-C of each contact member 1530-C preferably contacts a respective conducting element 2194-C on a circuit board 2190-C. In a preferred embodiment, each conducting element 2194-C is a female socket for receiving the proximal end 1641-C of a respective contact member.

In the preferred embodiments, the connector 100 is a compliant mount connector and each proximal end 1641-C forms a pin that fits within a respective female socket. However, in other embodiments, each element 2194-C may be a via or another electrically conductive element capable of compliantly receiving the contact member.

In a preferred embodiment, the board 2190-C includes a differential signal path that includes a first signal path (e.g., a first trace) and a second signal path (e.g., a second trace). As with the embodiment shown in FIG. 22, a first element 2194-C is connected to the first signal path and a second conducting element 2194-C is connected to the second signal path. It should be noted that the second circuit board (e.g., proximate the other interposer) may also have pairs of conducting elements, like elements 2194-C, electrically connected to respective pairs of signal paths, in a like manner.

With reference to FIGS. 37–41, each cell 122-C is inserted into an aperture of a respective interposer 180-C. In some embodiments, the distal end of each contact member 1530-C of a cell 122-C extends beyond an upper face of the respective interposer (see FIGS. 38–39 and 43–44) and the proximal ends 1641-C of each contact member extends beyond a bottom face of the respective interposer (see, e.g., FIGS. 37, 40 and 41). As discussed above, when fully assembled, the interposers 180-C will face and be generally parallel to respective boards (such as, e.g., a motherboard and a daughtercard). By way of example, FIG. 42 schematically shows an interposer 180-C that faces and is generally parallel to a board 2190-C.

When an end 1641-C of a contact member 1530-C is pressed within a corresponding element 2194-C, a normal force caused by the element is exerted on the contact member. Because during use, the contact member 1530-C is fixedly located with respect to the housing, and the housing is fixedly located with respect to the interposer, the contact member can be readily compliantly connected to the element 2194-C.

As discussed above, in some embodiments, the devices shown in FIGS. 37–46 can be configured to attach to an elongated backbone similar to the backbone 150 described above with reference to FIGS. 1–36. In addition, the modified connector 100 may also include two end caps similar to the end caps 100a and 100b discussed above, each of which can be, e.g., designed to attach to a respective end of backbone 150. As with embodiments described above with reference to FIGS. 1–36, both the end caps and the spacers can be fabricated of an insulative material, such as a plastic, covered with a conductive material to provide electromagnetic shielding, or can be fabricated entirely of a conductive material, such as, e.g., a metal. In some embodiments, the various features related to the backbone, end caps and related structure can be like that described above with reference to FIGS. 1–36. However, in preferred 2-piece connector embodiments, allowance would be made to have one of the interposers connected to the connector body, while having a second of the interposers separate therefrom as a second connector piece that can be connected together therewith when a daughtercard is slid into a card cage as described above.

In addition, in some embodiments, the modified connector 100 can also be configured to include one or more mounting clip similar to the above-described mounting clips 190a and 190b and a shield similar to the above-described shield 160. As described above with reference to embodiments shown in FIGS. 1–36, in some embodiments the mounting clips and shield can be combined with the above described parts of the connector 100 to form a composite arrangement. As described above, in some embodiments the mounting clips and shield may be electrically conductive so as to electromagnetically shield the signal carrying elements of connector 100. In some embodiments, the various features related to the mounting clips and the shield can be like that described above with reference to FIGS. 1–36. However, in preferred 2-piece connector embodiments, allowance would again be made to have one of the interposers connected to the connector body, while having a second of the interposers separate therefrom as a second connector piece that can be connected together therewith when a daughtercard is slid into a card cage as described above.

As with embodiments described above with reference to FIGS. 1–36, while the two illustrative interposers 180a-C and 180b-C have been shown as being generally perpendicular to each other, the present invention is not limited thereto. That is, for some applications, the planes of the two interposers 180 can be at about a 45-degree angle or at another angle, for example. Thus, the modified connector 100 need not be a "right-angle" connector.

As with embodiments described above with reference to FIGS. 1–36, in some preferred embodiments, when both connector pieces are attached together in an assembled state, the entire interconnection system preferably forms a substantially rigid structure in which the electrical conductors on the printed circuit boards 120-C may be electromagnetically shielded.

As shown in FIGS. 38, 39, 43, 44 and 46, in some preferred embodiments, the housing 122-C is formed so as to include a receiving slot 122s configured to receiving an edge of a printed circuit board. In this regard, FIG. 39 illustrates a printed circuit board 120-C as received within a plurality of housings. Preferably, as shown in FIGS. 39, 43 and 44, the housing projects within the interposer 180-C and the receiving slot 122s extends within the housing to proximate the front of the interposer, such that the board 120-C can be moved to or substantially to the front of the interposer. In some embodiments, the housing 122-C can include an inclined or chamfered from edge 122i on one or more side of the slot 122s to facilitate insertion of the printed circuit board 120-C.

As also shown in FIGS. 38, 39, 43, 44 and 46, the housing preferably includes internal channels 122c configured to receive the flexible ends of the contact members, including portions 1744-C, 1745-C and 1749-C, described above.

In the preferred embodiments, an insert-loaded interposer can be provided (i.e., wherein the cells 122-C are referred to in this context as inserts that are inserted into the interposer). In addition, in preferred embodiments, during construction, the contacts are preferably pre-assembled into these "inserts." For example, in some embodiments, the contacts can be pressed into these dielectric or plastic "inserts," such as, e.g., by pressing the contacts therein in the direction of the arrow A1 shown in FIG. 46. Then, the "inserts" can, in turn, be loaded into the interposer, such as, e.g., by pressing the cell therein in the direction of the arrow A2 shown in FIG. 46. In addition, as described above, the spacers preferably include recesses 110r that accommodate these "inserts."

In addition, as described above, during assembly these "inserts" can essentially function as guides for the printed circuit boards by way of, e.g., the slots 122s (and optionally the inclined edges 122i) of the cells 122-C. In this manner, the preferred embodiments help to ensure that, inter alia, the printed circuit boards will be in the proper position with respect to the contacts. In this manner, previously-confronted problems related to achieving contact with printed circuit boards can be substantially reduced. In addition, these embodiments also enable the contacts to be protected from the overstressing (such as, e.g., by containing the contacts within the housing 1522-C rather than extending them outwardly from the housing) that may otherwise cause a problem when errors are encountered during assembly. As described above, this structure can be advantageous in both the assembling of a first connector half that has, e.g., a first interposer connected to a connector body and in the connecting of the second connector half therewith when a daughtercard is connected to a motherboard using the 2-piece connector.

In some preferred applications, embodiments described herein may be designed, e.g., for ultra high speed, high density differential applications, such as, e.g., more than 2.5 GBPS, or, in some embodiments, more than 5 GBPS, or, in some embodiments, up to about 10 GBPS, or, in some embodiments, more than 10 GBPS. In some illustrative embodiments, the connector includes more than 25 pairs of differential signal pairs per linear inch, or, in some embodiments, more than about 35 pairs of differential signal pairs per linear inch, or, in some embodiments, more than about 45 pairs of differential signal pairs per linear inch.

In some illustrative and non-limiting embodiments, the device can include components having at least some, or preferably all, of the following dimensional sizes: a) a board-to-board distance (shown by reference number 0.080 in FIG. 42) of about 0.080 inches; b) a spacer groove depth (shown by reference number 0.039 in FIG. 42) of about 0.039 inches; c) a spacer groove width (shown by reference number 0.044 in FIG. 42) of about 0.044 inches; d) a spacer groove staggering separation distance (shown by reference number 0.094 in FIG. 42) of about 0.094 inches; e) a housing 1522-C depth distance (shown by reference number 0.24 in FIG. 43) of about 0.24 inches; f) a housing 1522-C width distance (shown by reference number 0.13 in FIG. 43) of about 0.13 inches; g) a contact pin extension distance (shown by reference number 0.04 in FIG. 43) of about 0.04 inches; and h) a contact pin separation distance (shown by reference number 0.06 in FIG. 43) of about 0.06 inches.

Figure 37:
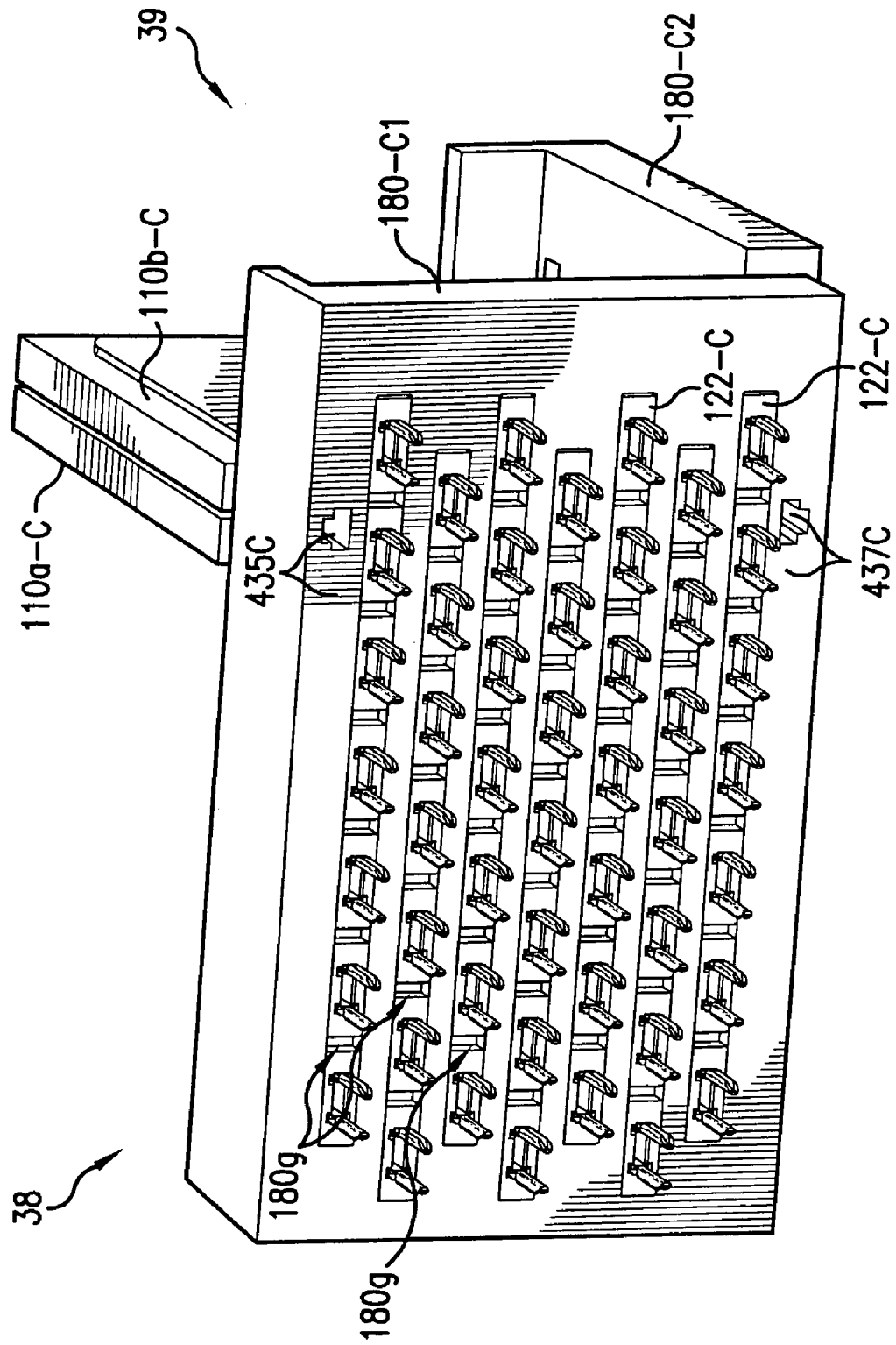
Figure 40:
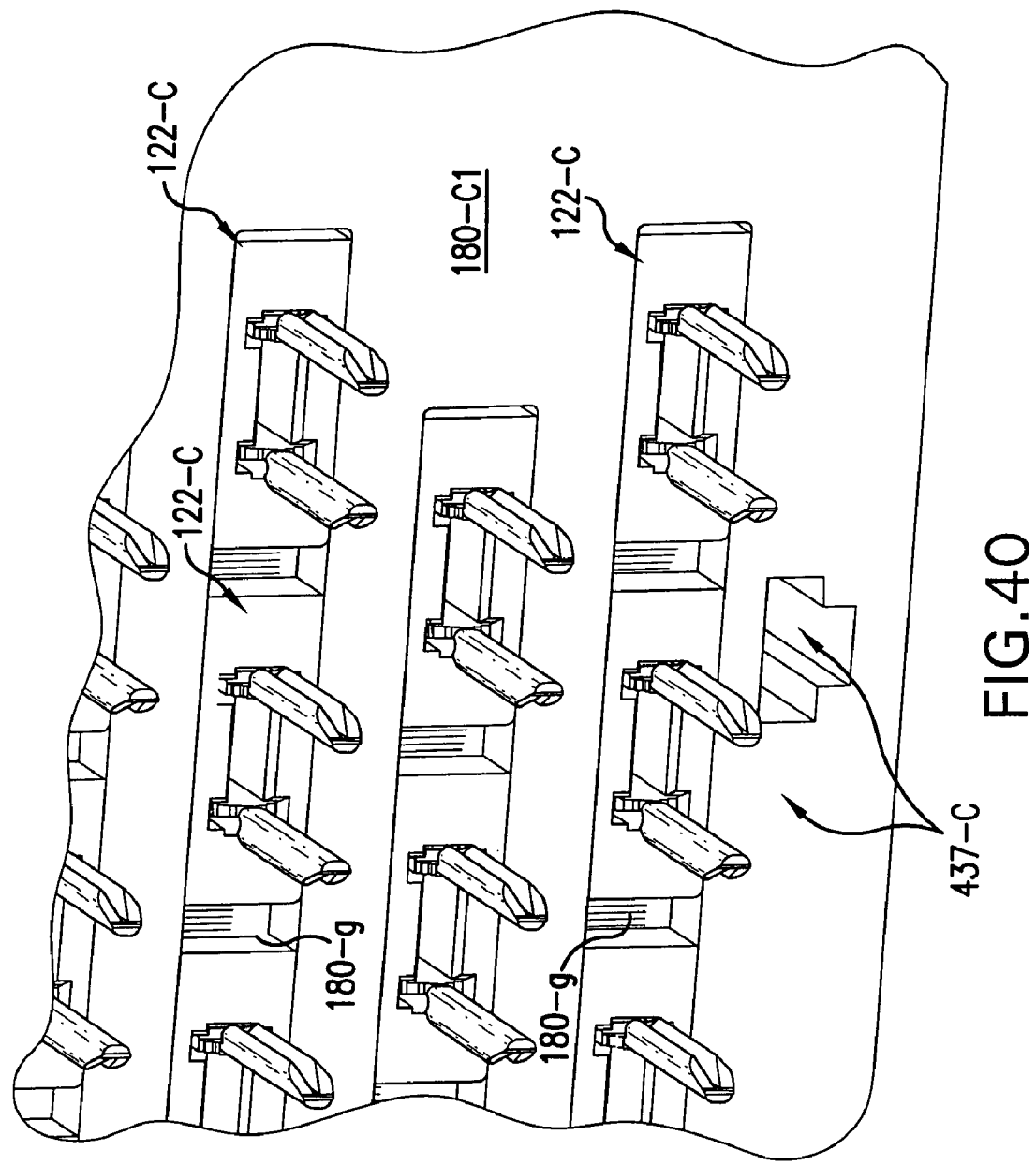

In some preferred embodiments, the proximal ends 1641a-C and 1641b-C of the contacts can be formed so as to have a construction substantially similar to that shown in FIGS. 37, 40 and 41. In this regard, with reference to the close-up view shown in FIG. 41, the pins can be formed with a configuration referred to herein as a v-pin configuration. In such a v-pin configuration, the pins are formed with a substantially v-shaped cross-section (as shown). In this disclosure, the terminology v-pin configuration and/or v-shaped is a general term that encompasses, e.g., u-shaped configurations, and other configurations having two arms sections extending from a base section. This term encompasses, but does not require, that the arms extend outward at angle from one another, but includes, parallel arms, inwardly angled arms and/or other variations.

In some illustrative embodiments, a v-shaped configuration can be achieved by, e.g., forming techniques, such as, e.g., coining, cold-forming, forging, press-forming and/or the like. In some illustrative embodiments, in the formation of the v-shaped configuration, the contact members are initially formed from substantially flat members (which may be, e.g., about 20 thousandths of an inch thick), then the contact members are further pressed or stamped to form an end having a reduced thickness (which may be, e.g., about 4 thousandths of an inch thick). Then, the v-shape can be imparted by folding over the reduced thickness end using appropriate forming and/or the like techniques.

Although such v-pin configurations are described, it is contemplated that various other pin configurations can be employed in other embodiments. Pins having virtually any appropriate cross-sectional shapes can be employed in other embodiments of the invention. In addition, while the illustrative pins have a generally constant cross-sectional shape in some illustrative embodiments (i.e., except for a front chamfered portion in the illustrated examples), other embodiments can have pins with discontinuous or otherwise varied cross-sectional shapes.

In addition, in some preferred embodiments a compliant pin can be created that has a complaint section with a diameter of less than about 0.025 inches, or, in some embodiments, less than about 0.020 inches, or, in some embodiments about a 0.018 inches, or less.

In contrast to compression mount connectors, such as, e.g., related to compression mount embodiments described above with reference to FIGS. 1–36, a compliant mount connector can beneficially avoid some obstacles related to, e.g., co-planarity of compression contacts, latching strength and accuracy issues, as well as related to control needed in an axis normal to the mating interface to maintain a stable interface in compression mount connections.

Although compliant pins have been widely used in various other high speed interconnects, the embodiments described herein have substantial improvements over existing systems. For example, due to the size and routing of the compliant feature, existing systems typically experience performance issues, such as, e.g., impedance discontinuities and cross-talk. On the other hand, preferred embodiments described herein can enhance the tuning of the performance of a compliant pin termination to a printed circuit board. Among other things, as described above, in preferred embodiments, the connector uses broad-side coupled transmission lines with spatial relationships that can, inter alia, promote a high degree of cross-talk isolation.

While various embodiments/variations of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An interconnect system, comprising:
    a first circuit board comprising (a) a first differential interconnect path, (b) a first socket on a surface of the first circuit board and (c) a second socket also on the surface of the first circuit board, wherein the first differential interconnect path comprises a first signal path electrically connected to the first socket and a second signal path electrically connected to the second socket;
    a second circuit board comprising a second differential interconnect path; and
    a connector for electrically connecting the first differential interconnect path with the second differential interconnect path, the connector comprising:
        an interposer having a first face and a second face opposite the first face, the first face facing the surface of the first circuit board, said interposer including an array of apertures extending from the first face of the interposer to the second face of the interposer;
        a first conductor having an end adjacent to the second face of the interposer;
        a second conductor substantially parallel with and substantially equal in length to the first conductor, the second conductor also having an end adjacent to the second face of the interposer;
        a dielectric material disposed between the first conductor and the second conductor;
        a plurality of cells located within said array of apertures, each of said cells including a housing supporting a first elongated contact member and a second elongated contact member;
        a first of said first elongated contact members having a conductor contact section, a board contact section and an interim section between the conductor contact section and the board contact section, the conductor contact section being in physical contact with the end of the first conductor, the board contact section being in physical contact with and compliantly engaged with the first socket, and at least a portion of the interim section being engaged with a first of said housings; and
        a first of said second elongated contact members having a conductor contact section, a board contact section and an interim section between the conductor contact section and the board contact section, the conductor contact section being in physical contact with the first end of the second conductor, the board contact section being in physical contact with and compliantly engaged with the second socket, and at least a portion of the interim section being engaged with said first of said housings.

2. The interconnect system of claim 1, wherein said housings are made with dielectric material.

3. The interconnect system of claim 1, wherein said housings are made with dielectric material and said interposer is made with conductive material or is coated with conductive material.

4. The interconnect system of claim 3, wherein said interposer is made with metal.

5. The interconnect system of claim 1, wherein the dielectric material disposed between the first conductor and the second conductor comprises a third circuit board having a first face and a second face.

6. The interconnect system of claim 5, wherein the first conductor is disposed on the first face of the third circuit board and the second conductor is disposed on the second face of the third circuit board.

7. The interconnect system of claim 6, wherein the third circuit board is sandwiched between a first spacer and a second spacer.

8. The interconnect system of claim 7, wherein the first spacer has a groove on a first face thereof and the groove is aligned with and mirrors the first conductor.

9. The interconnect system of claim 7, wherein the first spacer has at least one finger for attaching the spacer to the interposer.

10. The interconnect system of claim 9, wherein the interposer has at least one recess for receiving the at least one finger.

11. The interconnect system of claim 8, wherein the second spacer has a groove on a first face thereof and the groove is aligned with and mirrors the second conductor.

12. The interconnect system of claim 1, wherein said first of said housings includes a slot configured to receive said a third circuit board.

13. The interconnect system of claim 12, wherein said first of said housings further includes channels configured to receive said conductor contact sections of said first and second elongated contact members.

14. The interconnect system of claim 13, wherein said conductor contact sections are flexibly contained within said channels and wherein said channels extend past distal ends of each of said first and second elongated contact members.

15. The interconnect system of claim 1, wherein said board contact sections include pins with a diameter of less than about 0.04 inches.

16. The interconnect system of claim 1, wherein said board contact sections include pins with a diameter of less than about 0.03 inches.

17. The interconnect system of claim 1, wherein said board contact sections include pins with a diameter of less than about 0.02 inches.

18. The interconnect system of claim 1, wherein said housings have widths of less than about 0.3 inches.

19. The interconnect system of claim 1, wherein said housings have widths of less than about 0.2 inches.

20. The interconnect system of claim 1, wherein said housings have widths of less than about 0.15 inches.

21. The interconnect system of claim 1, wherein said connector supports differential applications at more than about 5 GBPS.

22. The interconnect system of claim 1, wherein said connector supports differential applications at more than about 10 GBPS.

23. An interposer assembly for high-speed and high density differential applications, comprising:
  a) an interposer having a first face and a second face opposite the first face;
  b) said interposer including an array of apertures extending from the first face of the interposer to the second face of the interposer;
  c) a plurality of cells located within said array of apertures, each of said cells including a housing supporting a first elongated contact member and a second elongated contact member;
  d) said interposer being made with a conductive material or coated with a conductive material;
  e) said housings each being made with dielectric material;
  f) a first of said first elongated contact members having a conductor contact section, a board contact section and an interim section between the conductor contact section and the board contact section, the conductor contact section being configured to apply a pressure contact without attachment to a first conductor, the board contact section including a compliant pin having a diameter of less than about 0.04 inches, and at least a portion of the interim section being engaged with a first of said housings; and
  g) a first of said second elongated contact members having a conductor contact section, a board contact section and an interim section between the conductor contact section and the board contact section, the conductor contact section being configured to apply a pressure contact without attachment to a second conductor, the board contact section including a compliant pin having a diameter of less than about 0.04 inches, and at least a portion of the interim section being engaged with said first of said housings.

24. The interposer assembly of claim 23, wherein said first of said housings includes a slot configured to receive an edge of a circuit board located generally perpendicular to said interposer.

25. The interposer assembly of claim 24, wherein said first of said housings further includes channels configured to receive said conductor contact sections of said first and second elongated contact members.

26. The interposer assembly of claim 25, wherein said conductor contact sections are flexibly contained within said channels and wherein said channels extend past distal ends of each of said first and second elongated contact members.

27. The interposer assembly of claim 23, wherein said pins each have a diameter of less than about 0.03 inches.

28. The interposer assembly of claim 23, wherein said pins each have a diameter of less than about 0.02 inches.

29. The interposer assembly of claim 23, wherein said housings each have widths of less than about 0.3 inches.

30. The interposer assembly of claim 23, wherein said housings each have widths of less than about 0.2 inches.

31. The interposer assembly of claim 23, wherein said assembly supports differential applications at more than about 5 GBPS.

32. The interposer assembly of claim 23, wherein said assembly supports differential applications at more than about 10 GBPS.

33. A connector for high-speed and high density differential applications electrically connecting a signal path on a first circuit board with a signal path on a second circuit board, comprising:
  a) an interposer having a first face and a second face opposite the first face;
  b) said interposer including an array of apertures extending from the first face of the interposer to the second face of the interposer;
  c) a plurality of cells located within said array of apertures, each of said cells including a housing supporting a first elongated contact member and a second elongated contact member;
  d) said interposer being made with conductive material or coated with conductive material;
  e) said housings each being made with dielectric material;
  f) a plurality of circuit boards extending generally perpendicular to said interposer;
  g) a plurality of spacers between said circuit boards; and
  f) said housings each including a slot configured to receive an edge of a respective one of said circuit boards.

34. The connector of claim 33, wherein said first and second elongated contact members include leaf springs that press against respective conductors on said circuit boards.

35. The connector of claim 33, wherein the said circuit boards include a plurality of signal conductors, and wherein a number of signal conductors disposed on a first face of one of said circuit boards is not equal to a number of signal conductors disposed on a first face of a second circuit board.

36. The connector of claim 35, wherein the number of signal conductors disposed on the second face of the first circuit board is one less or one more than the number of signal conductors disposed on the first face of the second circuit board.

37. The system of claim 33, wherein each housing includes at least one tab arranged to mate with at least one corresponding slot in said interposer.

38. The system of claim 35, wherein said conductors of adjacent circuit boards are staggered to increase distances between said conductors of said adjacent printed circuit boards.

39. The system of claim 33, further comprising a backbone including slots arranged to receive said plurality of spacers.

40. The system of claim 33, further comprising an end plate arranged to contain one of said interposers.

41. The system of claim 33, further comprising a shield plate arranged to cover two sides of the system.

42. A method of manufacturing a connector, comprising:
 a) providing an interposer with an array of apertures extending from a first face of the interposer to a second face of the interposer, wherein said interposer is made with conductive material or coated with conductive material;
 b) providing a plurality of cells each including a housing supporting a first elongated contact member and a second elongated contact member, each said housing being made with dielectric material, and each said housing including a slot configured to receive an edge of a respective circuit board;
 c) moving a plurality of printed circuit boards in a direction generally perpendicular to and towards said interposer such that edges of said printed circuit boards are received within respective ones of said slots in said housings and such that said first and second elongated contact members engage respective conductors on opposite sides of said printed circuit boards.

43. The method of claim 42, wherein said first and second elongated contact members engage respective conductors on opposite sides of said printed circuit boards by providing said first and second elongated contact members with leaf spring portions that are displaced by the printed circuit boards upon insertion into said slots.

44. The method of claim 42, further including aligning a plurality of spacers in between said printed circuit boards by inserting protrusions extending from said spacers into engaging recesses in said interposer.

45. The method of claim 42, further including inserting said housing into said interposer until an outwardly extending tab is received within a respective slot in said interposer.

46. The method of claim 42, wherein said first of said housings further includes channels configured to receive said conductor contact sections of said first and second elongated contact members.

47. The method of claim 46, wherein said conductor contact sections are flexibly contained within said channels and wherein said channels extend past distal ends of each of said first and second elongated contact members.

48. The method of claim 42, wherein said first and second contact members include complaint pins having a diameter of less than about 0.03 inches.

49. The method of claim 48, wherein said pins have a diameter of less than about 0.02 inches.

50. The method of claim 42, wherein said housings have widths of less than about 0.3 inches.

51. The method of claim 50, wherein said housings have widths of less than about 0.2 inches.

52. The method of claim 42, wherein said connector is configured to support differential applications at more than about 5 GBPS.

53. The method of claim 52, wherein said connector is configured to support differential applications at more than about 10 GBPS.

* * * * *